United States Patent
Fukuzawa

(10) Patent No.: US 9,552,860 B2
(45) Date of Patent: Jan. 24, 2017

(54) MAGNETIC MEMORY CELL STRUCTURE WITH SPIN DEVICE ELEMENTS AND METHOD OF OPERATING THE SAME

(71) Applicant: BlueSpin, Inc., Kawasaki (JP)

(72) Inventor: Hideaki Fukuzawa, Kawasaki (JP)

(73) Assignee: BLUESPIN, INC., Kawasaki (JP)

( * ) Notice: Subject to any disclaimer, the term of this patent is extended or adjusted under 35 U.S.C. 154(b) by 0 days.

(21) Appl. No.: 14/815,217

(22) Filed: Jul. 31, 2015

(65) Prior Publication Data
US 2016/0293240 A1 Oct. 6, 2016

(30) Foreign Application Priority Data
Apr. 1, 2015 (JP) ................. 2015-075407

(51) Int. Cl.
| G11C 11/00 | (2006.01) |
| G11C 11/14 | (2006.01) |
| G11C 11/15 | (2006.01) |
| G11C 11/16 | (2006.01) |

(52) U.S. Cl.
CPC .......... G11C 11/1673 (2013.01); G11C 11/161 (2013.01); G11C 11/1675 (2013.01)

(58) Field of Classification Search
USPC ........................................ 365/158, 171, 173
See application file for complete search history.

(56) References Cited

U.S. PATENT DOCUMENTS

| 6,055,178 A * | 4/2000 | Naji ................. G11C 11/16 365/158 |
| 6,424,562 B1 | 7/2002 | Rösner et al. |
| 7,453,719 B2 * | 11/2008 | Sakimura ............ G11C 11/1673 365/158 |

(Continued)

FOREIGN PATENT DOCUMENTS

| JP | 2006-165327 | 6/2006 |
| JP | 2007-513501 | 5/2007 |

(Continued)

OTHER PUBLICATIONS

Written Opinion of the International Searching Authority issued Aug. 25, 2015 in International Application No. PCT/JP2015/071719. (English Translation).

(Continued)

*Primary Examiner* — Trong Phan
(74) *Attorney, Agent, or Firm* — Wenderoth, Lind & Ponack, L.L.P.

(57) ABSTRACT

A magnetic memory includes a plurality of memory cells and a data identification circuit. Each of the memory cells includes: a first bias node to which a first voltage is applied in data reading, the first voltage being a positive voltage; a second bias node to which a second voltage is applied in the data reading, the second voltage being a negative voltage having substantially the same absolute value as the first voltage; a connection node; a first spin device element connected between the first bias node and the connection node; and a second spin device element connected between (Continued)

the connection node and the second bias node. The first and second spin device elements operate differentially. The data identification circuit identifies data stored in each of the memory cells based on a polarity of a voltage generated on the connection node.

27 Claims, 43 Drawing Sheets

(56) References Cited

U.S. PATENT DOCUMENTS

| | | | | |
|---|---|---|---|---|
| 7,835,210 B2* | 11/2010 | Shimizu | ............... | B82Y 10/00 365/158 |
| 7,852,665 B2* | 12/2010 | Chen | ............... | G11C 11/16 365/158 |
| 8,040,718 B2* | 10/2011 | Ueda | ............... | G11C 11/16 365/158 |
| 8,077,501 B2* | 12/2011 | Ong | ............... | G11C 11/16 365/158 |
| 8,093,668 B2* | 1/2012 | Ueda | ............... | G11C 11/16 365/158 |
| 8,159,864 B2* | 4/2012 | Yoon | ............... | G11C 11/16 365/158 |
| 8,369,129 B2* | 2/2013 | Fujita | ............... | G11C 11/16 365/158 |
| 8,665,638 B2* | 3/2014 | Rao | ............... | G11C 11/16 365/158 |
| 8,743,595 B2* | 6/2014 | Kitano | ............... | G11C 19/0808 365/158 |
| 8,830,735 B2* | 9/2014 | Kariyada | ............... | G11C 11/161 365/158 |
| 8,902,642 B2* | 12/2014 | Mitou | ............... | G11C 11/161 365/158 |
| 8,971,101 B2* | 3/2015 | Matsui | ............... | 365/158 |
| 9,379,312 B2* | 6/2016 | Sugibayashi | ............... | B82Y 25/00 |
| 2006/0118842 A1 | 6/2006 | Iwata | | |
| 2012/0079887 A1 | 4/2012 | Giddings et al. | | |
| 2012/0267735 A1 | 10/2012 | Atulasimha et al. | | |
| 2013/0062714 A1 | 3/2013 | Zhu et al. | | |
| 2013/0064011 A1 | 3/2013 | Liu et al. | | |
| 2013/0121066 A1 | 5/2013 | Zhu et al. | | |
| 2013/0250661 A1 | 9/2013 | Sandhu et al. | | |
| 2013/0256819 A1 | 10/2013 | Watanabe et al. | | |
| 2013/0272059 A1 | 10/2013 | Lin et al. | | |
| 2013/0334630 A1 | 12/2013 | Kula et al. | | |
| 2014/0175582 A1 | 6/2014 | Apalkov et al. | | |
| 2014/0197505 A1 | 7/2014 | Zhou et al. | | |

FOREIGN PATENT DOCUMENTS

| | | |
|---|---|---|
| JP | 2007-200928 | 8/2007 |
| JP | 2012-009786 | 1/2012 |
| JP | 2012-9786 | 1/2012 |
| WO | 2005/050653 | 6/2005 |

OTHER PUBLICATIONS

International Search Report issued Aug. 25, 2015 in International Application No. PCT/JP2015/071719. (English Translation).
Specification, claims and abstract as filed in U.S. Appl. No. 14/728,651 (not yet published), in the Name of Hideaki Fukuzawa filed Jun. 2, 2015.
Kuntal Roy et al. "Hybrid spintronics and straintronics: A magnetic technology for ultra low energy computing and signal processing", Applied Physics Letters 99, 063108 (2011).
Ayan K. Biswas et al., "Energy-efficient magnetoelastic non-volatile memory", Applied Physics Letters 104, 232403 (2014).
Office Action mailed Oct. 7, 2016 in corresponding U.S. Appl. No. 14/728,651.

* cited by examiner

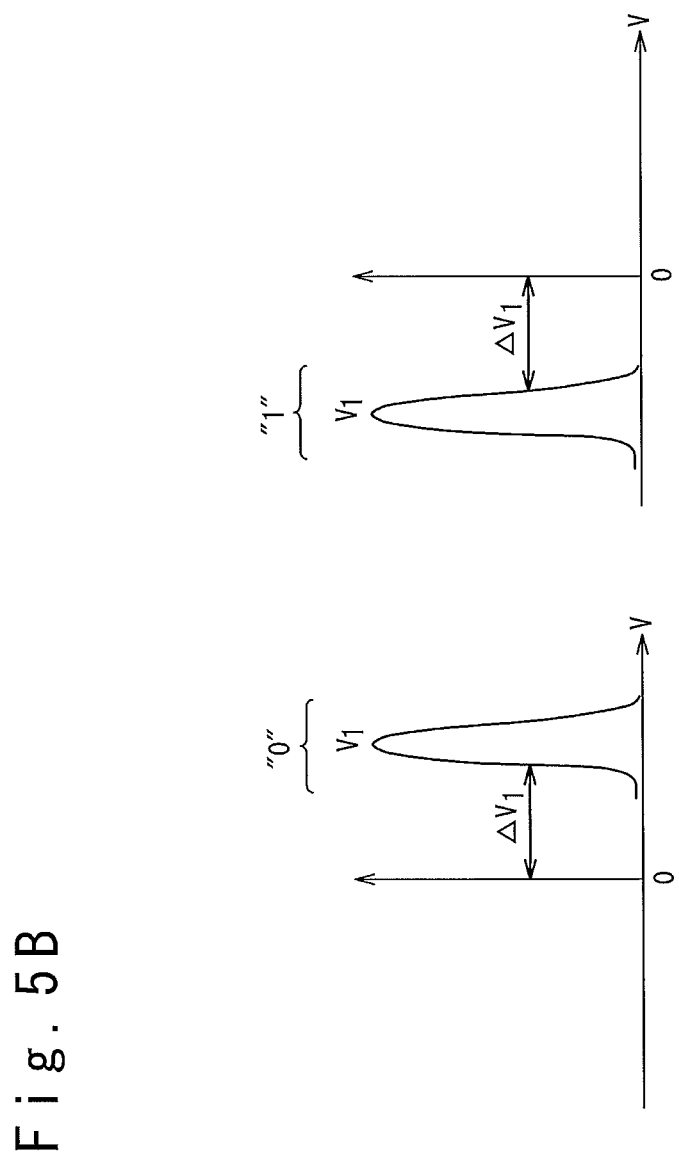

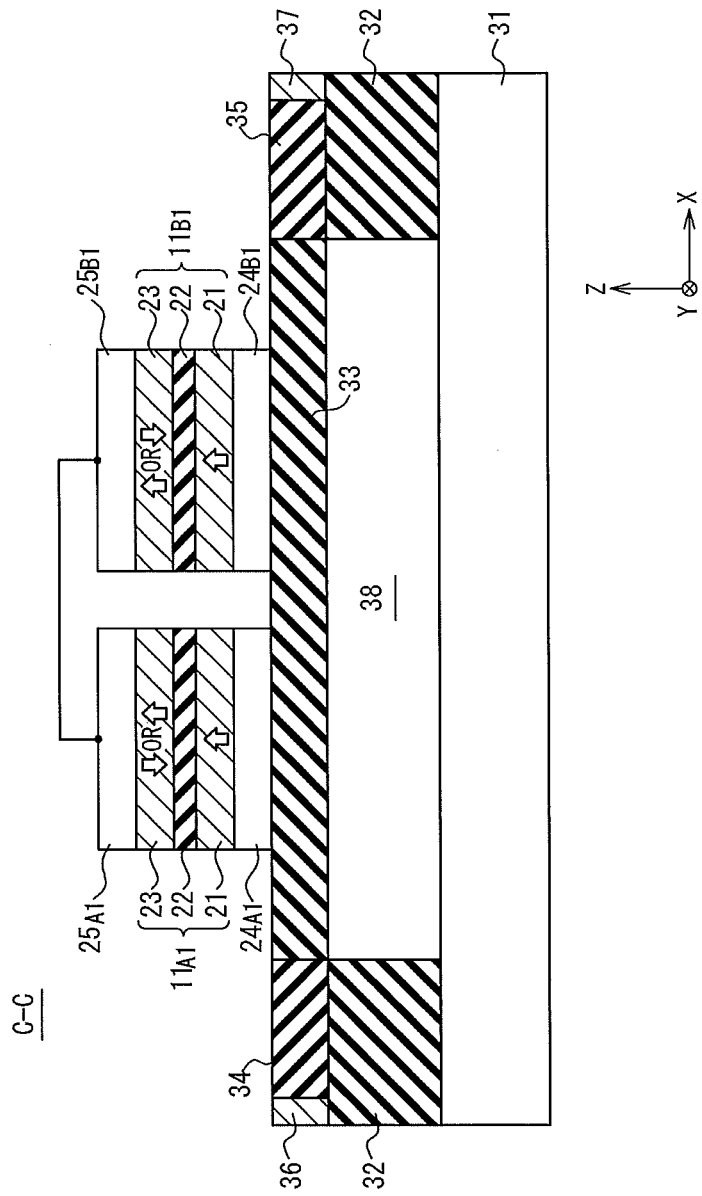

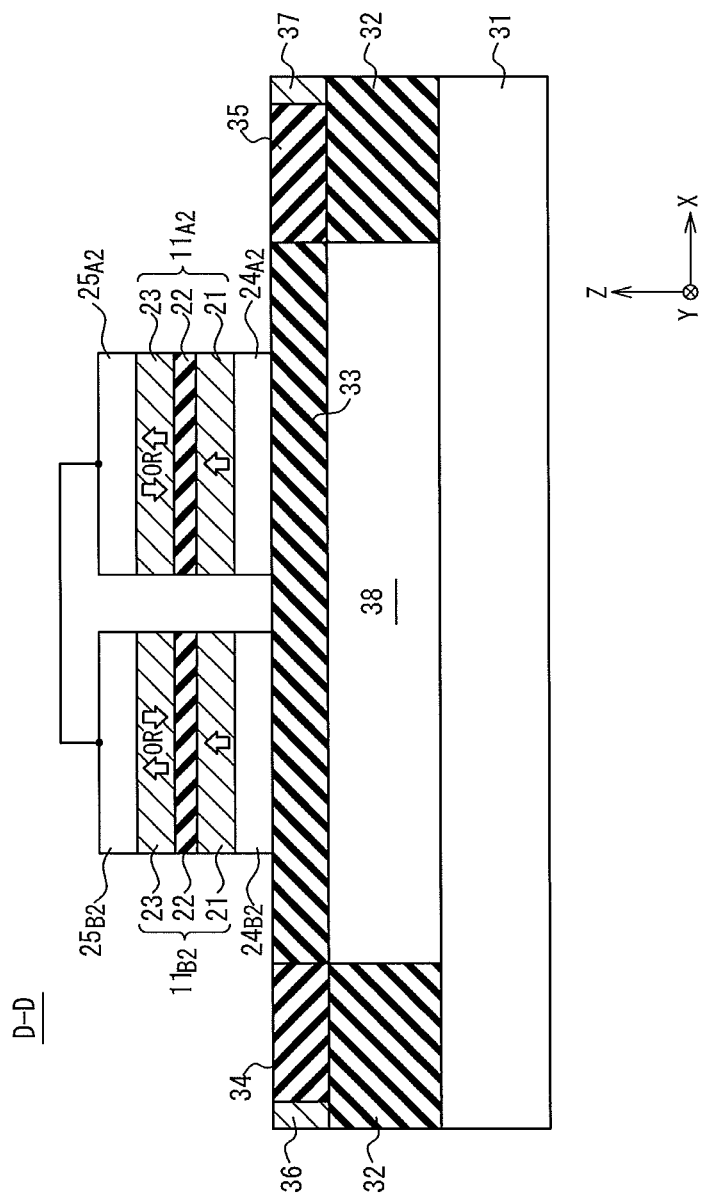

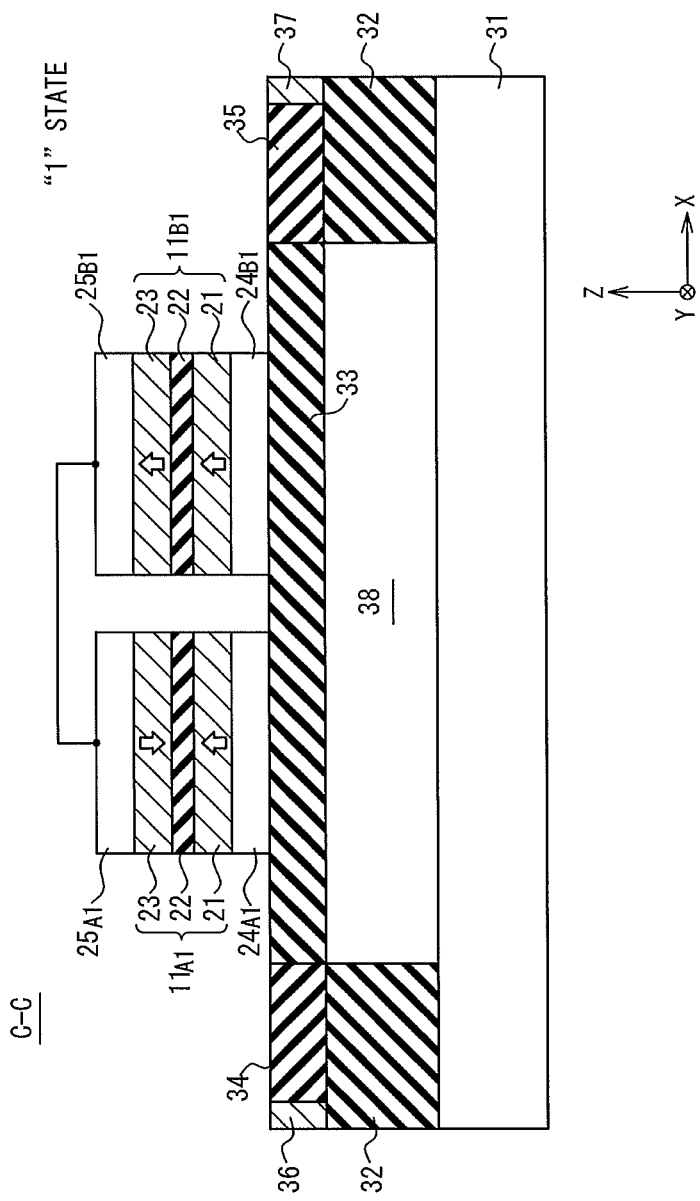

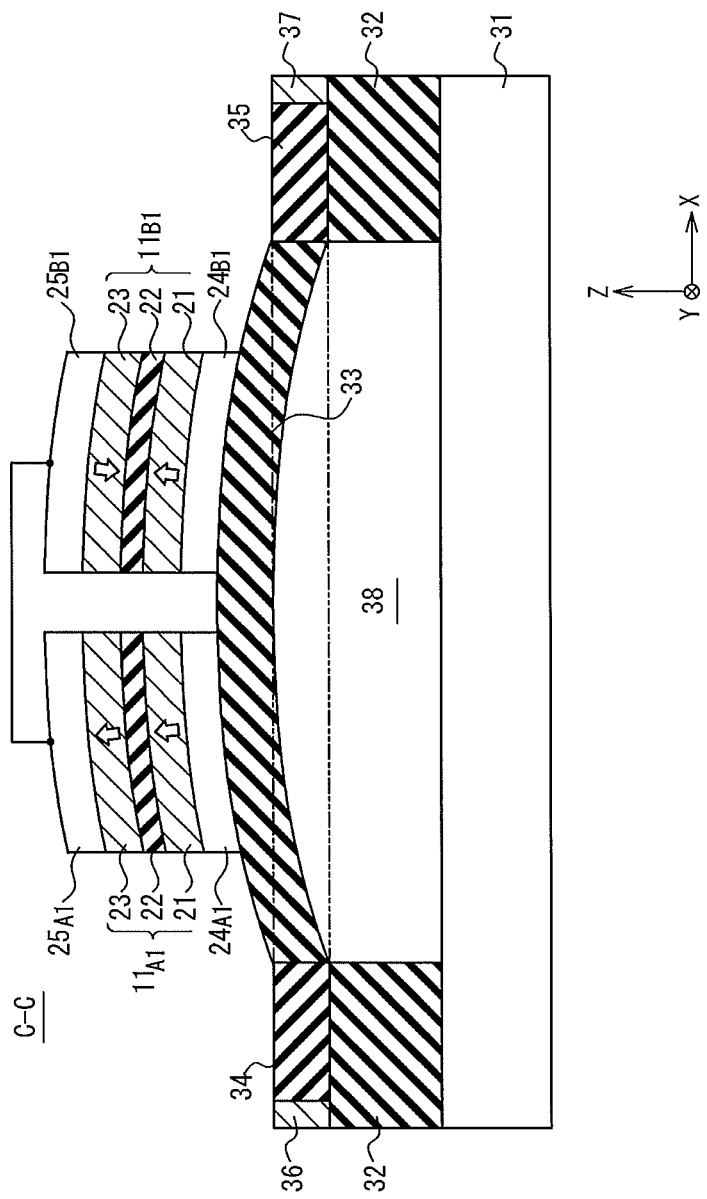

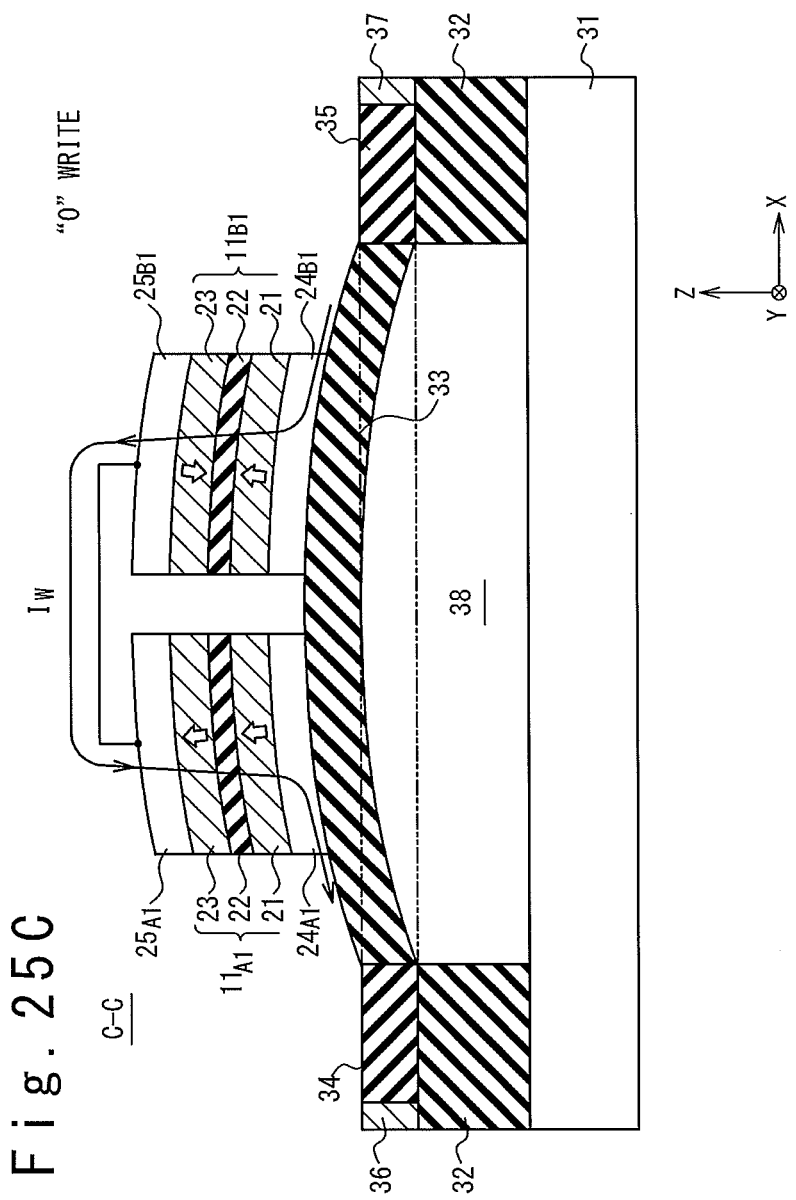

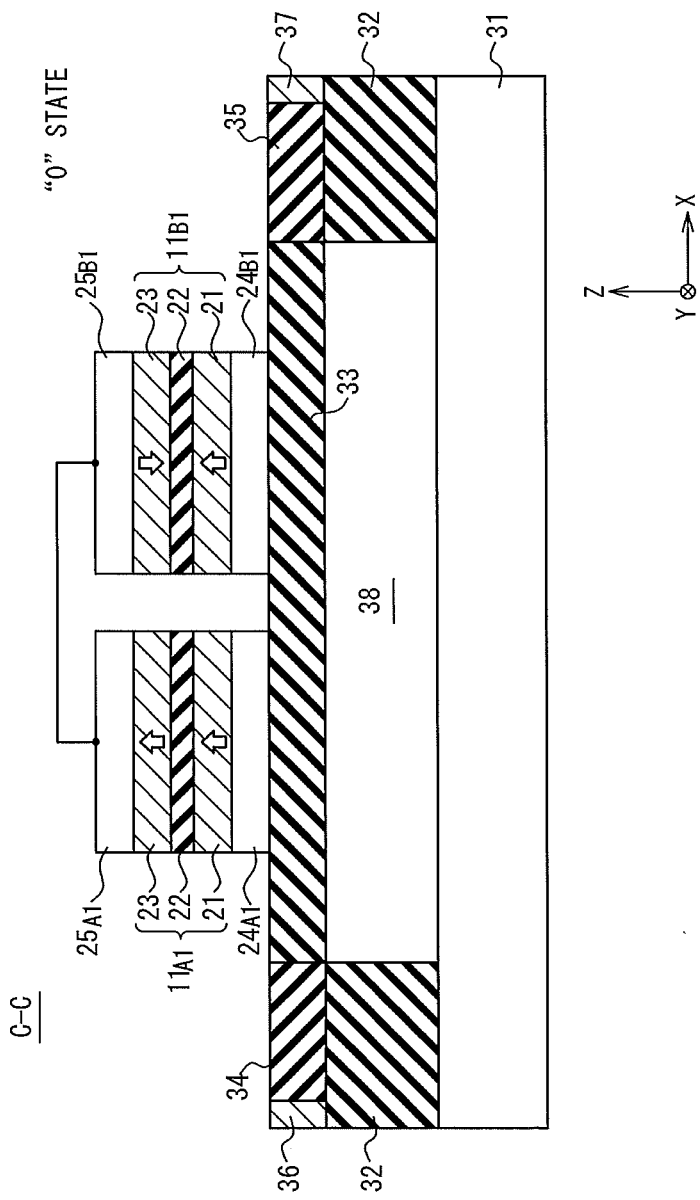

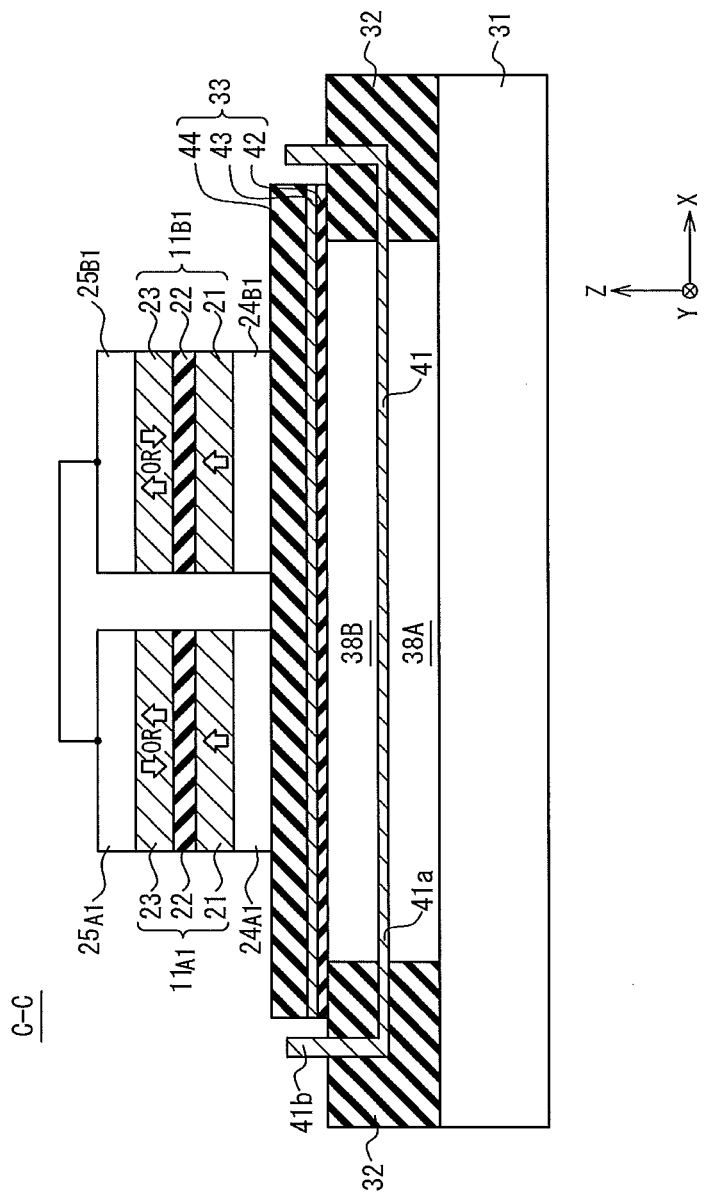

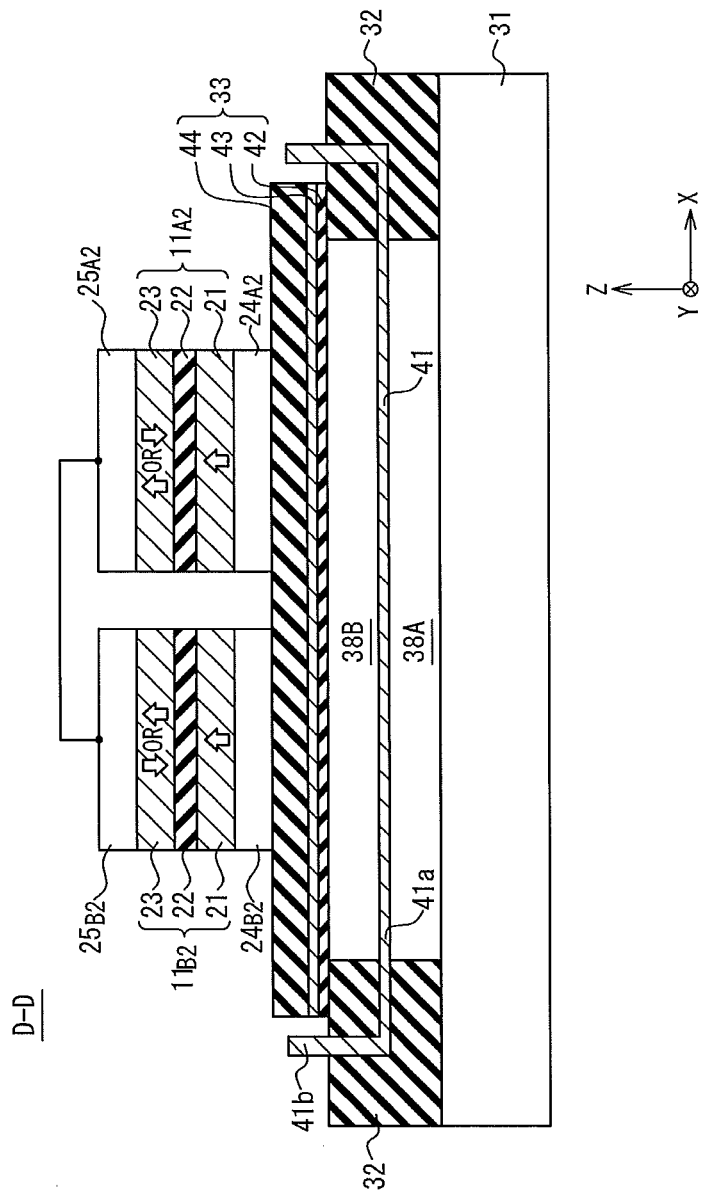

MAGNETIC MEMORY CELL STRUCTURE WITH SPIN DEVICE ELEMENTS AND METHOD OF OPERATING THE SAME

CROSS REFERENCE

This application claims priority of Japanese Patent Application No. 2015-075407, filed on Apr. 1, 2015, the disclosure which is incorporated herein by reference.

TECHNICAL FIELD

The present invention relates to a magnetic memory and a method of operating the same.

BACKGROUND ART

Magnetic memories are devices storing a data as the direction of a spontaneous magnetization (hereinafter, simply referred to as "magnetization") of a magnetic layer. Extensive research and development activities have been conducted for magnetic memories, since they are expected as non-volatile memories with high speed operation, large capacity and reduced power consumption. Most typically, a magnetic memory is configured to achieve data reading by using a magnetoresistance effect, such as a tunnel magnetoresistance effect (TMR effect) and a giant magnetoresistance effect (GMR). An element including two magnetic layers and a spacer layer disposed therebetween (hereinafter, referred to as "spin device element") exhibits a resistance depending on the relative direction of the magnetizations of the two magnetic layers due to the magnetoresistance effect. Most typically, a spin device element is placed into the "low resistance" state when the magnetizations of the two magnetic layers are directed in "parallel" and placed into the "high resistance" state when the magnetizations of the two magnetic layers are directed in "antiparallel". In a magnetic memory which incorporates a spin device element in each memory cell, data stored in each memory cell can be identified from the signal level of a voltage or current signal generated so as to depend on the resistance value of the spin device element.

FIG. 1 is a conceptual diagram illustrating an exemplary read operation of a magnetic memory. Discussed below is the case in which a spin device element is used as a memory cell 101 and the memory cell 101 can take two states: the "high resistance" state of a resistance value $R_{High}$ and the "low resistance" state of a resistance value $R_{Low}$, where $R_{High} > R_{Low}$.

Most typically, a read current $I_{sense}$ is fed to the memory cell 101 when data reading from the memory cell 101 is performed. When the read current $I_{sense}$ flows through the memory cell 101, a read voltage $V_{memory}$ is generated across the memory cell 101. The read voltage $V_{memory}$, which depends on the state of the memory cell 101, that is, the resistance value of the memory cell 101, can be used as a read signal obtained from the memory cell 101. It is possible to identify the data stored in the memory cell 101 by comparing the read voltage $V_{memory}$ generated across the memory cell 101 with a predetermined reference voltage $V_{ref}$ for example, with a sense amplifier 102 and providing a value as the "OUTPUT" shown in FIG. 1. In detail, the data stored in the memory cell 101 can be identified by comparing the read voltage $V_{memory}$ with a reference voltage $V_{ref}$ adjusted between voltages $V_{high}$ and $V_{Low}$, where $V_{High}$ ($=R_{High} \cdot I_{sense}$) is an expected value of the read voltage $V_{memory}$ for the high resistance state and $V_{Low}$ ($=R_{Low} \cdot I_{sense}$) is an expected value of the read voltage $V_{memory}$ for the low resistance state. In the case when the "high resistance" state is associated with data "0" and the "low resistance" state is associated with data "1", for example, the data stored in the memory cell 101 can be identified as data "0" if the read voltage $V_{memory}$ is higher than the reference voltage $V_{ref}$ and as data "1" if the read voltage $V_{memory}$ is lower than the reference voltage $V_{ref}$.

In the above-described read operation, the effective signal window for data identification based on the read signal obtained from the memory cell 101 is the difference $\Delta V$ between the voltages $V_{High}$ and $V_{Low}$. The data stored in the memory cell 101 can be identified more surely, as the signal window $\Delta V$ is increased.

Although the read voltage $V_{memory}$ dependent on the data stored in the memory cell 101 is obtained by feeding a given read current $I_{sense}$ through the memory cell 101 in the above-described operation, a read current dependent on the data stored in the memory cell 101 may be obtained in a read operation by applying a given read voltage across the memory cell 101. In this case, the effective signal window of the read signal obtained from a memory cell 101 is the difference between a current flowing through the memory cell 101 placed into the "low resistance" state and the current flowing through the memory cell 101 placed into the "high resistance" state.

One current issue of the magnetic memory is the insufficiency in the effective signal window of the read signal obtained from the memory cell. Read signals obtained from memory cells have a distribution due to variations in the resistance value of the spin device elements (that is, the memory cells) and variations in the interconnection resistance of long interconnections. In the meantime, the signal level of a reference signal (the reference voltages $V_{ref}$ obtained in the operation illustrated in FIG. 1) also have a distribution due to variations in the circuitry which generates the reference signal. FIG. 2 illustrates one example of the distributions in the signal levels of the read signals and the reference signal. FIG. 2 illustrates the distributions of the reference voltage $V_{ref}$, the read voltage $V_{High}$ obtained as the read voltage $V_{memory}$ when the memory cell 101 is placed in the high-resistance state, and the read voltage $V_{Low}$ obtained as the read voltage $V_{memory}$ when the memory cell 101 is placed in the low-resistance state. The horizontal axis of the graph illustrated in FIG. 2 corresponds to the voltage V and the horizontal axis corresponds to the frequency N. As is understood from FIG. 2, an insufficient effective signal window of the read signal undesirably causes read errors due to the overlap of the distributions of the read voltage $V_{Low}$ and the reference voltage $V_{ref}$ and the overlap of the distributions of the read voltage $V_{High}$ and the reference voltage $V_{ref}$.

It is preferable to sufficiently increase the MR (magnetoresistance) ratio of a spin device element incorporated in a memory cell for achieving a sufficient signal window, because the effective signal window of the read signal obtained from the memory cell depends on the MR ratio of the spin device element. The current technology, however, does not offer an MR ratio for obtaining a sufficient signal window. It is technologically difficult to achieve an increase in the MR ratio, because it requires a remarkable breakthrough in materials used in spin device elements.

Related art documents are listed in the following. U.S. Patent Application Publication No. 2013/0121066 A1 discloses the structure of a memory cell which includes four spin device elements. U.S. Pat. No. 6,424,562 B1 discloses read/write architecture for a magnetoresistive random access memory (MRAM). U.S. Patent Application Publication No. 2013/0272059 A1 discloses a differential MRAM structure.

SUMMARY OF INVENTION

Therefore, an objective of the present invention is to increase an effective signal window of a read signal obtained from a memory cell of a magnetic memory. Other objectives and new features of the present invention would be understood by a person skilled in the art from the attached drawings and the following disclosure.

In an aspect of the present invention, a magnetic memory includes a plurality of memory cells and a data identification circuit. Each of the memory cells includes: a first bias node to which a first voltage is applied in data reading, the first voltage being a positive voltage; a second bias node to which a second voltage is applied in the data reading, the second voltage being a negative voltage having substantially the same absolute value as the first voltage; a connection node; a first spin device element connected between the first bias node and the connection node; and a second spin device element connected between the connection node and the second bias node. Each of the first and second spin device elements is configured to have a first magnetization which is reversible and to take a first or second state depending on a direction of the first magnetization. The resistance of each of the first and second spin device elements in a case when each of the first and second spin device elements is placed in the first state is higher than the resistance of each of the first and second spin device elements in a case when each of the first and second spin device elements is placed in the second state. The second spin device element is placed in the second state when the first spin device element is placed in the first state, and placed in the first state when the first spin device element is placed in the second state. The data identification circuit identifies data stored in each of the memory cells based on a polarity of a voltage generated on the connection node.

In another aspect of the present invention, a magnetic memory includes a memory cell and a data identification circuit. The memory cell includes: a first bias node to which a first voltage is applied in data reading from the memory cell; a second bias node to which a second voltage lower than the first voltage is applied in the data reading; a first connection node; a second connection node; a first spin device element connected between the first bias node and the first connection node; a second spin device element connected between the first connection node and the second bias node; a third spin device element connected between the first bias node and the second connection node; and a fourth spin device element connected between the second connection node and the second bias node. Each of the first to fourth spin device elements is configured to have a first magnetization which is reversible and to take selected one of first and second states depending on a direction of the first magnetization. The resistance of each of the first to fourth spin device elements in a case when each of the first to fourth spin device elements is placed in the first state is higher than the resistance of each of the first to fourth spin device elements in a case when each of the first to fourth spin device elements is placed in the second state. The first and fourth spin device elements have the same state selected from the first and second states and the second and third spin device elements have the same state selected from the first and second states. The second and third spin device elements are placed in the second state when the first and fourth spin device elements are placed in the first state, and placed in the first state when the first and fourth spin device elements are placed in the second state. The data identification circuit identifies data stored in the memory cell based on a third voltage generated on the first connection node and a fourth voltage generated on the second connection node.

In still another aspect of the present invention, a magnetic memory includes a memory cell and a data identification circuit. The memory cell includes: a first bias node to which a first voltage is applied in data reading from the memory cell; a second bias node to which a second voltage lower than the first voltage is applied in the data reading; a first connection node; a second connection node; a first spin device element connected between the first bias node and the first connection node; a first resistor element connected between the first connection node and the second bias node; a second resistor element connected between the first bias node and the second connection node; and a second spin device element connected between the second connection node and the second bias node. Each of the first and second spin device elements is configured to have a first magnetization which is reversible and to take selected one of first and second states depending on a direction of the first magnetization. The resistance of each of the first and second spin device elements in a case when each of the first and second spin device elements is placed in the first state is higher than the resistance of each of the first and second spin device elements in a case when each of the first and second spin device elements is placed in the second state. The first and fourth spin device elements have the same state selected from the first and second states. The data identification circuit identifies data stored in each of the memory cells based on a third voltage generated on the first connection node and a fourth voltage generated on the second connection node.

In still another aspect of the present invention, a method of operating a magnetic memory is provided, which includes a plurality of memory cells each comprising first and second bias nodes, a connection node, a first spin device element connected between the first bias node and the connection node, and a second spin device element connected between the connection node and the second bias node. Each of the first and second spin device elements is configured to have a first magnetization which is reversible and to take selected one of first and second states depending on a direction of the first magnetization. The resistance of each of the first and second spin device elements in a case when each of the first and second spin device elements is placed in the first state is higher than the resistance of each of the first and second spin device elements in a case when each of the first and second spin device elements is placed in the second state. The second spin device element is placed in the second state when the first spin device element is placed in the first state, and placed in the first state when the first spin device element is placed in the second state. The method includes:

applying a first voltage to the first bias node, the first voltage being a positive voltage;

applying a second voltage to the second bias node, the second voltage being a negative voltage having substantially the same absolute value as the first voltage; and identifying data stored in each of the memory cells based on a polarity of a voltage generated on the connection node.

In still another aspect of the present invention, a method of operating a magnetic memory is provided, which includes a memory cell comprising: first and second bias nodes; first and second connection nodes; a first spin device element connected between the first bias node and the first connection node; a second spin device element connected between the first connection node and the second bias node; a third spin device element connected between the first bias node and the second connection node; and a fourth spin device element connected between the second connection node and the second bias node. Each of the first to fourth spin device elements is configured to have a first magnetization which is reversible and to take selected one of first and second states depending on a direction of the first magnetization. The resistance of each of the first to fourth spin device elements in a case when each of the first to fourth spin device elements is placed in the first state is higher than the resistance of each of the first to fourth spin device elements in a case when each of the first to fourth spin device elements is placed in the second state. The first and fourth spin device elements have the same state selected from the first and second states and the second and third spin device elements have the same state selected from the first and second states. The second and third spin device elements are placed in the second state when the first and fourth spin device elements are placed in the first state, and placed in the first state when the first and fourth spin device elements are placed in the second state. The method includes:

applying a first voltage to the first bias node;

applying a second voltage lower than the first voltage to the second bias node; and identifying data stored in the memory cell based on a third voltage generated on the first connection node and a fourth voltage generated on the second connection node.

The present invention effectively increases the effective signal window of a read signal obtained from a memory cell of a magnetic memory.

BRIEF DESCRIPTION OF THE DRAWINGS

The above and other advantages and features of the present invention will be more apparent from the following description taken in conjunction with the accompanied drawings, in which:

FIG. 5B is a graph illustrating one example of the distribution of read voltages obtained from memory cells configured as illustrated in FIG. 4A and the effective signal window of the read voltages;

FIG. 22A is a cross-sectional view illustrating the structure of each block on section C-C indicated in FIG. 21;

FIG. 22B is a cross-sectional view illustrating the structure of each block on section D-D indicated in FIG. 21;

FIGS. 25A to 25D are cross-sectional views illustrating an exemplary data write procedure into a memory cell of the memory cell array illustrated in FIGS. 20 to 24;

FIGS. 26A and 26B are cross-sectional views illustrating another example of the structure of the memory cell array of the magnetic memory in which spin device elements are integrated on a deformable base plate;

DESCRIPTION OF PREFERRED EMBODIMENTS

Figure 1:
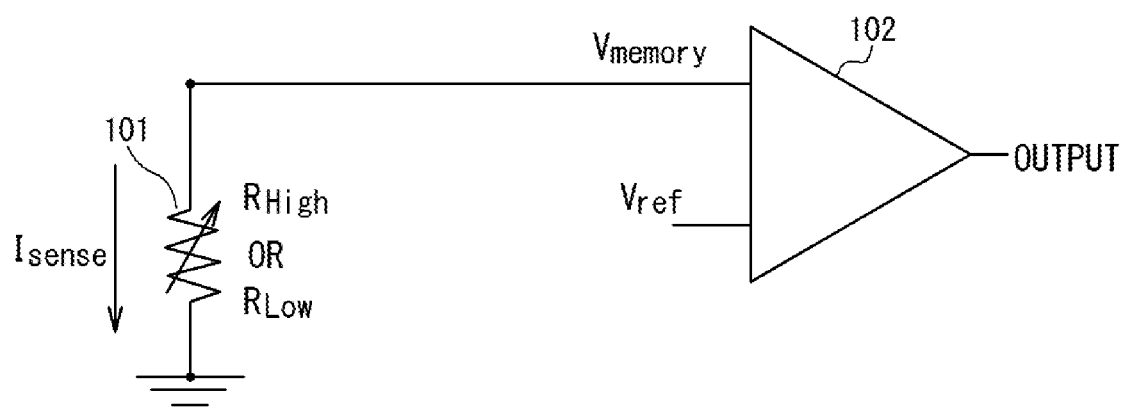
FIG. 1 is a conceptual diagram illustrating an exemplary read operation of a magnetic memory.
Figure 2:
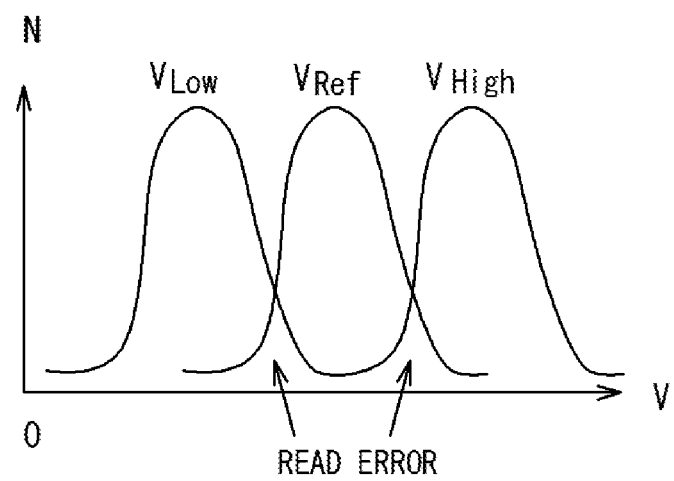
FIG. 2 is a graph illustrating one example of the distributions in the signal levels of read signals and a reference signal.

The invention will be now described herein with reference to illustrative embodiments. Those skilled in the art would appreciate that many alternative embodiments can be accomplished using the teachings of the present invention and that the invention is not limited to the embodiments illustrated for explanatory purposed. It would be appreciated that the same or similar components may be denoted by the same or corresponding reference numerals in the description of the preferred embodiments. It would be also appreciated that for simplicity and clarity of illustration, elements in the Figures have not necessary drawn to scale. For example, the dimensions of some of the elements are exaggerated relative to other elements.

(Configuration and Operation of Magnetic Memory)

Figure 3:
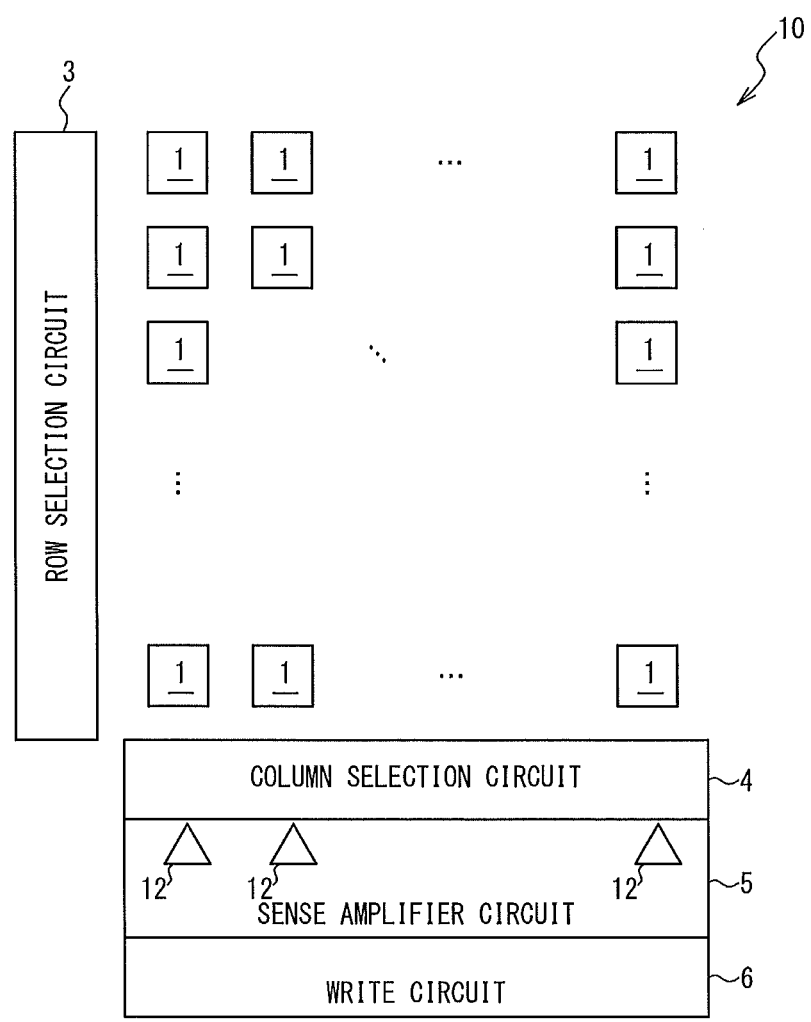
FIG. 3 illustrates an exemplary configuration of a magnetic memory in one embodiment of the present invention.

FIG. 3 illustrates an exemplary configuration of a magnetic memory 10 in one embodiment of the present invention. The magnetic memory 10 includes a plurality of memory cells 1 arrayed in row and columns, a row selection circuit 3, a column selection circuit 4, a sense amplifier circuit 5 and a write circuit 6. The row selection circuit 3 selects a desired row of the memory cells 1 and the column selection circuit 4 selects a desired column of the memory cells 1. In read and write operations, a memory cell 1 to be accessed is selected by the row selection circuit 3 and the column selection circuit 4. The sense amplifier circuit 5 includes sense amplifiers 12. In read operation, data stored in a selected memory cell 1 is identified by the corresponding sense amplifier 12. The write circuit 6 feeds a write current to a selected memory cell 1 in a write operation.

Figure 4A:
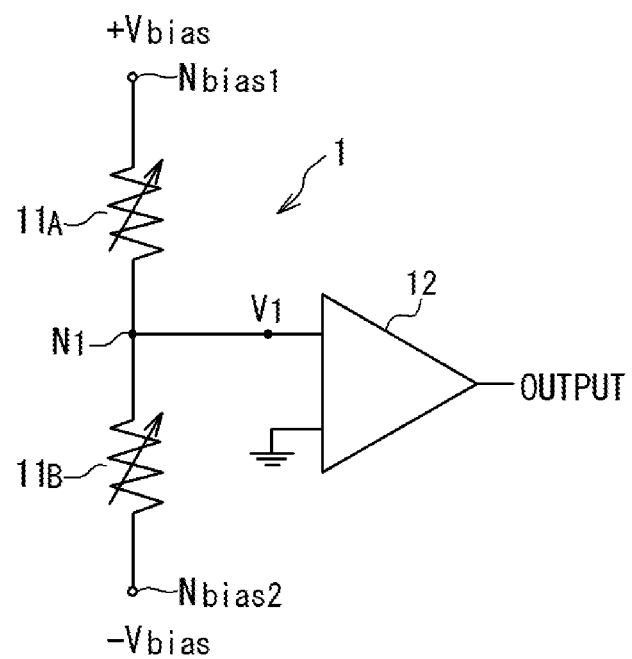
FIG. 4A is a circuit diagram illustrating a schematic configuration of each memory cell in the present embodiment.

FIG. 4A is a circuit diagram illustrating a schematic configuration of each memory cell 1 of the magnetic memory 10. In one embodiment, each memory cell 1 includes two spin device elements $11_A$ and $11_B$. It should be noted that the spin device elements $11_A$ and $11_B$ may be collectively referred to as the spin device elements 11 if they are not distinguished from each other.

Figure 4B:
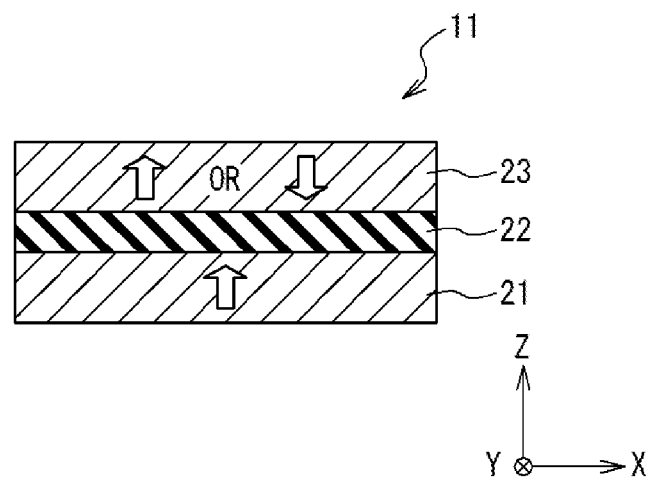
FIG. 4B is a sectional view illustrating an exemplary structure of each spin device element in the present embodiment.

FIG. 4B is a sectional view illustrating an exemplary structure of each spin device element 11. In the present embodiment, each spin device element 11 includes a reference layer 21, a spacer layer 22 and a recording layer 23. The reference layer 21 and the recording layer 23 are opposed to each other across the spacer layer 22. In the structure illustrated in FIG. 4B, the spacer layer 22 is coupled with the upper surface of the reference layer 21 and the recording layer 23 is coupled with the upper surface of the spacer layer 22. It should be noted that the positions of the reference layer 21 and the recording layer 23 may be exchanged.

The reference layer 21 and the recording layer 23, which are both configured to exhibit a magnetization, include at least one magnetic film. The spacer layer 22 is formed of non-magnetic material. The magnetization direction of the referent layer 21 is fixed, while the magnetization direction of the recording layer 23 is reversible. In one embodiment, the reference layer 21 and the recording layer 23 both have perpendicular magnetic anisotropy. In this case, the reference layer 21 is formed so that the magnetization thereof is fixed in a film thickness direction, and the recording layer 23 is formed so that the magnetization thereof is reversible between the film thickness directions. Illustrated in FIG. 4B is the structure in which the magnetization of the reference layer 21 is fixed in the upward direction (+Z direction) and the magnetization of the recording layer 23 is reversible between the upward and downward directions (+Z and −Z directions). It should be noted however that the reference layer 21 and the recording layer 23 may have in-plane magnetic anisotropy instead.

The reference layer 21 and the recording layer 23 may be formed of an elementary substance of magnetic metal, such as iron (Fe), cobalt (Co) and nickel (Ni), or a ferromagnetic alloy including at least one of these magnetic metals, for example. The reference layer 21 and the recording layer 23 may be formed of magnetic metal or alloy doped with one or more non-magnetic elements. Non-magnetic elements which may be contained in the reference layer 21 and the recording layer 23 include boron, carbon, nitrogen, oxygen, aluminum, silicon, titanium, vanadium, chromium, manganese, copper, zinc, zirconium, niobium, molybdenum, ruthenium, rhodium, palladium, silver, hafnium, tantalum, tungsten, iridium, platinum and gold.

In one embodiment, the spacer layer 22 may be formed of a dielectric film having such a thin thickness that a tunnel current can flow through the spacer layer 22. In this case, the spin device element 11 operates as a TMR (tunnel magnetoresistance) element that exhibits a TMR effect. To obtain a sufficiently large TMR effect, it is preferable that the spacer layer 22 is formed of, for example, magnesium oxide (MgO), aluminum oxide (AlOx) or the like. Alternatively, the spacer layer 22 may be formed of oxide, nitride or oxynitride of magnesium (Mg), aluminum (Al), silicon (Si), zirconium (Zr), hafnium (Hf), tantalum (Ta) or the like.

The spacer layer 22 may be formed of a metal conductor to reduce the resistance of the spin device element 11. In this case, the spin device element 11 is configured as a spin valve element that exhibits a giant magnetoresistance (GMR) effect. To achieve a sufficiently large GMR effect, the spacer layer 22 may be formed of non-magnetic metal, such as copper (Cu), gold (Au), silver (Ag) and aluminum (Al) or an alloy of these non-magnetic metals. A composite spacer layer that includes an oxide matrix and metal columns penetrating through the oxide matrix in the thickness direction may be used as the spacer layer 22. In this case, the oxide matrix of the composite spacer layer may be formed of aluminum oxide and the metal columns, which penetrates through the oxide matrix in the thickness direction, may be formed of copper (Cu). The spacer layer 22 preferably has a thickness of 1 to 3 nm.

Each spin device element 11 thus structured is allowed to have two states: the "low resistance" state and the "high resistance" state. In detail, a spin device element 11 is placed into the "low resistance" state when the magnetizations of the reference layer 21 and the recording layer 23 are directed in "parallel" and the spin device element 11 is placed into the "high resistance" state when the magnetizations of the reference layer 21 and the recording layer 23 are directed in "antiparallel". This implies that the spin device element 11 functions as a variable resistor element exhibiting a resistance value depending on the relative direction of the reference layer 21 and the recording layer 23.

Although the simplest structure of the spin device element 11 is illustrated in FIG. 4B, the structure of the spin device element 11 may be variously modified. For example, the reference layer 21 may be formed of a film stack including a magnetic film and an antiferromagnetic film that fixes the magnetization of the magnetic film. The recording layer 23 may be formed of a film stack including multiple magnetic layers and one or more non-magnetic films each providing ferromagnetic coupling between adjacent two of the magnetic layers.

Referring back to FIG. 4A, the two spin devices elements $11_A$ and $11_B$ are connected in series between a node $N_{bias1}$ and a node $N_{bias2}$ in the memory cell 1, where the nodes $N_{bias1}$ and $N_{bias2}$ are first and second bias nodes to which bias voltages are applied in a read operation. In detail, the spin device element $11_A$ is connected between the node $N_{bias1}$ and a node $N_1$ and the spin device element $11_B$ is connected between the node $N_1$ and the node $N_{bias2}$, where the node $N_1$ is a connection node which provides electrical connection between the spin devices elements $11_A$ and $11_B$.

The memory cell 1 illustrated in FIG. 4A is configured to offer two allowed states with two spin device elements 11 and to thereby store one bit data. In the configuration illustrated in FIG. 4A, as illustrated in FIG. 5A, each memory cell 1 stores one-bit data, correlating one of the first and second states defined below with data "0" and the other with data "1":

First state: a state in which the spin device element $11_A$ is placed in the "low resistance" state and the spin device element $11_B$ is placed in the "high resistance" state, and Second state: a state in which the spin device element $11_A$ is placed in the "high resistance" state and the spin device element $11_B$ is placed in the "low resistance" state.

Figure 5A:
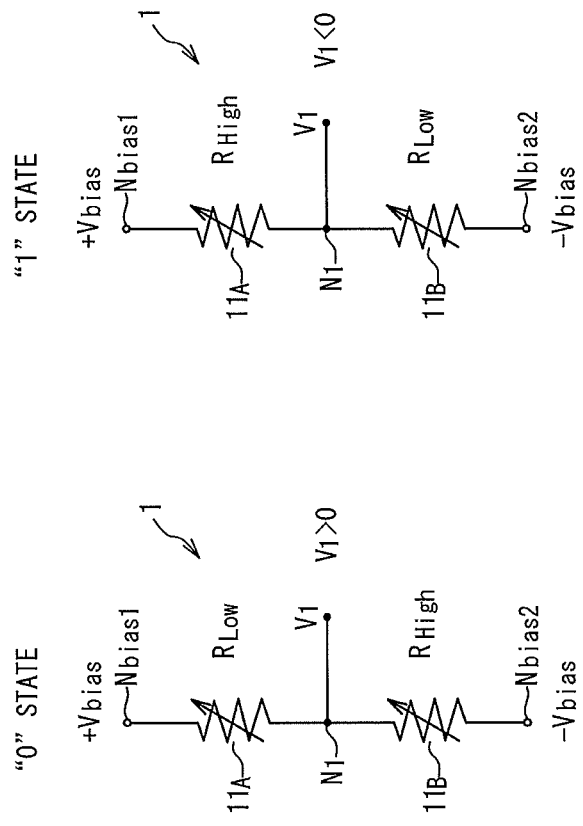
FIG. 5A is a conceptual diagram illustrating two allowed states of the memory cell configured as illustrated in FIG. 4A.

FIG. 5A illustrates two allowed states of the memory cell 1 in the case when the first state is correlated with data "0" and the second state is correlated with data "1".

Data reading from a memory cell 1 configured as illustrated in FIG. 4A is achieved by determining the polarity of the voltage $V_1$ generated on the node $N_1$ with a data identification circuit, e.g. a sense amplified 12, in the state in which a positive bias voltage $+V_{bias}$ is applied to the node $N_{bias1}$ and a negative bias voltage $-V_{bias}$ is applied to the node $N_{bias2}$. It should be noted that the bias voltages applied to the nodes $N_{bias1}$ and $N_{bias2}$ have substantially the same absolute value (magnitude) but have opposite polarities. In an actual implementation, the absolute values of the bias voltages applied to the nodes $N_{bias1}$ and $N_{bias2}$ may slightly differ from each other due to manufacturing process variations or other reasons; however, the bias voltages applied to the nodes $N_{bias1}$ and $N_{bias2}$ are adjusted to have at least substantially the same absolute value. In the example illustrated in FIG. 5A, in which the first state is correlated with data "0" and the second state is correlated with data "1", the data stored in the memory cell 1 is identified as data "0" when the polarity of the voltage $V_1$ is positive and as data "1" when the polarity of the voltage $V_1$ is negative.

The memory cell configuration illustrated in FIG. 4A effectively offers a large signal window even when the MR ratios of the spin device elements 11 are not so large, due to the differential operation using the two spin device elements 11. Accordingly, as illustrated in FIG. 5B, the reliability of data reading from the memory cell 1 can be effectively improved even when the voltage $V_1$ on the node $N_1$ varies on some level. Note that the signal window is denoted by symbol $\Delta V_1$ in FIG. 5B. Additionally, the memory cell configuration illustrated in FIG. 4A allows identifying the data stored in the memory cell 1 with a simple method; the data identification can be achieved by determining the polarity of the voltage $V_1$.

Figure 6:
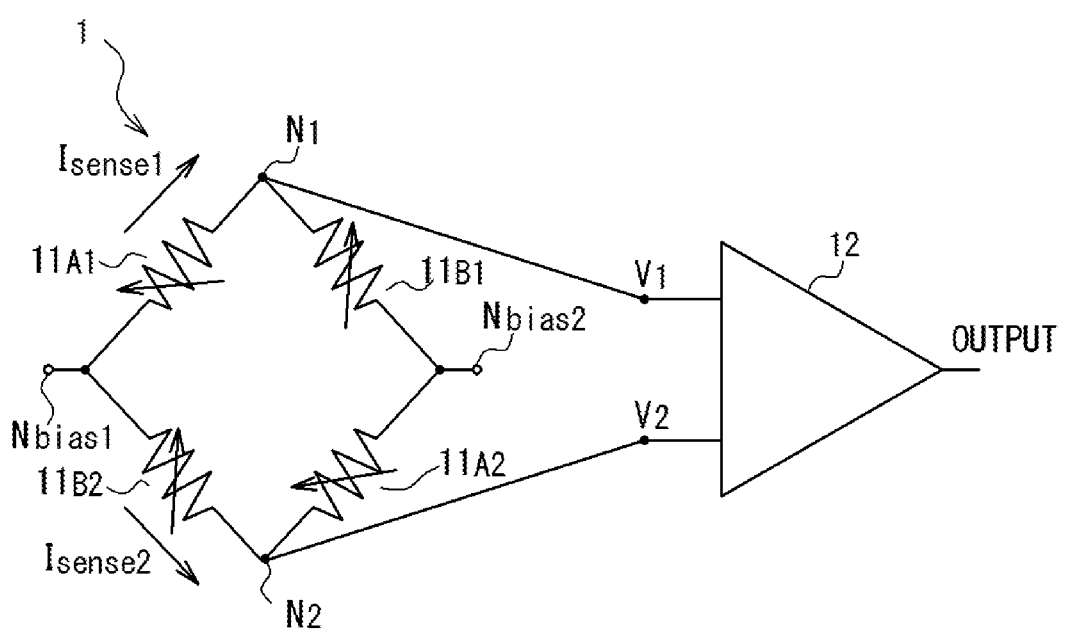
FIG. 6 is a circuit diagram illustrating the schematic structure of each memory cell of a magnetic memory in another embodiment of the present invention.

FIG. 6 is a circuit diagram illustrating the schematic structure of each memory cell 1 of the magnetic memory 10 in another embodiment of the present invention. In the present embodiment, each memory cell 1 includes four spin device elements 11. It should be noted that, suffixes "A1", "A2", "B1" and "B2" may be used in the following, if the spin device elements 11 are distinguished from one another.

The four spin device elements 11 forms a bridge circuit in each memory cell 1 of the magnetic memory 10 in the present embodiment. More specifically, the spin device element $11_{A1}$ is connected between a node $N_{bias1}$ and a node $N_1$ and the spin device element $11_{B1}$ is connected between the node $N_1$ and a node $N_{bias2}$, where the node $N_{bias1}$ is a first bias node to which a first voltage is applied in a read operation and the node $N_{bias2}$ is a second bias node to which a second voltage lower than the first voltage is applied in the read operation. In one embodiment, in the read operation, a positive bias voltage $+V_{bias}$ is applied to the node $N_{bias1}$ while the node $N_{bias2}$ is grounded. The node $N_1$ is a first connection node which provides an electrical connection between the spin device elements $11_{A1}$ and $11_{B1}$. Furthermore, the spin device element $11_{B2}$ is connected between the node $N_{bias1}$ and a node $N_2$ and the spin device element $11_{A2}$ is connected between the node $N_2$ and the node $N_{bias2}$, where the node $N_2$ is a second connection node which provides an electrical connection between the spin device elements $11_{B2}$ and $11_{A2}$.

Figure 7:
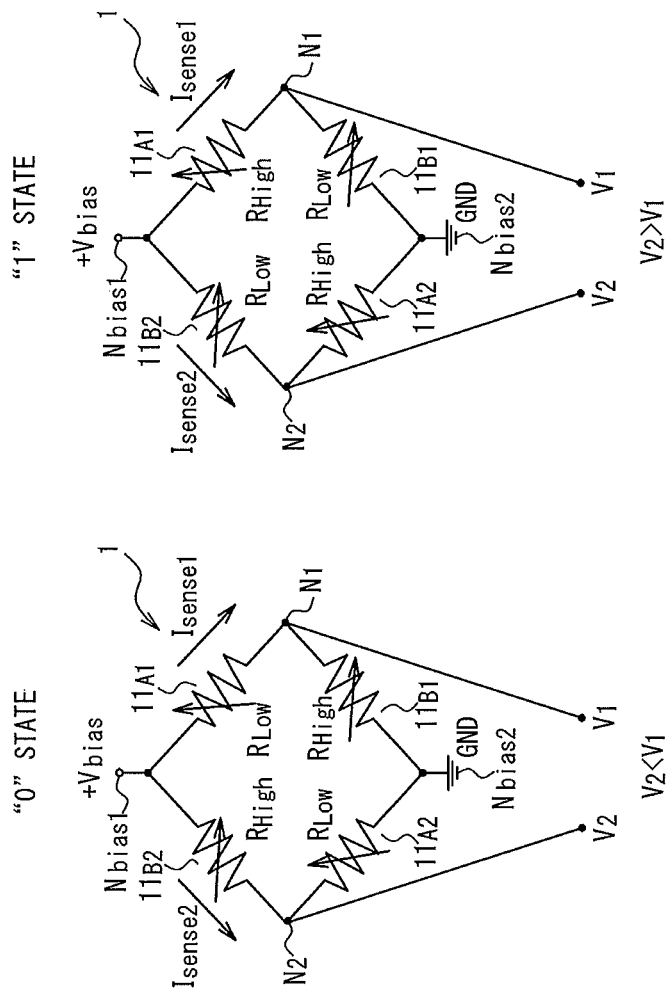
FIG. 7 a conceptual diagram illustrating two allowed states of the memory cell illustrated in FIG. 6.

The memory cell 1 illustrated in FIG. 6 is configured to offer two allowed states with four spin device elements 11 and to thereby store one bit data. FIG. 7 illustrates the two allowed states of the memory cell 1 in the present embodiment. In the present embodiment, each memory cell 1 stores one-bit data, correlating one of the first and second states defined below with data "0" and the other with data "1":

First state: a state in which the spin device elements $11_{A1}$ and $11_{A2}$ are placed in the "low resistance" state and the spin device elements $11_{B1}$ and $11_{B2}$ are placed in the "high resistance" state, and Second state: a state in which the spin device elements $11_{A1}$ and $11_{A2}$ are placed in the "high resistance" state and the spin device elements $11_{B1}$ and $11_{B2}$ are placed in the "low resistance" state. FIG. 7 illustrates two allowed states of the memory cell 1 in the case when the first state is correlated with data "0" and the second state is correlated with data "1". It should be noted that the spin device elements $11_{A1}$ and $11_{A2}$ are a pair of spin device elements which are always placed in the same state and the spin device elements $11_{B1}$ and $11_{B2}$ are another pair of spin device elements which are always placed in the same state. It should be also noted that the state of the spin device elements $11_{A1}$ and $11_{A2}$ is always different from the state of the spin device elements $11_{B1}$ and $11_{B2}$.

Data reading from a memory cell 1 configured as illustrated in FIG. 6 is achieved by comparing the voltages $V_1$ and $V_2$ generated on the nodes $N_1$ and $N_2$ by using a data identification circuit, e.g. a sense amplifier 12, in the state in which a first voltage is applied to the node $N_{bias1}$ and a second voltage lower than the first voltage is applied to the node $N_{bias2}$. In one example, the voltages $V_1$ and $V_2$ generated on the nodes $N_1$ and $N_2$ are compared by the sense amplifier 12 in the state in which a positive bias voltage $V_{bias}$ is applied to the node $N_{bias1}$ and the node $N_{bias2}$ is grounded. When a first voltage is applied to the node $N_{bias1}$ and a second voltage lower than the first voltage is applied to the node $N_{bias2}$ (for example, when a positive bias voltage $+V_{bias}$ is applied to the node $N_{bias1}$ with the node $N_{bias2}$ grounded), a read current $I_{sense1}$ flowing through the spin device elements $11_{A1}$ and $11_{B1}$ and a read current $I_{sense2}$ flowing through the spin device elements $11_{A2}$ and $11_{B2}$ are generated and the voltages $V_1$ and $V_2$ are generated by the read currents $I_{sense1}$ and $I_{sense2}$ on the nodes $N_1$ and $N_2$, respectively. In the example illustrated in FIG. 7, in which the first state is correlated with data "0" and the second state is correlated with data "1", the data stored in the memory cell 1 is identified as data "0" when the voltage $V_1$ is higher than voltage $V_2$ and as data "1" when the voltage $V_1$ is lower than voltage $V_2$.

Figure 8:
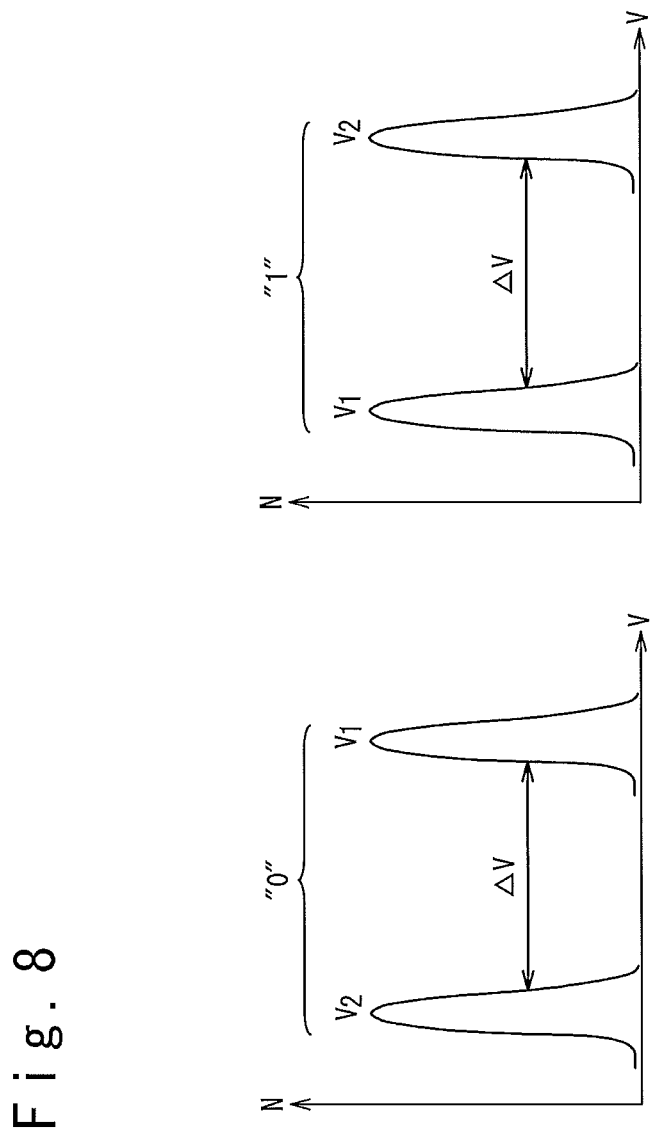
FIG. 8 is a graph illustrating one example of the distribution of read voltages obtained from memory cells illustrated in FIG. 6 and the effective signal window of the read voltages.

The above-described memory cell 1, in which the four spin device elements 11 form a bridge circuit generating a pair of differential signals, effectively offers a large signal window $\Delta V$ even when the MR ratios of the spin device elements 11 are not so large. Accordingly, as illustrated in FIG. 8, the reliability of data reading from the memory cell 1 can be effectively improved even when the voltages $V_1$ and $V_2$ on the nodes $N_1$ and $N_2$ vary on some level.

Additionally, when the four spin device elements 11 are arranged closed to each other, this effectively suppresses the influences of variations in the properties of the spin device elements 11. Even when a manufacturing process of the magnetic memory suffers from manufacturing process variations, the influences of the manufacturing process variations on the voltages $V_1$ and $V_2$ on the nodes $N_1$ and $N_2$ can be effectively suppressed, because spin device elements placed close to each other exhibit reduced property variations.

Figure 9A:
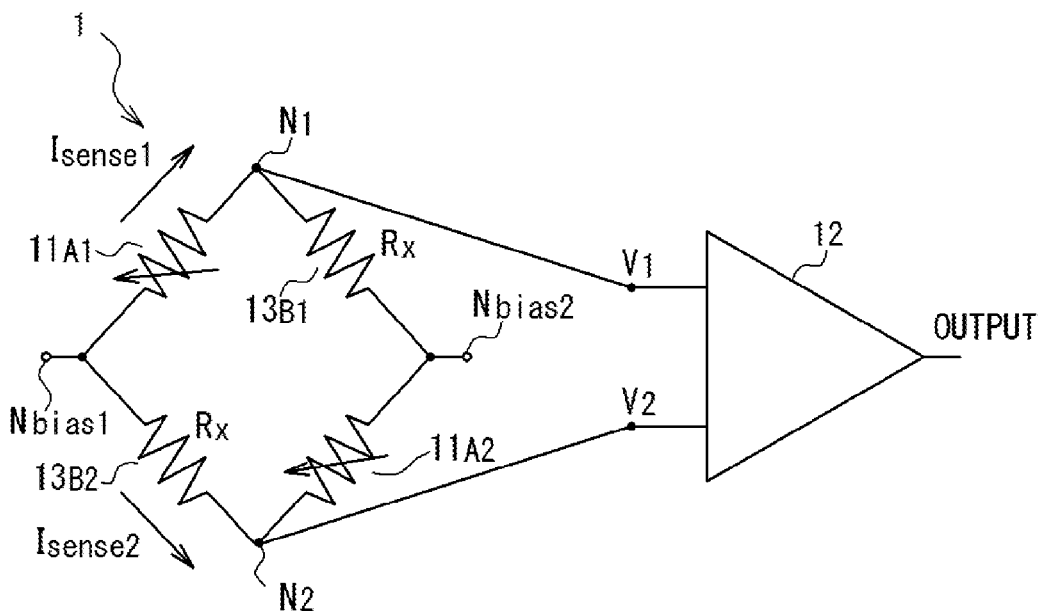
FIG. 9A a circuit diagram illustrates a modification of the memory cell in the present embodiment.

FIG. 9A is a circuit diagram illustrating a modification of the memory cell 1 in the present embodiment. In the configuration of the memory cell 1 illustrated in FIG. 9A, two spin device elements 11 and two resistor elements 13 with a fixed resistance form a half bridge circuit. It should be noted that, suffixes "A1", "A2", "B1" and "B2" may be used in the following, if the resistor elements 13 are distinguished from one another.

The configuration of the memory cell 1 illustrated in FIG. 9A is derived from that of the memory cell 1 illustrated in FIG. 6 by replacing the spin device elements $11_{B1}$ and $11_{B2}$ with resistor elements with a fixed resistance value. More specifically, the memory cell 1 illustrated in FIG. 9A includes two spin device elements $11_{A1}$, $11_{A2}$ and two resistor elements $13_{B1}$ and $13_{B2}$ having a fixed resistance value. The spin device element $11_{A1}$ is connected between the node $N_{bias1}$ and the node $N_1$ and the resistor element $13_{B1}$ is connected between the node $N_1$ and the node $N_{bias2}$. Furthermore, the resistor element $13_{B2}$ is connected between the node $N_{bias1}$ and the node $N_2$ and the spin device element $11_{A2}$ is connected between the node $N_2$ and the node $N_{bias2}$. As described above, the node $N_{bias1}$ is a first bias node to which a first voltage is applied in a read operation and the node $N_{bias2}$ is a second bias node to which a second voltage lower than the first voltage is applied in the read operation.

Preferably, the resistance value $R_x$ of the resistor elements $13_{B1}$ and $13_{B2}$ is in the range between the resistance values $R_{High}$ and $R_{Low}$, where $R_{High}$ is the resistance value of the spin device element $11_{A1}$ and $11_{A2}$ in the case when the spin device element $11_{A1}$ and $11_{A2}$ are placed in the "high resistance" state, and $R_{Low}$ the resistance value of the spin device element $11_{A1}$ and $11_{A2}$ in the case when the spin device element $11_{A1}$ and $11_{A2}$ are placed in the "low resistance" state. More preferably, the resistance value $R_x$ of the resistor elements $13_{B1}$ and $13_{B2}$ is adjusted to the average value of the resistance values $R_{High}$ and $R_{Low}$. In an actual implementation, it is preferable that the design value of the resistance value $R_x$ of the resistor elements $13_{B1}$ and $13_{B2}$ is determined as the average of the design values of the resistance values $R_{High}$ and $R_{Low}$ of the spin device elements $11_{A1}$ and $11_{B2}$, since the resistance values $R_{High}$ and $R_{Low}$ actually vary due to manufacturing process variations.

Figure 10:
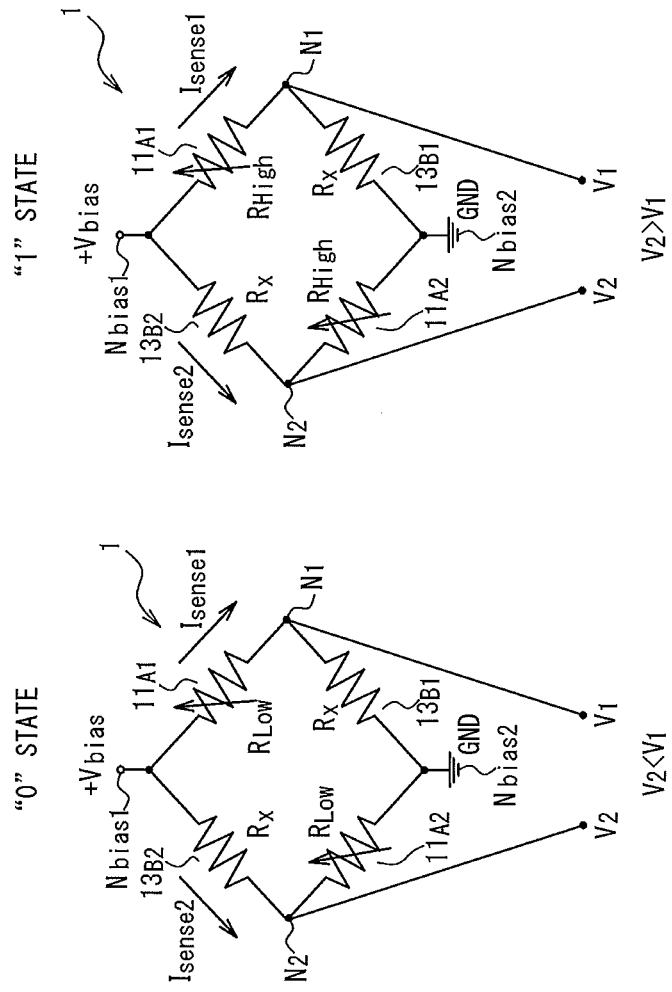
FIG. 10 is a conceptual diagram illustrating two allowed states of the memory cell illustrated in FIG. 9A.

The memory cell 1 illustrated in FIG. 9A is configured to offer two allowed states with two spin device elements 11 and to thereby store one bit data. FIG. 10 illustrates the two allowed states of the memory cell 1 configured as illustrated in FIG. 9A. The memory cell 1 configured as illustrated in FIG. 9A stores one-bit data, correlating one of the first and second states defined below with data "0" and the other with data "1":

First state: a state in which the spin device elements $11_{A1}$ and $11_{A2}$ are placed in the "low resistance" state, and Second state: a state in which the spin device elements $11_{A1}$ and $11_{A2}$ are placed in the "high resistance" state.

FIG. 10 illustrates two allowed states of the memory cell 1 in the case when the first state is correlated with data "0" and the second state is correlated with data "1". It should be noted that the spin device elements $11_{A1}$ and $11_{A2}$ are a pair of spin device elements which are always placed in the same state.

Data reading from a memory cell 1 configured as illustrated in FIG. 9A is achieved by comparing the voltages $V_1$ and $V_2$ generated on the nodes $N_1$ and $N_2$ by using a data identification circuit, e.g. a sense amplifier 12, in the state in which a first voltage is applied to the node $N_{bias1}$ and a second voltage lower than the first voltage is applied to the node $N_{bias2}$. In one embodiment, the voltages $V_1$ and $V_2$ generated on the nodes $N_1$ and $N_2$ are compared by the sense amplifier 12 in the state in which a positive bias voltage $+V_{bias}$ is applied to the node $N_{bias1}$ and the node $N_{bias2}$ is grounded. In the example illustrated in FIG. 10, in which the first state is correlated with data "0" and the second state is correlated with data "1", the data stored in the memory cell 1 is identified as data "0" when the voltage $V_1$ is higher than voltage $V_2$ and as data "1" when the voltage $V_1$ is lower than voltage $V_2$.

The memory cell 1 illustrated in FIG. 9A, in which the two spin device elements 11 and the two resistor elements 13 form a bridge circuit generating a pair of differential signals, effectively offers a large signal window $\Delta V$ even when the MR ratios of the spin device elements 11 are not so large. Accordingly, the reliability of data reading from the memory cell 1 can be effectively improved even when the voltages $V_1$ and $V_2$ on the nodes $N_1$ and $N_2$ vary on some level.

Figure 9B:
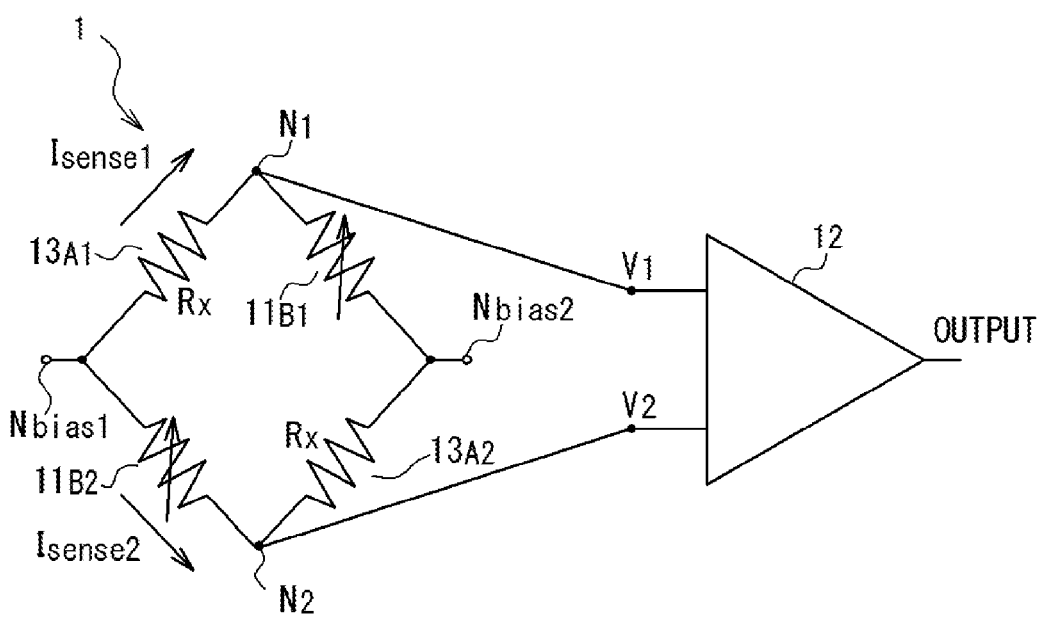
FIG. 9B a circuit diagram illustrating another modification of the memory cell in the present embodiment.

FIG. 9B is a circuit diagram illustrating another modification of the memory cell 1 in the present embodiment. Also in the configuration of the memory cell 1 illustrated in FIG. 9B, two spin device elements 11 and two resistor elements 13 with a fixed resistance form a half bridge circuit.

The configuration of the memory cell 1 illustrated in FIG. 9B is derived from that of the memory cell 1 illustrated in FIG. 6 by replacing the spin device elements $11_{A1}$ and $11_{A2}$ with resistor elements with a fixed resistance value. More specifically, the memory cell 1 illustrated in FIG. 9B includes two spin device elements $11_{B1}$, $11_{B2}$ and two resistor elements $13_{A1}$ and $13_{A2}$ having a fixed resistance value. The resistor element $13_{A1}$ is connected between the node $N_{bias1}$ and the node $N_1$ and the spin device element $11_{B1}$ is connected between the node $N_1$ and the node $N_{bias2}$. Furthermore, the spin device element $11_{B2}$ is connected between the node $N_{bias1}$ and the node $N_2$ and the resistor element $13_{A2}$ is connected between the node $N_2$ and the node $N_{bias2}$.

The memory cell 1 illustrated in FIG. 9B is also configured to offer two allowed states with four spin device elements 11 and to thereby store one bit data, as is the case with that illustrated in FIG. 9A. The memory cell 1 configured as illustrated in FIG. 9B stores one-bit data, correlating one of the first and second states defined below with data "0" and the other with data "1":

First state: a state in which the spin device elements $11_{B1}$ and $11_{B2}$ are placed in the "high resistance" state, and Second state: a state in which the spin device elements $11_{B1}$ and $11_{B2}$ are placed in the "low resistance" state.

It should be noted that the spin device elements $11_{B1}$ and $11_{B2}$ are a pair of spin device elements which are always placed in the same state.

Data reading from a memory cell 1 configured as illustrated in FIG. 9B is achieved by comparing the voltages $V_1$ and $V_2$ generated on the nodes $N_1$ and $N_2$ by using a data identification circuit, e.g. a sense amplifier 12, in the state in which a first voltage is applied to the node $N_{bias1}$ and a second voltage lower than the first voltage is applied to the node $N_{bias2}$, similarly to that from a memory cell 1 configured as illustrated in FIG. 9A. In one embodiment, the voltages $V_1$ and $V_2$ generated on the nodes $N_1$ and $N_2$ are compared by the sense amplifier 12 in the state in which a positive bias voltage $+V_{bias}$ is applied to the node $N_{bias1}$ and the node $N_{bias2}$ is grounded. When the first state is correlated with data "0" and the second state is correlated with data "1", for example, the data stored in the memory cell 1 is identified as data "0" when the voltage $V_1$ is higher than voltage $V_2$ and as data "1" when the voltage $V_1$ is lower than voltage $V_2$.

The memory cell 1 illustrated in FIG. 9A, in which the two spin device elements 11 and two resistor elements 13 form a bridge circuit generating a pair of differential signals, also offers a large signal window $\Delta V$ even when the MR ratios of the spin device elements 11 are not so large. Accordingly, the reliability of data reading from the memory cell 1 can be effectively improved even when the voltages $V_1$ and $V_2$ on the nodes $N_1$ and $N_2$ vary on some level.

In the following, a description is given of more specific configurations of the memory cells of the magnetic memory in the present embodiment. It should be noted that the memory cell configuration described below is designed to facilitate data writing into the memory cells.

Figure 11A:
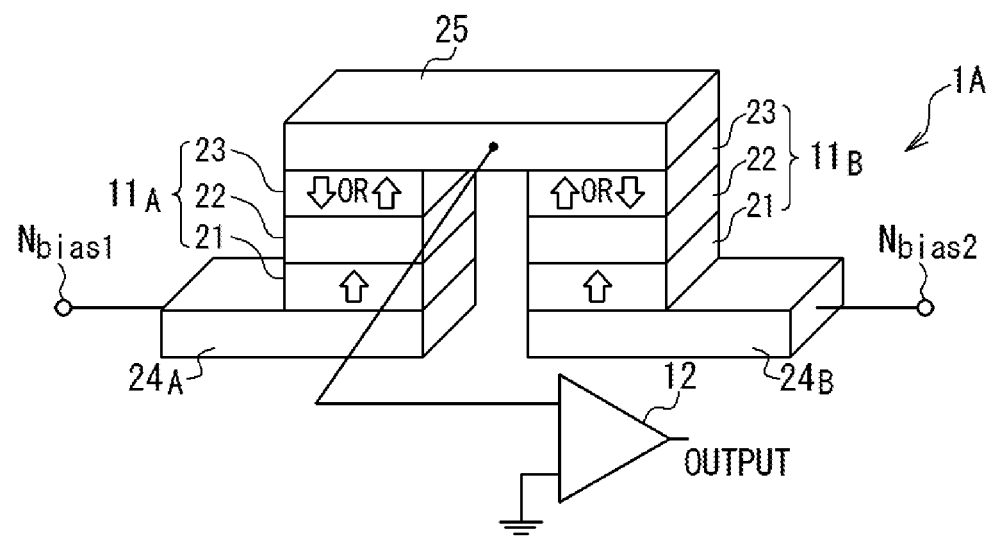
FIG. 11A is a conceptual diagram illustrating one example of the configuration of each memory cell when the magnetic memory of the present embodiment is configured as an STT-MRAM (Spin Transfer Torque Magnetoresistive Random Access Memory)

FIG. 11A is a diagram conceptually illustrating one example of the configuration of each memory cell 1A, when the magnetic memory 10 of the present embodiment is configured as an STT-MRAM (Spin Transfer Torque Magnetoresistive Random Access Memory). In an STT-MRAM, a spin transfer torque is used in data writing into a memory cell. The configuration of the memory cell 1A illustrated in FIG. 11A corresponds to that illustrated in FIG. 4A. In the following, a description is given of the configuration of the memory cell 1A illustrated in FIG. 11A.

The memory cell 1A includes two spin device elements $11_A$ and $11_B$. Each of the spin device elements 11 includes a reference layer 21, a spacer layer 22 and a recording layer 23. The structure of the spin device elements 11 is as described above with reference to FIG. 4B.

The spin device elements $11_A$ and $11_B$ are formed on the upper surfaces of lower electrodes $24_A$ and $24_B$, respectively. In detail, the reference layers 21 of the spin device elements $11_A$ and $11_B$ are formed on the upper surfaces of the lower electrodes $24_A$ and $24_B$, respectively. In each of the spin device elements $11_A$ and $11_B$, the spacer layer 22 is formed on the upper surface of the reference layer 21 and the recording layer 23 is formed on the upper surface of the spacer layer 22.

The lower electrode $24_A$ is connected to a node $N_{bias1}$ and the lower electrode $24_B$ is connected to a node $Nb_{1as2}$ where the nodes $N_{bias1}$ and $N_{bias2}$ are bias nodes to which bias voltages are applied in read and write operations. The lower electrode $24_A$ functions as an interconnection which electrically connects the spin device element $11_A$ to the node $N_{bias1}$ and the lower electrode $24_B$ functions as an interconnection which electrically connects the spin device element $11_B$ to the node $N_{bias2}$.

An upper electrode 25 is coupled with the upper surfaces of the spin device elements $11_A$ and $11_B$. The upper electrode 25, which functions as an interconnection that provides an electrical connection between the spin device elements $11_A$ and $11_B$, is a circuit component which corresponds to the node $N_1$ of the memory cell 1 illustrated in FIG. 4A.

Figure 11B:
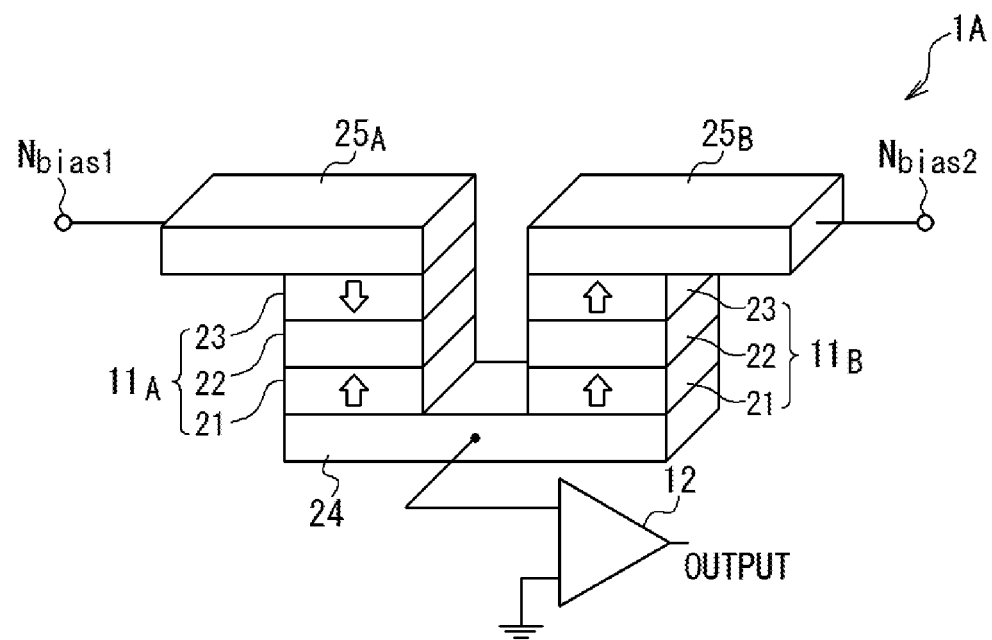
FIG. 11B is a conceptual diagram illustrating another example of the configuration of each memory cell when the magnetic memory of the present embodiment is configured as an STT-MRAM.

As illustrated in FIG. 11B, the spin device elements $11_A$ and $11_B$ may be electrically connected to each other via a lower electrode 24. In this case, an upper electrode $25_A$ formed on the upper surface of the spin device element $11_A$ is connected to the node $N_{bias1}$, and an upper electrode $25_B$ formed on the upper surface of the spin device element $11_B$ is connected to the node $N_{bias2}$.

It should be noted that the positions of the reference layer 21 and the recording layer 23 may be exchanged in each spin device element 11 in both of the configurations illustrated in FIGS. 11A and 11B.

The memory cells 1A illustrated in FIGS. 11A and 11B, similarly to the memory cell 1 illustrated in FIG. 4A, are configured to store one-bit data, correlating one of the first and second states defined below with data "0" and the other with data "1":

First state: a state in which the spin device element $11_A$ is placed in the "low resistance" state and the spin device element $11_B$ is placed in the "high resistance" state, and Second state: a state in which the spin device element $11_A$ is placed in the "high resistance" state and the spin device element $11_B$ is placed in the "low resistance" state.

It should be noted that, in the configurations illustrated in FIGS. 11A and 11B, the reference layers 21 of the two spin device elements $11_A$ and $11_B$ are connected to each other (see FIG. 11B) or the recording layers 23 of the two spin device elements $11_A$ and $11_B$ are connected to each other (see FIG. 11A). Such a connection aims at placing the memory cell 1A into the first or second state by feeding a write current which flows between the node $N_{bias1}$ and $N_{bias2}$. When a write current is caused to flow through the memory cell 1A, one of the spin device elements $11_A$ and $11_B$, in which the directions of the write currents are different, is placed into the "high resistance" state and the other is placed into the "low resistance" state, since the direction into which the magnetization is directed in the magnetization reversal based on the spin transfer torque depends on the direction of the write current. In the configuration illustrated in FIG. 11A, for example, when a write current which flows from the node $N_{bias1}$ to the node $N_{bias2}$ is fed, the write current flows from the reference layer 21 to the recording layer 23 in the spin device element $11_A$ and from the recording layer 23 to the reference layer 21 in the spin device element $11_B$. This allows placing the memory cell 1A into the first state defined above. When a write current is fed from the node $N_{bias2}$ to the node $N_{bias1}$, the write current flows from the recording layer 23 to the reference layer 21 in the spin device element $11_A$ and the write current flows from the reference layer 21 to the recording layer 23 in the spin device element $11_B$. This allows placing the memory cell 1A into the second state defined above. A person skilled in the art would appreciate it that this discussion also applies to the configuration illustrated in FIG. 11B.

Figure 12A:
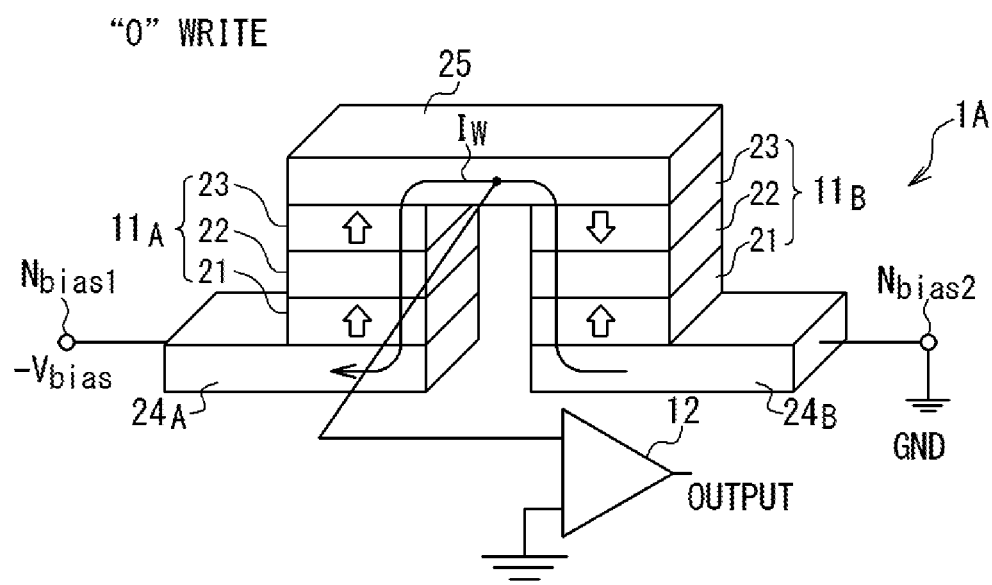
FIGS. 12A and 12B illustrate data writing into the memory cell illustrated in FIG. 11A.
Figure 12B:
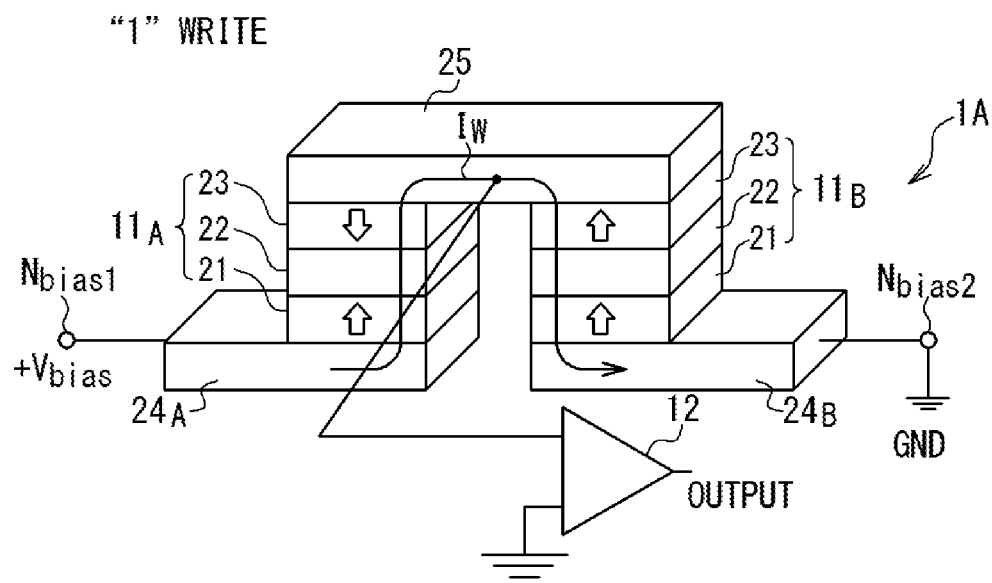

Next, a description is given of data writing and reading into and from the memory cell 1A illustrated in FIG. 11A. FIGS. 12A and 12B illustrate data writing into the memory cell 1A illustrated in FIG. 11A. It should be noted that FIGS. 12A and 12B illustrates a write operation in the case when the first state is correlated with data "0" and the second state is correlated with data "1". As described above, the first state is the state in which the spin device element $11_A$ is placed in the "low resistance state" and the spin device element $11_B$ is placed in the "high resistance" state and the second state is the state in which the spin device element $11_A$ is placed in the "high resistance" state and the spin device element $11_B$ is placed in the "low resistance" state.

In data writing, bias voltages are applied to the nodes $N_{bias1}$ and $N_{bias2}$ depending on data to be written into the memory cell 1A to generate a write current $I_W$ between the nodes $N_{bias1}$ and $N_{bias2}$.

In detail, to write data "0", a voltage lower than the voltage on the node $N_{bias2}$ is applied to the node $N_{bias1}$ as illustrated in FIG. 12A. In the operation illustrated in FIG. 12A, the node $N_{bias2}$ is grounded and a negative bias voltage $-V_{bias}$ is applied to the node $N_{bias1}$. This causes a write current to flow from the node $N_{bias2}$ to the node $N_{bias1}$, directing the magnetizations of the reference layer 21 and the recording layer 23 in "parallel" in the spin device element $11_A$, and in "antiparallel" in the spin device element $11_B$. As a result, the memory cell 1A is placed into the first state, in which the spin device element $11_A$ is in the "low resistance" state and the spin device element $11_B$ is in the "high resistance" state.

To write data "1", on the other hand, a voltage higher than the voltage on the node $N_{bias2}$ is applied to the node $N_{bias1}$ as illustrated in FIG. 12B. In the operation illustrated in FIG. 12B, the node $N_{bias2}$ is grounded and a positive bias voltage $V_{bias}$ is applied to the node $N_{bias1}$. This causes a write current to flow from the node $N_{bias1}$ to the node $N_{bias2}$, directing the magnetizations of the reference layer 21 and the recording layer 23 in "antiparallel" in the spin device element $11_A$ and in "parallel" in the spin device element $11_B$. As a result, the memory cell 1A is placed into the second state, in which the spin device element $11_A$ is in the "high resistance" state and the spin device element $11_B$ is in the "low resistance" state.

Figure 13:
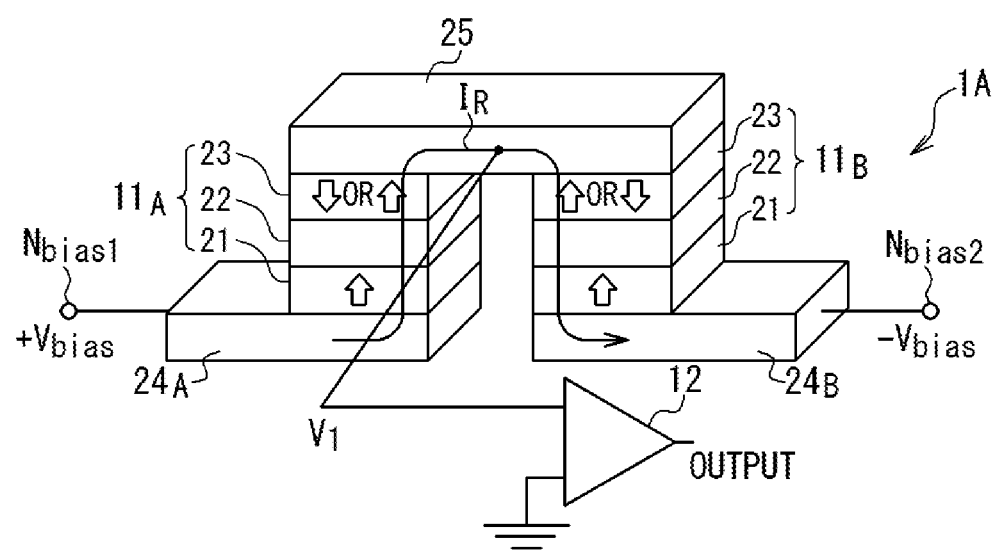
FIG. 13 is a diagram illustrating data reading from the memory cell illustrated in FIG. 11A.

FIG. 13 illustrate data reading from the memory cell 1A illustrated in FIG. 11A. In data reading, a positive bias voltage $+V_{bias}$ is applied to the node $N_{bias1}$ and a negative bias voltage $-V_{bias}$ is applied to the node $N_{bias2}$. It should be noted that the bias voltages applied to the nodes $N_{bias1}$ and $N_{bias2}$ have substantially the same absolute value (magnitude) but have opposite polarities. When the positive bias voltage $+V_{bias}$ is applied to the node $N_{bias1}$ and the negative bias voltage $-V_{bias}$ is applied to the node $N_{bias2}$, a read current $I_R$ flowing through the spin device elements $11_A$ and $11_B$ is generated and a voltage $V_1$ is generated by the read current $I_R$ on the upper electrode 25, which corresponds to the node $N_1$.

The data stored in the memory cell 1A is identified in the same way as the memory cell 1 illustrated in FIG. 4A. When the first state is correlated with data "0" and the second state is correlated with data "1", for example, the data stored in the memory cell 1A is identified as data "0" if the polarity of the voltage $V_1$ is positive and as data "1" if the polarity of the voltage $V_1$ is negative.

Figure 14A:
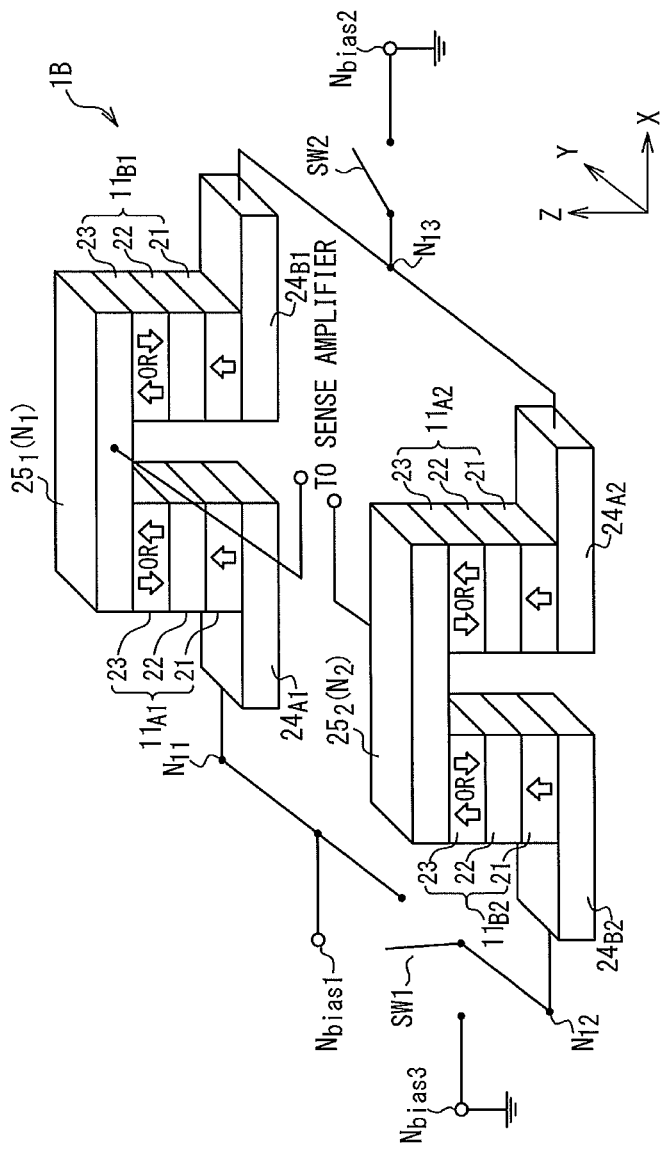
FIGS. 14A to 14F are conceptual diagrams illustrating other examples of the configuration of each memory cell when the magnetic memory of the present embodiment is configured as an STT-MRAM.

FIG. 14A schematically illustrates another example of the configuration of each memory cell 1B, when the magnetic memory 10 of the present embodiment is configured as an STT-MRAM. The configuration of the memory cell 1B illustrated in FIG. 14A corresponds to that illustrated in FIG. 6. In the following, a description is given of the configuration of the memory cell 1B illustrated in FIG. 14A.

The memory cell 1B includes four spin device elements $11_{A1}$, $11_{A2}$, $11_{B1}$, $11_{B2}$ and switching elements SW1 and SW2. Each of the four spin device elements 11 includes a reference layer 21, a spacer layer 22 and a recording layer 23. The configuration of each spin device element 11 is as described above with reference to FIG. 4B.

The spin device elements $11_{A1}$, $11_{A2}$, $11_{B2}$ and $11_{B2}$ are formed on the upper surfaces of lower electrodes $24_{A1}$, $24_{A2}$, $24_{B1}$ and $24_{B2}$, respectively. In detail, the reference layers 21 of the spin device elements $11_{A1}$, $11_{A2}$, $11_{B2}$ and $11_{B2}$ are formed on the upper surfaces of the lower electrodes $24_{A1}$, $24_{A2}$, $24_{B1}$ and $24_{B2}$, respectively. In each of the spin device elements $11_{A1}$, $11_{A2}$, $11_{B2}$ and $11_{B2}$, the spacer layer 22 is formed on the reference layer 21 and the recording layer 23 is formed on the spacer layer 22.

The lower electrode $24_{A1}$ is connected to a node $N_{11}$ and the lower electrode $24_{B2}$ is connected to a node $N_{12}$, where the nodes $N_{11}$ and $N_{12}$ are connection nodes used to establish electrical connections with the spin device elements $11_{A1}$ and $11_{B2}$. In other words, the lower electrode $24_{A1}$ functions as an interconnection which electrically connects the spin device element $11_{A1}$ to the node $N_{11}$ and the lower electrode $24_{B2}$ functions as an interconnection which electrically connects the spin device element $11_{B2}$ to the node $N_{12}$. The node $N_{11}$ is connected to the node $N_{bias1}$ and the node $N_{12}$ is connected to the switching element SW1. As described layer, the node $N_{bias1}$ is a bias node to which a bias voltage is applied in data writing and data reading.

The lower electrodes $24_{B1}$ and $24_{A2}$ are commonly connected to a node $N_{13}$. In other words, the lower electrodes $24_{B1}$ and $24_{A2}$ function as interconnections which electrically connect the spin device elements $11_{B1}$ and $11_{A2}$ to the node $N_{13}$. The node $N_{13}$ is a connection node which provides an electrical connection between the spin device elements $11_{B1}$ and $11_{A2}$.

An upper electrode $25_1$ is coupled with the upper surfaces of the spin device elements $11_{A1}$ and $11_{B1}$, and an upper electrode $25_2$ is coupled with the upper surfaces of the spin device elements $11_{A2}$ and $11_{B2}$. The upper electrode $25_1$, which functions as an interconnection which provides an electrical connection between the spin device elements $11_{A1}$ and $11_{B1}$, is a component corresponding to the node $N_1$ illustrated in FIG. 6. The upper electrode $25_2$, which functions as an interconnection which provides an electrical connection between the spin device elements $11_{A2}$ and $11_{B2}$, is a component corresponding to the node $N_2$ illustrated in FIG. 6.

The switching element SW1 connects the node $N_{12}$ to selected one of the nodes $N_{bias1}$ and $N_{bias3}$, where the node $N_{bias3}$ is a bias node which is kept at a predetermined voltage; in the present embodiment, the node $N_{bias3}$ is grounded. As described later, the node $N_{bias3}$ is used in write operations. The switching element SW2 electrically connects or disconnects the node $N_{13}$ to or from the node $N_{bias2}$, where the node $N_{bias2}$ is a bias node which kept at a predetermined voltage level; in the present embodiment, the node $N_{bias2}$ is grounded. As described later, the node $N_{bias2}$ is used in read operations. The switching elements SW1 and SW2 are used to switch the memory cell 1B between data writing and data reading. In data writing, the switching element SW1 is placed into a state in which the node $N_{12}$ is connected to the node $N_{bias3}$ (that is, the circuit ground), and the switching element SW2 is placed into the off-state. In data reading, on the other hand, the switching element SW1 is placed into a state in which the node $N_{12}$ is connected to the node $N_{bias1}$, and the switching element SW2 is placed into the on-state.

The memory cell 1B illustrated in FIG. 14A, similarly to the memory cell 1 illustrated in FIG. 6, is configured to store one-bit data, correlating one of the first and second states defined below with data "0" and the other with data "1":

First state: a state in which the spin device elements $11_{A1}$ and $11_{A2}$ are placed in the "low resistance" state and the spin device elements $11_{B1}$ and $11_{B2}$ are placed in the "high resistance" state, and Second state: a state in which the spin device elements $11_{A1}$ and $11_{A2}$ are placed in the "high resistance" state and the spin device elements $11_{B1}$ and $11_{B2}$ are placed in the "low resistance" state.

It should be noted that the spin device elements $11_{A1}$ and $11_{A2}$ are always placed in the same state, and the spin device elements $11_{B1}$ and $11_{B2}$ are always placed in the same state. It should be also noted that the state of the spin device elements $11_{A1}$ and $11_{A2}$ is always different from the state of the spin device elements $11_{B1}$ and $11_{B2}$.

In the configuration illustrated in FIG. 14A, the spin device elements $11_{A1}$, $11_{B1}$, $11_{A2}$ and $11_{B2}$ are serially connected in this order between the nodes $N_{11}$ and $N_{12}$. It should be noted that a connection between adjacent two spin device elements 11 is achieved by connecting the reference layers 21 of the adjacent two spin device elements 11 each other or by connecting the reference layers 23 of the adjacent two spin device elements 11 each other. In detail, the recording layers 23 of the spin device elements $11_{A1}$ and $11_{B1}$ are electrically connected to each other via the upper electrode $25_1$ and the recording layers 23 of the spin device elements $11_{B2}$ and $11_{A2}$ are electrically connected to each other via the upper electrode $25_2$. Furthermore, the reference layers 21 of the spin device elements $11_{B1}$ and $11_{A2}$ are electrically connected via the lower electrode $24_{B1}$, the node $N_{13}$ and the lower electrode $24_{A2}$.

As thus described, when a write current is caused to flow through the memory cell 1B, in which the reference layers 21 or recording layers 23 of adjacent two spin device elements 21 are connected to each other, the directions of the write currents flowing between the reference layers 21 and the recording layers 23 via the space layers 22 are different between the spin device elements $11_{A1}$ and $11_{B1}$. One of the spin device elements $11_{A1}$ and $11_{B1}$, in which the directions of the write currents are different, is placed into the "high resistance" state and the other is placed into the "low resistance" state, since the direction into which the magnetization is directed in the magnetization reversal based on the spin transfer torque depends on the direction of the write current. This discussion also applies to the spin device elements $11_{A2}$ and $11_{B2}$. The above-described electrical connections allow placing one of adjacent two spin device elements 11 into the "high resistance" state and the other into the "low resistance state".

Accordingly, the memory cell 1B, configured as described above, can be placed into the first or second state by causing a write current to flow between the node $N_{11}$ and $N_{12}$. When a write current which flows from the node $N_{11}$ to the node $N_{12}$ is generated, for example, the write current flows from the reference layer 21 to the recording layer 23 in the spin device elements $11_{A1}$ and $11_{A2}$, and the write current flows from the recording layer 23 to the reference layer 21 in the spin device elements $11_{B1}$ and $11_{B2}$. This allows placing the memory cell 1B into the first state. When a write current which flows from the node $N_{12}$ to the node $N_{11}$ is generated, on the other hand, the write current flows from the recording layer 23 to the reference layer 21 in the spin device elements $11_{A1}$ and $11_{A2}$, and the write current flows from the reference layer 21 to the recording layer 23 in the spin device elements $11_{B1}$ and $11_{B2}$. This allows placing the memory cell 1B into the second state described above.

Figure 14B:
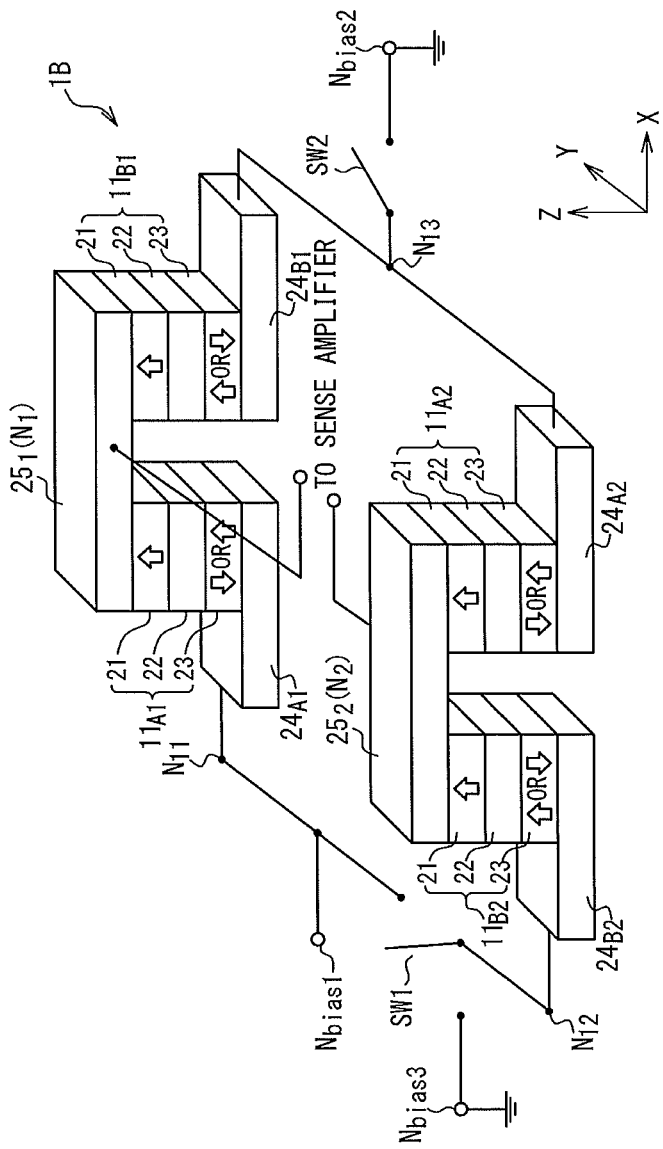

It should be noted that the positions of the reference layer 21 and the recording layer 23 may be exchanged in each of the spin device elements 11, as illustrated in FIG. 14B. Also in this case, with respect to every adjacent two spin device elements 11, the reference layers 21 of the adjacent two spin device elements 11 are connected to each other, or the recording layers 23 of the adjacent two spin device elements 11 are connected to each other. In detail, also in the configuration illustrated in FIG. 14B, the reference layers 21 of the spin device elements $11_{A1}$ and $11_{B1}$ are electrically connected to each other via the upper electrode $25_1$ and the reference layers 21 of the spin device elements $11_{A2}$ and $11_{B2}$ are electrically connected to each other via the upper electrode $25_2$. Furthermore, the recording layers 23 of the spin device elements $11_{B1}$ and $11_{A2}$ are electrically connected to each other via the lower electrode $24_{B1}$, the node $N_{13}$ and the lower electrode $24_{A2}$. A person skilled in the art would appreciate that the memory cell 1B illustrated in FIG. 14B can be also placed into the first or second state by feeding a write current flowing between the nodes $N_{11}$ and $N_{12}$.

Figure 14C:
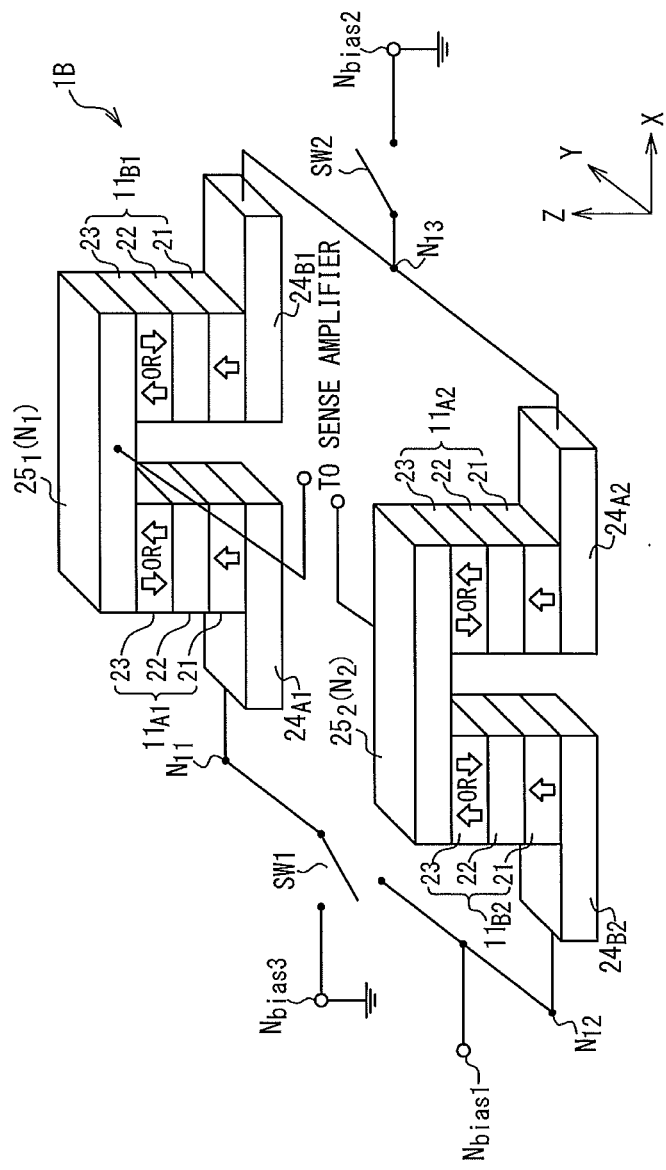
Figure 14D:
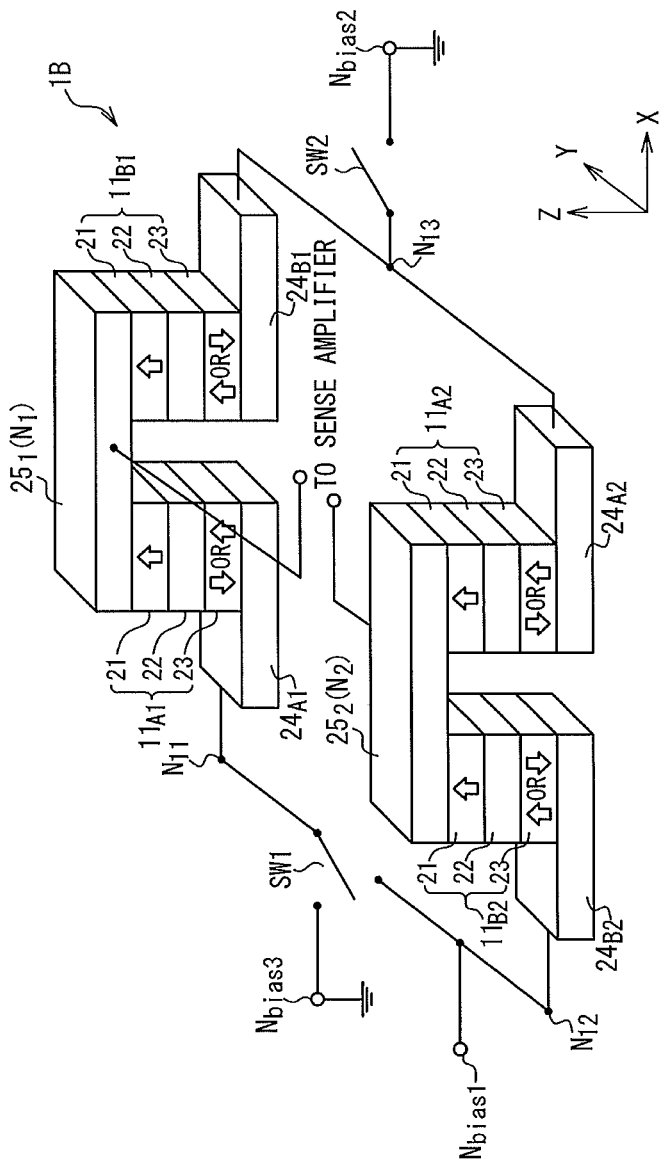

Although the memory cell 1B illustrated in FIG. 14A is configured so that the node $N_{11}$ is connected to the node $N_{bias1}$ and the switch element SW1 connects the node $N_{12}$ to selected one of the node $N_{bias1}$ and $N_{bias3}$, the memory cell 1B may be configured so that the node $N_{12}$ is connected to the node $N_{bias1}$ and the switch element SW1 connects the node $N_{11}$ to selected one of the node $N_{bias1}$ and $N_{bias3}$, as illustrated in FIG. 14C. Also in this case, the positions of the reference layer 21 and the recording layer 23 may be exchanged in each of the spin device elements 11 as illustrated in FIG. 14D.

Figure 14E:
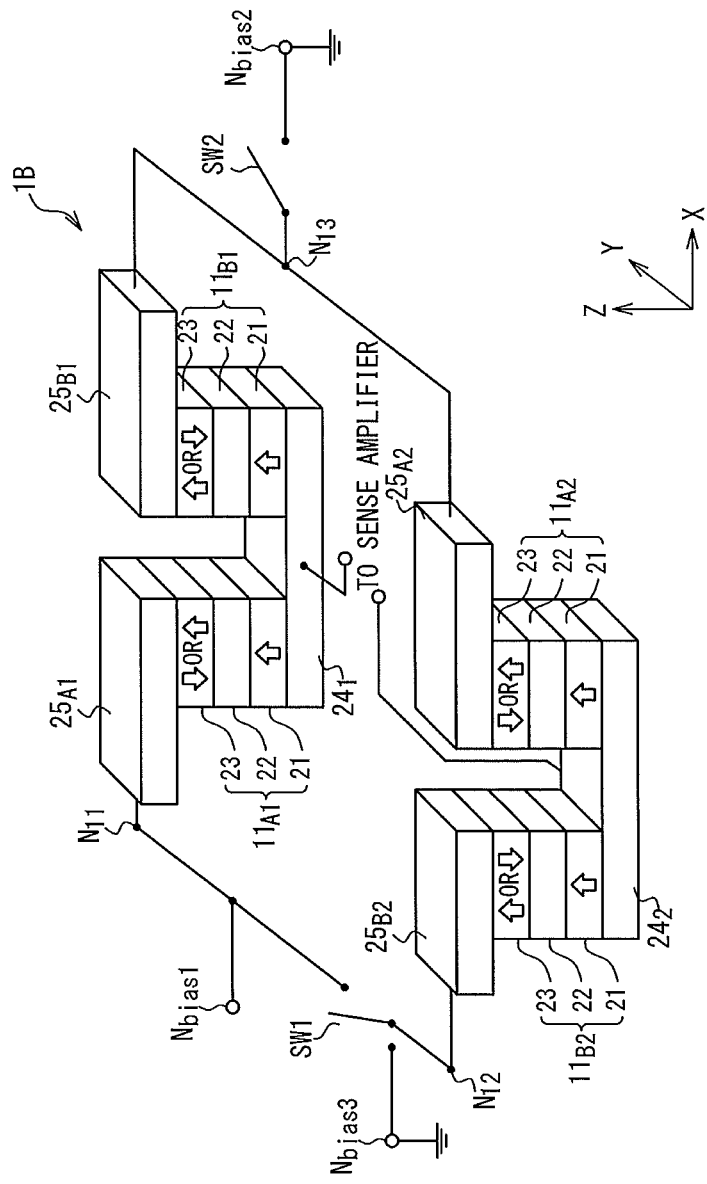

In an alternative embodiment, as illustrated in FIG. 14E, the memory cell 1B may be configured so that the spin device elements $11_{A1}$ and $11_{B1}$ are electrically connected to each other via a lower electrode $24_1$ and the spin device elements $11_{B2}$ and $11_{A2}$ are electrically connected to each other via a lower electrode $24_2$. In this case, an upper electrode $25_{A1}$ formed on the upper surface of the spin device element $11_{A1}$ is connected to the node $N_{11}$ is connected, and an upper electrode $25_{B2}$ formed on the upper surface of the spin device element $11_{B2}$ is connected to the node $N_{12}$. Also, upper electrodes $25_{B1}$ and $25_{A2}$ respectively formed on the upper surfaces of the spin device elements $11_{B1}$ and $11_{A2}$ are commonly connected to the node $N_{13}$. It should be noted that, also in this configuration, with respect to every adjacent two spin device elements 11, the reference layers 21 of the adjacent two spin device elements 11 are connected to each other, or the recording layers 23 of the adjacent two spin device elements 11 are connected with each other.

Figure 14F:
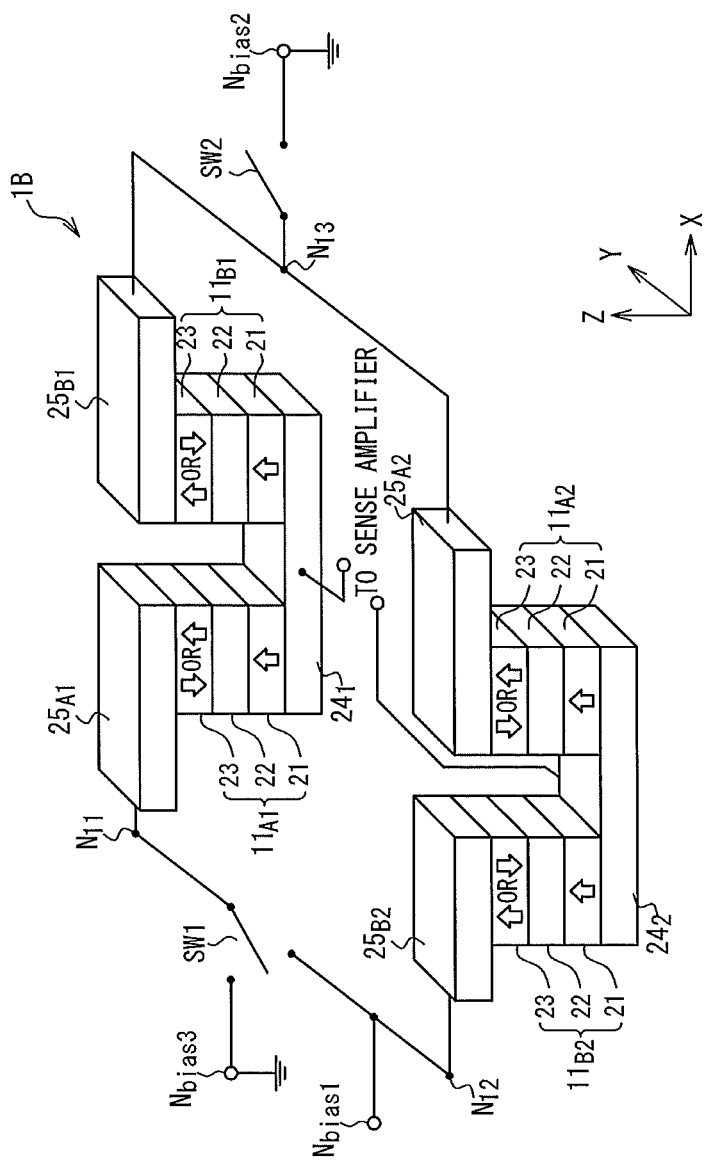

As illustrated in FIG. 14F, the memory cell 1B may be configured so that the node $N_{12}$ is connected to the node $N_{bias1}$ and the switching element SW1 connects the node $N_{11}$ to selected one of the nodes $N_{bias1}$ and $N_{bias3}$, also in the case when the spin device elements $11_{A1}$ and $11_{B1}$ are electrically connected to each other via the lower electrode $24_1$ and the spin device elements $11_{B2}$ and $11_{A2}$ are electrically connected to each other via the lower electrode $24_2$. It should be noted that the positions of the reference layer 21 and the recording layer 23 may be exchanged in each spin device element 11, also in the configurations illustrated in FIGS. 14E and 14F.

Figure 15A:
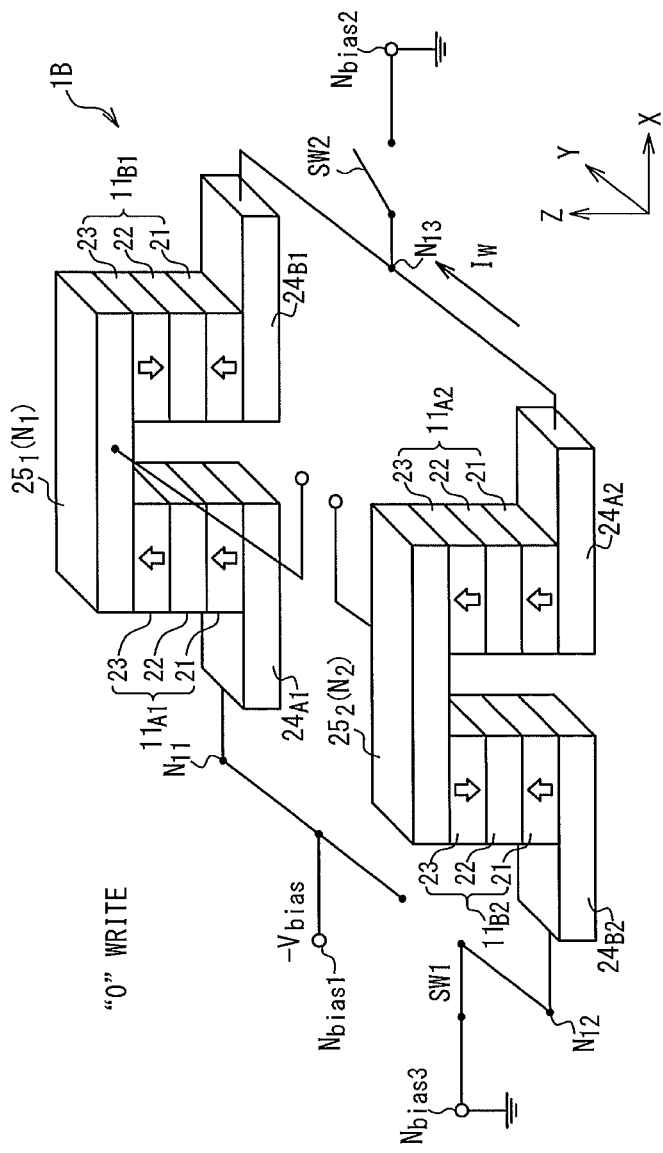
FIGS. 15A and 15B are diagrams illustrating data writing into the memory cell illustrated in FIG. 14A.
Figure 15B:
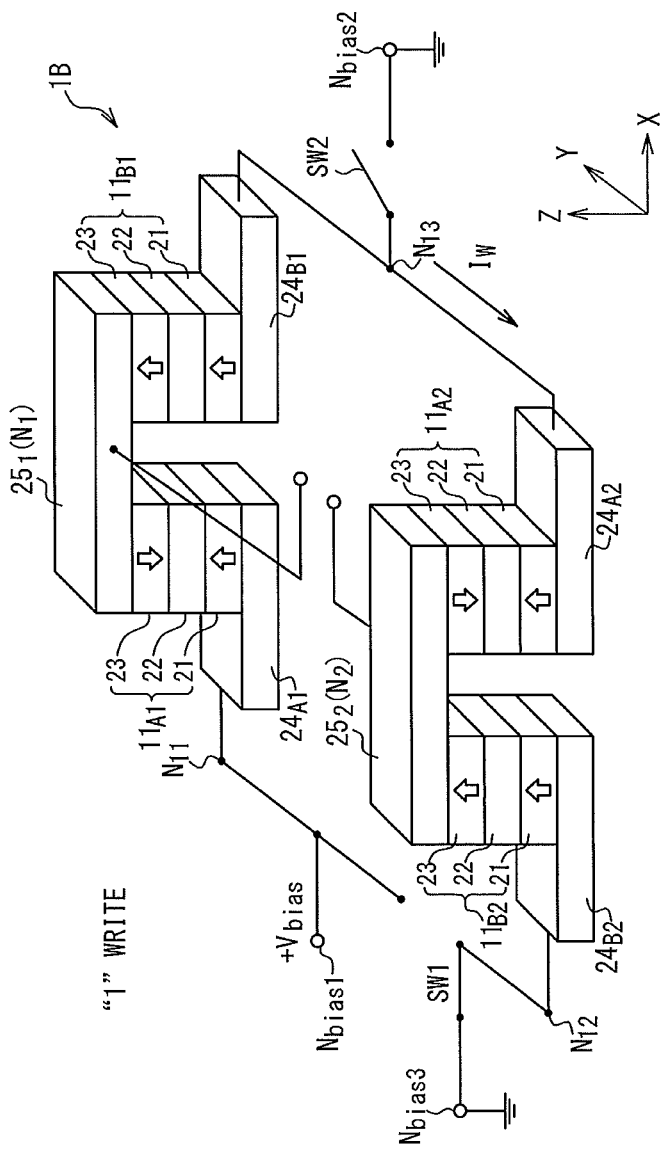

Next, a description is given of data writing and reading into and from the memory cell 1B illustrated in FIG. 14A. FIGS. 15A and 15B illustrate data writing into the memory cell 1B illustrated in FIG. 14A. It should be noted that FIGS. 15A and 15B illustrates a write operation in the case when the first state is correlated with data "0" and the second state is correlated with data "1". As described above, the first state is the state in which the spin device elements $11_{A1}$ and $11_{A2}$ are placed in the "low resistance state" and the spin device elements $11_{B1}$ and $11_{B2}$ are placed in the "high resistance" state" and the second state is the state in which the spin device elements $11_{A1}$ and $11_{A2}$ are placed in the "high resistance" state and the spin device elements $11_{B1}$ and $11_{B2}$ are placed in the "low resistance" state.

In data writing, the switching element SW1 is placed into the state in which the node $N_{12}$ is connected to the node $N_{bias3}$ and the switching element SW2 is placed into the off-state. Furthermore, a bias voltage depending on write data is applied to the node $N_{bias1}$ to generate a write current $I_W$ which flows between the nodes $N_{11}$ and $N_{12}$.

In detail, to write data "0", as illustrated in FIG. 15A, a bias voltage lower than the voltage on the node $N_{bias3}$ is applied to the node $N_{bias1}$. In the present embodiment, in which the node $N_{bias3}$ is grounded, a negative bias voltage $-V_{bias}$ is applied to the node $N_{bias1}$. This allows the write current to flow from the node $N_{12}$ to the node $N_{11}$, resulting in that the magnetizations of the reference layer 21 and the reference layer 23 are directed in "parallel" in each of the spin device elements $11_{A1}$ and $11_{A2}$ and directed in "antiparallel" in each of the spin device elements $11_{B1}$ and $11_{B2}$. This operation places the memory cell 1B into the first state, in which the spin device elements $11_{A1}$ and $11_{A2}$ are placed in the "low resistance" state and the spin device elements $11_{B1}$ and $11_{B2}$ are placed in the "high resistance" state. It should be noted that a pair of the "low resistance" state and the "high resistance" state is generated in this operation, because the write current flows in different directions in the adjacent spin device elements $11_{A1}$ and $11_{B1}$. The same applies to the spin device elements $11_{A2}$ and $11_{B2}$.

To write data "1", on the other hand, as illustrated in FIG. 15B, a bias voltage higher than the voltage on the node $N_{bias3}$ is applied to the node $N_{bias1}$. In the present embodiment, in which the node $N_{bias3}$ is grounded, a positive bias voltage $+V_{bias}$ is applied to the node $N_{bias1}$. This allows the write current to flow from the node $N_{11}$ to the node $N_{12}$, resulting in that the magnetizations of the reference layer 21 and the reference layer 23 are directed in "antiparallel" in each of the spin device elements $11_{A1}$ and $11_{A2}$ and directed in "parallel" in each of the spin device elements $11_{B1}$ and $11_{B2}$. This operation places the memory cell 1B into the second state, in which the spin device elements $11_{A1}$ and $11_{A2}$ are placed in the "high resistance" state and the spin device elements $11_{B1}$ and $11_{B2}$ are placed in the "low resistance" state.

Figure 16A:
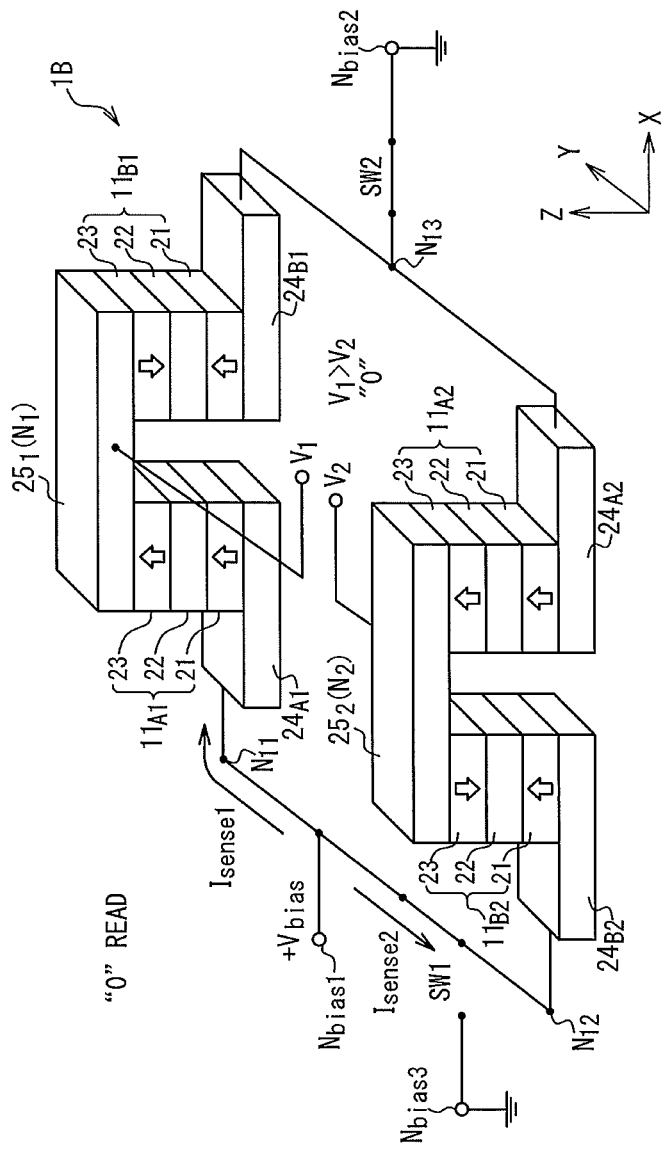
FIGS. 16A and 16B are diagrams illustrating data reading from the memory cell illustrated in FIG. 14A.
Figure 16B:
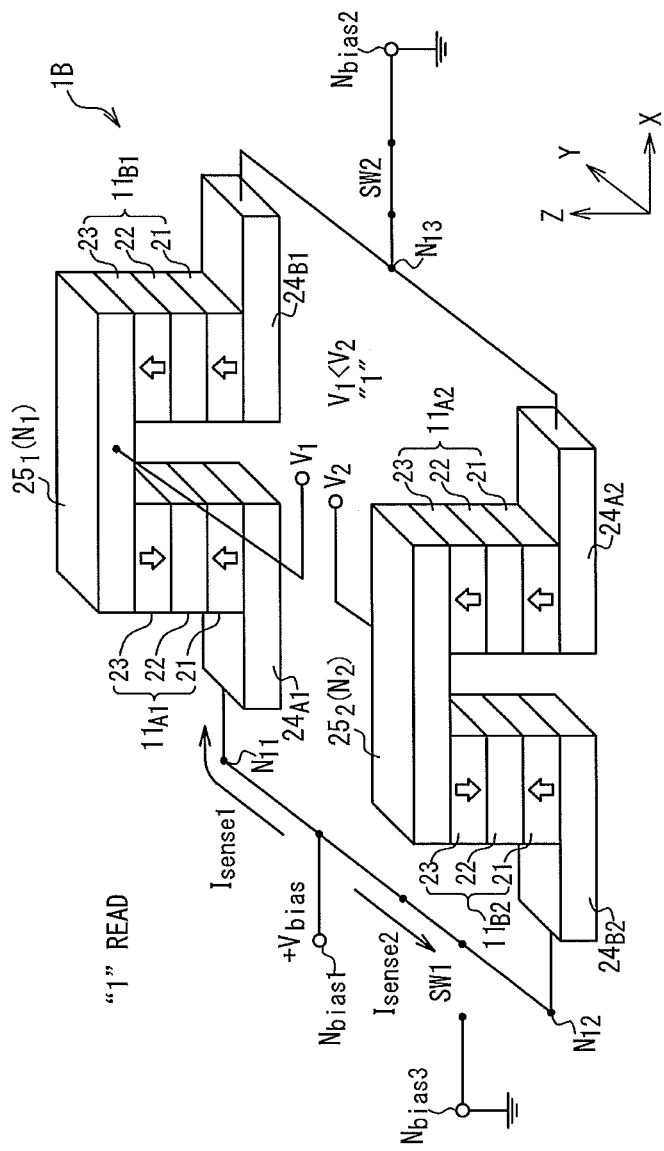

FIGS. 16A and 16B illustrates data reading from the memory cell 1B illustrated in FIG. 14A. In data reading, the switching element SW1 is placed into a state in which the node $N_{12}$ is connected to the node $N_{bias1}$, and the switching element SW2 is placed into the on-state. Furthermore, a bias voltage higher than the voltage on the node $N_{bias2}$ is applied to the node $N_{bias1}$. In the present embodiment, in which the node $N_{bias2}$ is grounded, a positive bias voltage $+V_{bias}$ is applied to the node $N_{bias1}$. This operation generates a read current $I_{sense1}$ flowing through the spin device elements $11_{A1}$ and $11_{B1}$ and a read current $I_{sense2}$ flowing through the spin device elements $11_{B2}$ and $11_{A2}$. The read currents $I_{sense1}$ and $I_{sense2}$ generate a voltage $V_1$ on the upper electrode $25_1$, which corresponds to the node $N_1$, and a voltage $V_2$ on the upper electrode $25_2$, which corresponds to the node $N_2$.

The data stored in the memory cell 1B is identified in the same way as the memory cell 1 illustrated in FIG. 6. When the voltage $V_1$ generated on the upper electrode $25_1$ is higher than the voltage $V_2$ generated on the upper electrode $25_2$, as illustrated in FIG. 16A, the data stored in the memory cell 1B is identified as data "0", because the spin device elements $11_{A1}$ and $11_{A2}$ are placed in the "low resistance" state and the spin device elements $11_{B1}$ and $11_{B2}$ are placed in the "high resistance" state. When the voltage $V_2$ generated on the upper electrode $25_2$ is higher than the voltage $V_1$ generated on the upper electrode $25_1$, as illustrated in FIG. 16B, the data stored in the memory cell 1B is identified as data "1", because the spin device elements $11_{A1}$ and $11_{A2}$ are placed in the "high resistance" state and the spin device elements $11_{B1}$ and $11_{B2}$ are placed in the "low resistance" state.

Data reading and data writing can be similarly achieved when the configurations illustrated in FIGS. 14B to 14F are used instead. In data writing, the switching element SW1 is placed into the state in which the node $N_{11}$ or $N_{12}$ is connected to the node $N_{bias3}$ (that is, the circuit ground) and the switching element SW2 is placed into the off-state. Furthermore, a bias voltage depending on write data is applied to the node $N_{bias1}$ to generate a write current $I_W$ which flows between the nodes $N_{11}$ and $N_{12}$. In data reading, the switching element SW1 is placed into a state in which the node $N_{11}$ or $N_{12}$ is connected to the node $N_{bias1}$, and the switching element SW2 is placed into the on-state.

Figure 17A:
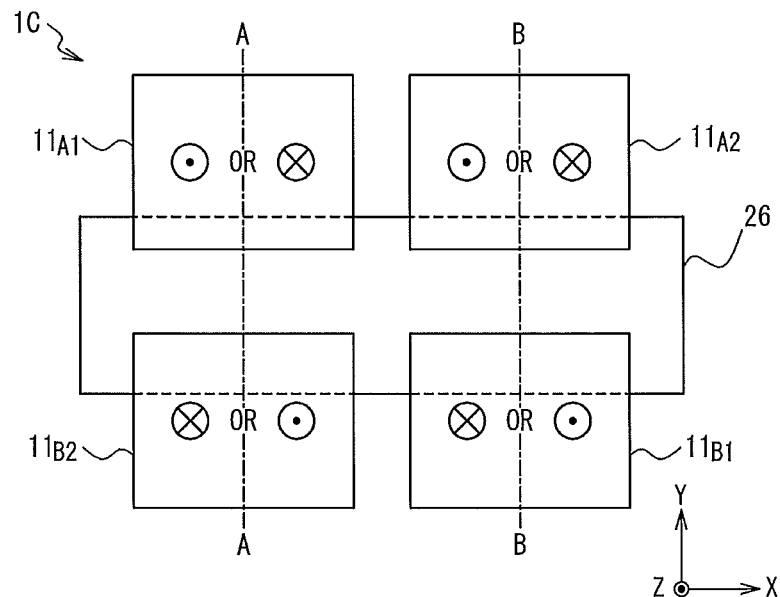
FIG. 17A is a plan view illustrating one example of the configuration of a memory cell in the case when a magnetic memory is configured to achieve data writing with a current-induced magnetic field.
Figure 17B:
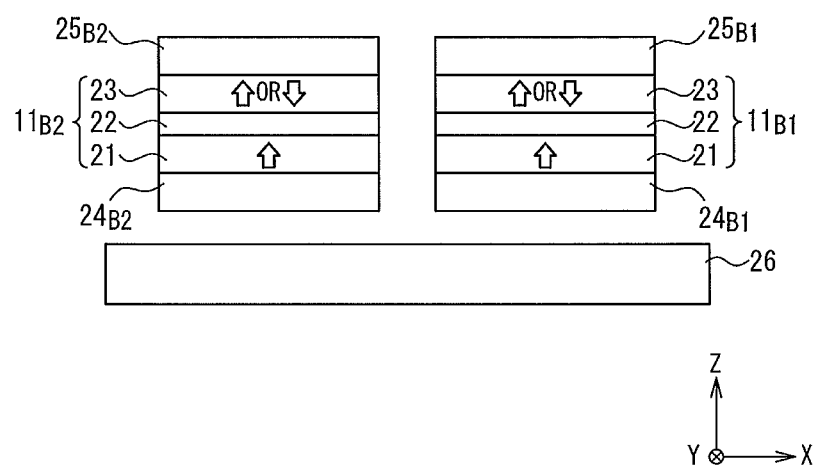
FIG. 17B is a side view illustrating the configuration of the memory cell illustrated in FIG. 17A.

FIG. 17A is a plan view illustrating one example of the configuration of a memory cell 10 in the case when the magnetic memory 10 in the present embodiment is configured to achieve data writing with a current-induced magnetic field, and FIG. 17B is a side view illustrating the configuration of the memory cell 10. Also in the configuration illustrated in FIG. 17A, the memory cell 10 includes four spin device elements $11_{A1}$, $11_{A2}$, $11_{B1}$ and $11_{B2}$. When data writing is achieved with a current-induced magnetic field, a write current line 26 is additionally provided close to each memory cell 1C. The write current line 26 is disposed to extend in the X-axis direction. The spin device elements $11_{A1}$ and $11_{A2}$ are positioned opposed to the spin device elements $11_{B1}$ and $11_{B2}$ across the write current line 26. More specifically, the spin device elements $11_{A1}$ and $11_{A2}$ are positioned shifted in the +Y direction (a first direction) from the write current line 26 and the spin device elements $11_{B1}$ and $11_{B2}$ are positioned shifted in the −Y direction (a second direction opposite to the first direction) from the write current line 26. This arrangement allows generating such a magnetic field that the magnetizations of the recoding layers 23 of the spin device elements $11_{A1}$ and $11_{A2}$ and those of the recoding layers 23 of the spin device elements $11_{B1}$ and $11_{B2}$ are directed in opposite directions, by using only one write current line 26. Note that the spin device element $11_{A2}$ is positioned shifted from the spin device element $11_{A1}$ in the +X direction, and the spin device element $11_{B1}$ is positioned shifted from the spin device element $11_{B2}$ in the +X direction.

Figure 17C:
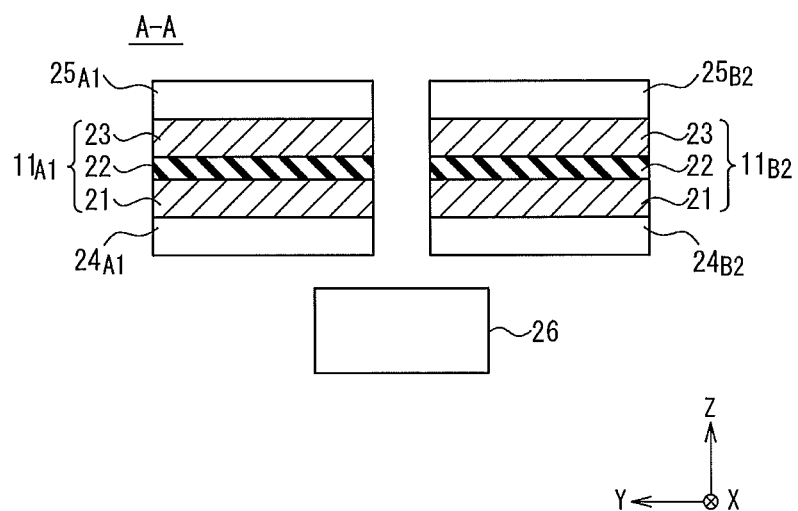
FIG. 17C is a cross-sectional view illustrating the structure of the memory cell on section A-A indicated in FIG. 17A.
Figure 17D:
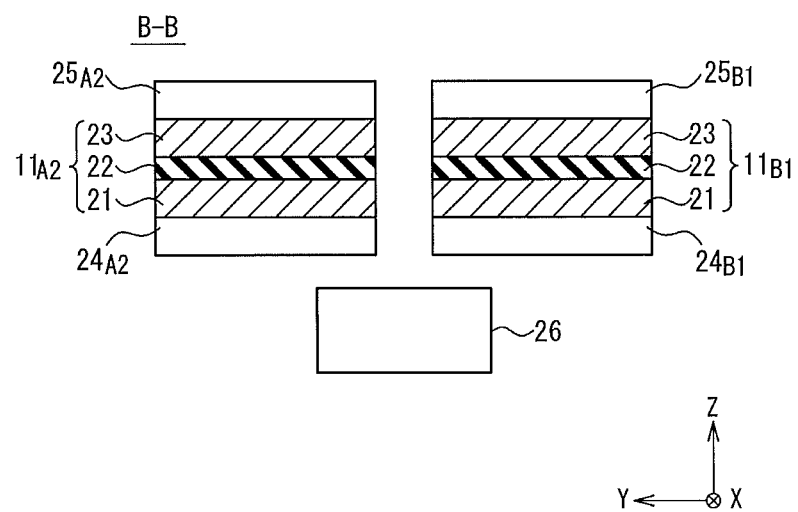
FIG. 17D is a cross-sectional view illustrating the structure of the memory cell on section B-B indicated in FIG. 17A.

FIGS. 17C and 17D are cross-sectional views illustrating the structure of the memory cell 10 on sections A-A and B-B indicated in FIG. 17A, respectively. As illustrated in FIGS. 17C and 17D, the spin device elements $11_{A1}$ and $11_{A2}$ are formed on the upper surfaces of the lower electrodes $24_{A1}$ and $24_{A2}$, respectively, and the spin device elements $11_{B1}$ and $11_{B2}$ are formed on the upper surfaces of the lower electrodes $24_{B1}$ and $24_{B2}$, respectively. In detail, the reference layers 21 of the spin device elements $11_{A1}$, $11_{A2}$, $11_{B1}$ and $11_{B2}$ are formed on the upper surfaces of the lower electrodes $24_{A1}$, $24_{A2}$, $24_{B1}$ and $24_{B2}$, respectively. In each of the spin device elements $11_{A1}$, $11_{A2}$, $11_{B1}$ and $11_{B2}$, the spacer layer 22 is formed on the upper surface of the reference layer 21, and the recording layer 23 is formed on the upper surface of the spacer layer 22. The upper electrodes $25_{A1}$, $25_{A2}$, $25_{B1}$ and $25_{B2}$ are formed on the upper surfaces of the recording layers 23 of the spin device elements $11_{A1}$, $11_{A2}$, $11_{B1}$ and $11_{B2}$, respectively.

Data writing into the memory cell 1C illustrated in FIGS. 17A to 17D can be achieved by generating a current-induced magnetic field with a write current Iw flowing through the write current line 26. The direction of the write current Iw is determined depending on data to be written into the memory cell 1C.

Discussed below is the case when a first state is correlated with data "0" and a second state is correlated with data "1", where the first state is a state in which the spin device elements $11_{A1}$ and $11_{A2}$ are placed in the "low resistance" state and the spin device elements $11_{B1}$ and $11_{B2}$ are placed in the "high resistance" state and the second state is a state in which the spin device elements $11_{A1}$ and $11_{A2}$ are placed in the "high resistance" state and the spin device elements $11_{B1}$ and $11_{B2}$ are placed in the "low resistance" state.

Figure 18A:
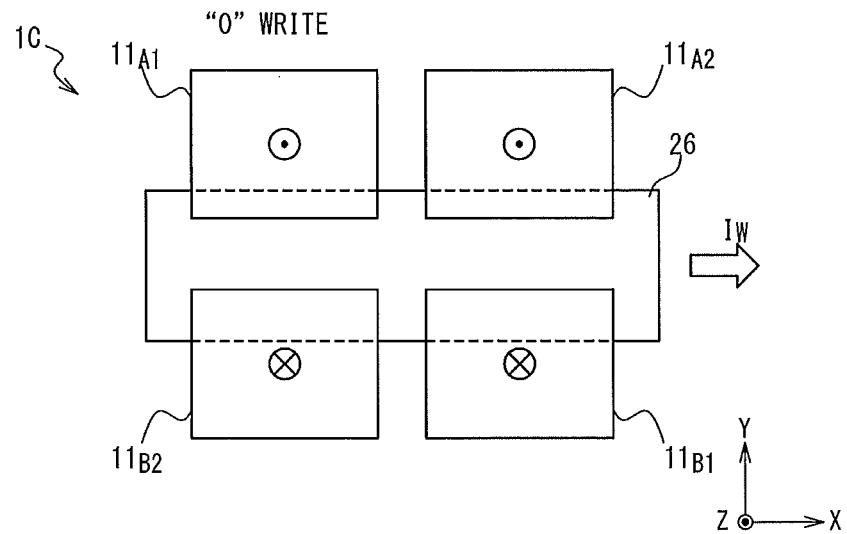
FIGS. 18A and 18B illustrate data writing into the memory cell illustrated in FIG. 17A.

To write data "0", as illustrated in FIG. 18A, a write current Iw is generated which flows through the write current line 26 in the +X direction. When the write current Iw flows in the +X direction, a current-induced magnetic field having a +Z component is applied to the recording layers 23 of the spin device elements $11_{A1}$ and $11_{A2}$ and a current-induced magnetic field having a −Z component is applied to the recording layers 23 of the spin device elements $11_{B1}$ and $11_{B2}$. This allows directing the magnetizations of the recording layers 23 of the spin device elements $11_{A1}$ and $11_{A2}$ in the +Z direction to place the spin device elements $11_{A1}$ and $11_{A2}$ into the "low resistance" state and directing the magnetizations of the recording layers 23 of the spin device elements $11_{B1}$ and $11_{B2}$ in the −Z direction to place the spin device elements $11_{B1}$ and $11_{B2}$ into the "high resistance" state. As thus described, data "0" can be written into the memory cell 1C by feeding a write current Iw flowing in the +X direction.

Figure 18B:
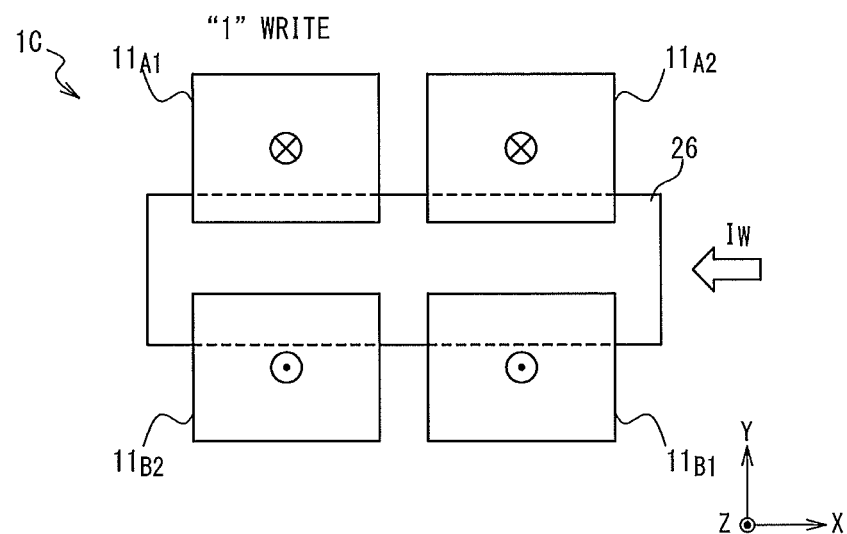

To write data "1", on the other hand, as illustrated in FIG. 18B, a write current Iw is generated which flows through the write current line 26 in the −X direction. When the write current Iw flows in the −X direction a current-induced magnetic field having a −Z component is applied to the recording layers 23 of the spin device elements $11_{A1}$ and $11_{A2}$ and a current-induced magnetic field having a +Z component is applied to the recording layers 23 of the spin device elements $11_{B1}$ and $11_{B2}$. This allows directing the magnetizations of the recording layers 23 of the spin device elements $11_{A1}$ and $11_{A2}$ in the −Z direction to place the spin device elements $11_{A1}$ and $11_{A2}$ into the "high resistance" state and directing the magnetizations of the recording layers 23 of the spin device elements $11_{B1}$ and $11_{B2}$ in the +Z direction to place the spin device elements $11_{B1}$ and $11_{B2}$ into the "low resistance" state. As thus described, data "1" can be written into the memory cell 1C by generating a write current Iw flowing in the −X direction.

Figure 19:
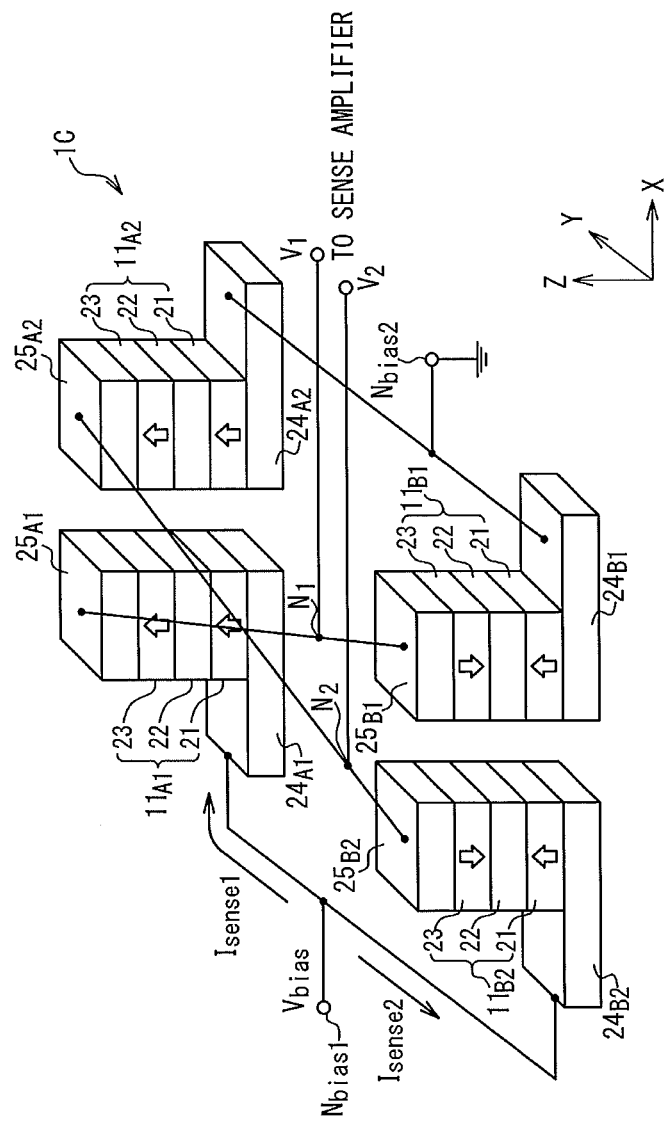
FIG. 19 is a conceptual diagram illustrating electrical connections among spin device elements in a memory cell and data reading from the memory cell, in the case when the magnetic memory is configured to achieve data writing with a current-induced magnetic field.

FIG. 19 is a perspective view conceptually illustrating electrical connections among the spin device elements $11_{A1}$, $11_{A2}$, $11_{B1}$ and $11_{B2}$ in the memory cell 1C for achieving data reading. The electrical connections among the spin device elements $11_{A1}$, $11_{A2}$, $11_{B1}$ and $11_{B2}$ in the memory cell 1C are similar to those in the memory cell 1 illustrated in FIG. 6.

In detail, the lower electrode $24_{A1}$ and $24_{B2}$, which are coupled with the spin device elements $11_{A1}$ and $11_{B2}$, respectively, are connected to the node $N_{bias1}$ and the lower electrode $24_{A2}$ and $24_{B1}$, which are coupled with the spin device elements $11_{A2}$ and $11_{B1}$, respectively, are connected to the node $N_{bias2}$. The upper electrode $24_{A1}$ and $24_{B1}$, which are connected coupled with the spin device elements $11_{A1}$ and $11_{B1}$, respectively, are commonly connected to the node $N_1$, and the upper electrode $24_{B2}$ and $24_{A2}$, which are coupled with the spin device elements $11_{A2}$ and $11_{B2}$, respectively, are commonly connected to the node $N_2$.

Data reading from the memory cell 1C is achieved by comparing the voltages $V_1$ and $V_2$ generated on the nodes $N_1$ and $N_2$ by using a sense amplifier 12, in the state in which a voltage higher that the voltage on the node $N_{bias2}$ is applied to the node $N_{bias1}$. In the read operation illustrated in FIG. 19, a positive bias voltage +$V_{bias}$ is applied to the node $N_{bias1}$ with the node $N_{bias2}$ grounded. When the positive bias voltage +$V_{bias}$ is applied to the node $N_{bias1}$, a read current $I_{sense1}$ flowing through the spin device elements $11_{A1}$ and $11_{B1}$ and a read current $I_{sense2}$ flowing through the spin device elements $11_{A2}$ and $11_{B2}$ are generated and the voltages $V_1$ and $V_2$ are generated by the read currents $I_{sense1}$ and $I_{sense2}$ on the nodes $N_1$ and $N_2$, respectively. When the first state is correlated with data "0" and the second state is correlated with data "1", for example, the data stored in the memory cell 1 is identified as data "0" if the voltage $V_1$ is higher than voltage $V_2$ and as data "1" if the voltage $V_1$ is lower than voltage $V_2$.

(Integration of Spin Device Element on Deformable Base Plate)

One known issue in commercialization of magnetic memories is a difficulty in concurrently satisfying these three requirements: data read sensitivity, data stability and data write power (electric power consumed in a data writing operation). This issue involves three types of conflicts. When the MR (magnetoresistance) ratio is increased to improve the data read sensitivity and to thereby reduce the error rate in read operations, for instance, this makes it difficult to reduce the data write power required for generating a spin transfer torque. The opposite also applies. As for the relation between the data write power and data stability, the data stability increases proportionally with the magnetic anisotropy energy KuV (where Ku is the magnetic anisotropy constant and V is the volume) while the data write power also increases proportionally with the magnetic anisotropy energy KuV. Accordingly, the improvement in the data stability inevitably increases the data write power. As thus discussed, although it is possible to individually satisfy each of the above-described three requirements with the current technologies, it is difficult to satisfy the three requirements at the same time with the current technologies, due to the trade-off relationship. If a conflict between two of the three above-described requirements is resolved, this would effectively contribute commercialization of magnetic memories.

To address the above-described trade-off relationship, as one approach to relieve a conflict between the data stability and data write power in a magnetic memory, the inventor has been studying a technique in which spin device elements of a memory cell are integrated on a deformable base plate and a bending mechanism which bends the deformable base plate is also integrated. Further details are disclosed in U.S. patent application Ser. No. 14/728,651, filed on Jun. 2, 2015, the disclosure of which is incorporated herein by reference. A mechanism which uses a piezoelectric effect or a mechanism which uses a force exerted between a pair of capacitor electrodes may be used as the bending mechanism to bend the deformable base plate.

In a magnetic memory thus configured, a mechanical stress is applied to each spin device element when the deformable base plate is bent and this stress generates a strain in each spin device element. When the strain is generated in each spin device element, the magnetization direction of the recording layer of each spin device element is tilted from the original magnetization direction, which is determined depending on the magnetic anisotropy of the recording layer, due to a magnetostrictive effect. The magnetostrictive effect is knowns as a phenomenon in which the strain of a magnetic body varies depending on the magnetization status and the magnetization status of a magnetic body varies depending on the strain applied to the magnetic body. Strictly, the latter effect should be referred to as an inverse magnetostrictive effect; however, these effects are collectively referred to as the magnetostrictive effect in the present application, since the magnetostrictive effect in the broad sense usually means to encompass both of the magnetostrictive effect and inverse magnetostrictive effect in the narrow sense. The magnetization of a recording layer is easily reversed in the state in which the magnetization direction of the recording layer is tilted from the original magnetization direction of the recording layer. By making use of this phenomenon, it is possible to achieve data writing with a reduced data write power, even if the recording layer of each spin device element is formed of material superior in the data stability. In the following, a description is given of embodiments in which spin device elements forming a memory cell are integrated on a deformable base plate.

Figure 20:
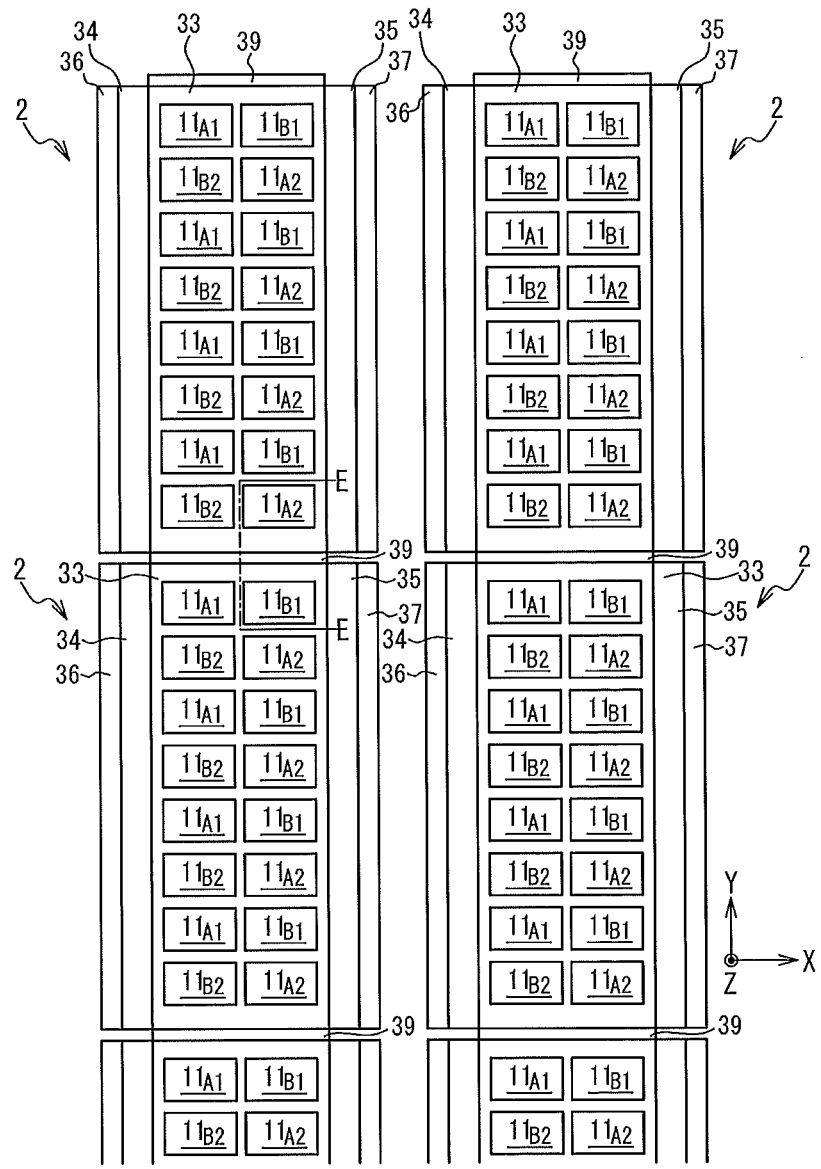
FIG. 20 is a plan view illustrating an example of the configuration of a memory cell array of a magnetic memory in which spin device elements are integrated on a deformable base plate in one embodiment.
Figure 21:
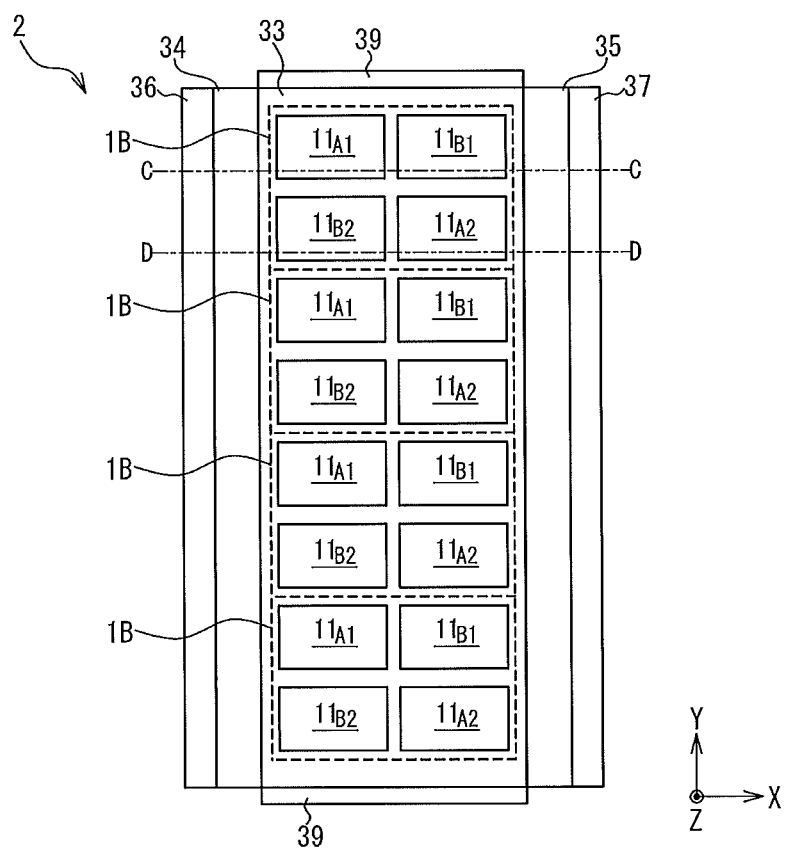
FIG. 21 is a plan view illustrating the structure of each block of the memory cell array illustrated in FIG. 20.

FIG. 20 is a plan view illustrating an example of the configuration of a memory cell array of a magnetic memory in one embodiment, and FIG. 21 is a plan view illustrating the configuration of each block of the memory cell array illustrated in FIG. 20. Note that a block is one unit structure of the memory cell array and each block includes a plurality of memory cells as described later. FIGS. 20 and 21 conceptually illustrate the configuration of the memory cell array and that of each block in the case when the magnetic memory of the present embodiment is configured as an STT-MRAM.

As illustrated in FIG. 20, the memory cell array includes blocks 2 arranged in rows and columns in the present embodiment. As illustrated in FIG. 21, each block 2 includes a plurality of memory cells 1B. In the structure illustrated in FIGS. 20 and 21, each block 2 includes four memory cells 1B. The configuration of each memory cell 1B is basically similar to that illustrated in any of FIGS. 14A to 14F, and therefore the memory cells included in each block 2 are denoted by the same reference numeral "1B".

Figure 23:
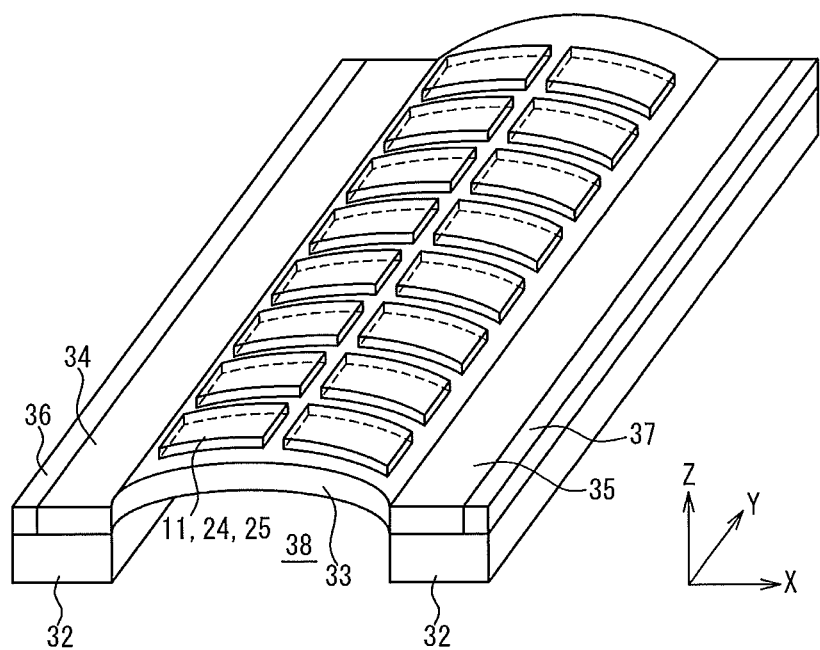
FIG. 23 is a perspective view illustrating the structure of each block.

FIG. 22A is a cross-sectional view illustrating the structure of each block 2 on section C-C indicated in FIG. 21, FIG. 22B is a cross-sectional view illustrating the structure of each block 2 on section D-D indicated in FIG. 21, and FIG. 23 is a perspective view illustrating the configuration of each block 2. As illustrated in FIGS. 22A and 22B, each block 2 includes a deformable base plate 33. The deformable base plate 33 is configured to be deformable so that the deformable base plate 33 can be bent. The deformable base plate 33 may be formed of silicon, silicon oxide, silicon nitride, silicon oxynitride or the like. Materials and processes used in a SON (Si-on-nothing) technology may be used for the formation of the deformable base plate 33. The deformable base plate 33 preferably has a thickness of 200 nm to 5 μm, for example.

The lower electrodes $24_{A1}$, $24_{A2}$, $24_{B1}$ and $24_{B2}$ are formed on the upper surface of the deformable base plate 33 and the spin device elements $11_{A1}$, $11_{A2}$, $11_{B1}$ and $11_{B2}$ are formed on the upper surfaces of the lower electrodes $24_{A1}$, $24_{A2}$, $24_{B1}$ and $24_{B2}$, respectively. The upper electrodes $25_{A1}$, $25_{A2}$, $25_{B1}$ and $25_{B2}$ are formed on the upper surfaces of the spin device elements $11_{A1}$, $11_{A2}$, $11_{B1}$ and $11_{B2}$, respectively. The upper electrodes $25_{A1}$ and $25_{B1}$ are electrically connected to each other via an interconnection and, the upper electrodes $25_{B2}$ and $25_{A2}$ are electrically connected to each other via an interconnection. It would be understood that such electrical connections correspond to the configuration in which the upper electrode $25_1$ is coupled with the upper surfaces of the spin device elements $11_{A1}$ and $11_{B1}$ and the upper electrode $25_2$ is coupled with the upper surfaces of the spin device elements $11_{B2}$ and $11_{A2}$, as illustrated in FIGS. 14A to 14F.

Piezoelectric layers 34 and 35 are coupled with both of the side surfaces (the surfaces facing the X-axis directions) of the deformable base plate 33. The piezoelectric layers 34 and 35 are formed of piezoelectric material, such as AlN, lead zirconate titanate (PZT) and zirconium oxide ($ZrO_x$). As described later, the deformable base plate 33 is bent by using a piezoelectric effect occurring in the piezoelectric layers 34 and 35. The piezoelectric layers 34 and 35 are coupled and fixed on the upper surface of a fixture base 32. The fixture base 32 is coupled with the upper surface of a semiconductor substrate 31 in which a transistor circuit are integrated.

Electrode layers 36 and 37 are coupled with the surfaces of the piezoelectric layers 34 and 35 opposing to the surfaces coupled to the side surfaces of the deformable base plate 33. An additional electrode layer (not illustrated) on which a potential difference is generated with respect to the electrode layer 36 may be coupled with the piezoelectric layer 34. Similarly, an additional electrode layer (not illustrated) on which a potential difference is generated with respect to the electrode layer 37 may be coupled with the piezoelectric layer 35. Although the additional electrode layers on which potential differences are respectively generated with respect to the electrode layers 36 and 37 are not illustrated in FIGS. 22A and 22B, the additional electrode layers may be also used as the lower electrodes 24 connected to the spin device elements 11 or other electrodes.

In the present embodiment, the deformable base plate 33 is formed so that at least one of the lower surface (that is, the surface opposed to the surface on which the spin device elements 11 are formed) and the upper surface (that is, the surface on which the spin device elements 11 are formed) of the deformable base plate 33 faces a "space which is not filled with solid substance". The "space which is not filled with solid substance" referred to herein may be filled with fluid, including gas (such as air, nitrogen) and liquid. Alternatively, the "space which is not filled with solid substance" may be vacuumed. The structure in which at least one of the lower and upper surfaces of the deformable base plate 33 faces the "space which is not filled with solid substance" allows the deformable base plate 33 to be deformed with a sufficiently large displacement. This is effective for generating a sufficiently-large strain, that is, a magnetostrictive effect in the recording layer 23 of each spin device element 11.

Figure 24:
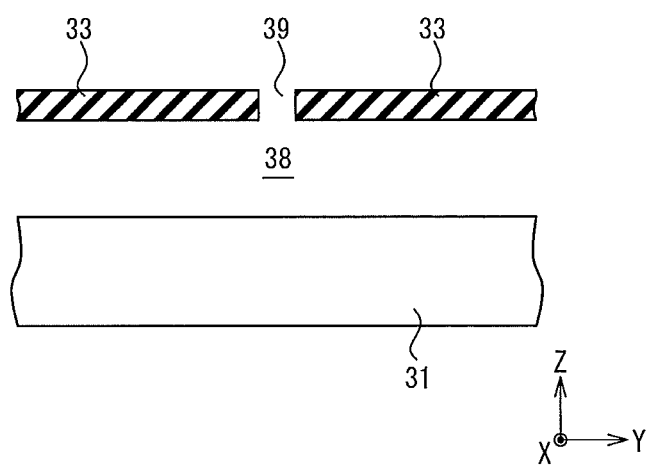
FIG. 24 is a cross-sectional view illustrating the structure of the memory cell array on section E-E indicated in FIG. 20.

Referring back to FIG. 20, every two deformable base plates 33 of the blocks 2 adjacent to each other in the Y-axis direction are separated by a gap 39 in the present embodiment. The gap 39 is a space which is not filled with solid substance, as is the case with the space 38. FIG. 24 is a cross-sectional view schematically illustrating the structure on section E-E indicated in FIG. 20. Two deformable base plates 33 adjacent to each other in the Y-axis direction are opposed across the gap 39. The gap 39 is formed to communicate with the space 38. In this structure, two deformable base plates 33 adjacent to each other in the Y-axis direction are mechanically separated and this allows individually bending two deformable base plates 33 adjacent to each other in the Y-axis direction.

In the magnetic memory thus structured, the deformable base plate 33 can be bent by applying electric fields to the piezoelectric layers 34 and 35 with electrode layers coupled with the piezoelectric layers 34 and 35 (the electrode layers 36, 37 and the additional electrode layers (not illustrated)). More specifically, when electric fields are applied to the piezoelectric layers 34 and 35, strains are generated in the piezoelectric layers 34 and 35 due to the piezoelectric effect. A force is applied to the deformable base plate 33 due to the strains of the piezoelectric layers 34 and 35, and thereby the deformable base plate 33 is bent. The conflict between the data stability and data write power is effectively relieved by feeding to the spin device elements 11 a write current Iw in the state in which the deformable base plate 33 is bent.

It should be also noted that substantially no current is generated (other than a leakage current and a temporary charging current) to bend the deformable base plate 33 in the structure of the magnetic memory illustrated in FIGS. 20 to 24 in the present embodiment. In the structure of the magnetic memory illustrated in FIGS. 20 to 24, in which a piezoelectric effect is used to bend the deformable base plate 33, it is not necessary to feed a current to bend the deformable base plate 33. This is advantageous for reducing the data write power (electric power consumed in a data writing operation).

FIG. 25A to FIG. 25D are cross-sectional views illustrating an exemplary data write procedure into a memory cell 1B of the memory cell array illustrated in FIGS. 20 to 24. FIG. 25A illustrates the initial state of a selected memory sell 1B into which a data is to be written. In FIG. 25A, the states of only the spin device elements $11_{A1}$ and $11_{B1}$ of the selected memory cell 1B is illustrated. Discussed below is the case when the memory cell 1B stores data "1" in the initial state. In this state, the spin device element $11_{A1}$ is placed in the "high resistance" state and the spin device element $11_{B1}$ is placed in the "low resistance" state. Although not illustrated in FIG. 25A, a person skilled in the art would understand that the spin device element $11_{A2}$ is placed in the "high resistance" state and the spin device element $11_{B2}$ is placed in the "low resistance" state.

As illustrated in FIG. 25B, the deformable base plate 33 is bent in data writing into the memory cell 1B. As described above, the deformable base plate 33 can be bent by applying electric fields to the piezoelectric layers 34 and 35 with the electrode layers coupled with the piezoelectric layers 34 and 35 (that is, the electrode layers 36, 37 and the additional electrode layers (not illustrated)). When the deformable base plate 33 is bent, a strain is generated in each of the spin device electrode 11 and the magnetization direction of the recording layer 23 of each spin device element 11 is tilted from the original magnetization direction of the recording layer 23, which is determined by the magnetic anisotropy thereof, due to a magnetostrictive effect.

By tilting the magnetization direction of the recording layer 23 from the original magnetization direction, the recoding layer 23 is placed into a state in which the magnetization of the recoding layer 23 is easily reversible. This means that applying a strain to each spin device element 11 by bending the deformable base plate 33 allows temporarily placing each spin device element 11 into a state in which data stability is low. To apply a sufficiently-large strain to each spin device element 11, it is effective to increase the displacement (bending amount) of the deformable base plate 33. It is also preferable to increase the magnetostriction of the recording layer 23 to enhance the magnetostrictive effect.

It should be noted that the structure in which at least one of the lower and upper surfaces of the deformable base plate 33 faces a "space which is not filled with solid substance" in the present embodiment allows deforming the deformable base plate 33 with a sufficiently-large displacement. The "space which is not filled with solid substance" referred to herein may be filled with fluid, including gas (such as air, nitrogen) and liquid. Alternatively, the space which is not filled with solid substance may be vacuumed.

More specifically, as illustrated in FIGS. 22A and 22B, the lower surface of the deformable base plate 33 (the surface of the deformable base plate 33 opposite to the surface on which the spin device elements 11 are formed) partially faces the space 38 which is not filled with solid substance, and the spin device elements 11 are disposed opposed to the space 38 across the deformable base plate 33. This structure is especially advantageous for increasing the displacement of the deformable base plate 33 and thereby increasing the strain generated in each spin device element 11. It should be noted that the portion of the upper surface of the deformable base plate 33 on which the spin device elements 11 are not formed may be covered with a dielectric film for protection.

As illustrated in FIG. 25C, a write current Iw for writing a desired data is generated which flows through the spin device elements 11 of the selected memory cell 1B in the state in which the deformable base plate 33 bent. Since the magnetostrictive effect is a uniaxial effect rather than a unidirectional effect, it is impossible to direct the magnetization direction of the recording layer 23 of each spin device element 11 (which corresponds to data "0" or "1) into the desired direction only with the magnetostrictive effect; the magnetostrictive effect exerted in the recording layer 23 only achieves an effect of tilting the magnetization of the recording layer 23 by about 90 degree from the direction of the magnetic anisotropy of the recording layer 23 at the maximum. The write current Iw corresponding to the desired data is fed to each spin device element 11 to limit the magnetization direction of the recording layer 23 to only one direction.

Illustrated in FIG. 25C is the operation for writing data "0". The write current Iw is generated in such a direction that the magnetizations of the reference layers 21 and the recording layers 23 are directed in "parallel" in the spin device elements $11_{A1}$ and $11_{A2}$ and those of the reference layers 21 and the recording layers 23 are directed in "antiparallel" in the spin device elements $11_{B1}$ and $11_{B2}$. This allows placing the selected memory cell 1B into the first state in which the spin device elements $11_{A1}$ and $11_{A2}$ are placed in the "low resistance" state and the spin device elements $11_{B1}$ and $11_{B2}$ are placed in the "high resistance" state.

This is followed by stopping bending the deformable base plate 33. This completes the data writing. FIG. 25D illustrates the state of the selected memory cell 1B after the data writing is completed. In FIG. 25D, the magnetizations of the recording layers 23 of the spin device elements $11_{A1}$ and $11_{B1}$ are illustrated as being directed in the opposite directions to those in the original state (initial state) illustrated in FIG. 25A.

Since the data writing is assisted by the magnetostrictive effect caused by the strain applied to each spin device element 11, the above-described operation effectively achieves data writing with a reduced data write power, even if magnetic material exhibiting superior data stability is used as the recording layer 23 of each spin device element 11 in the memory cell 1B. In other words, the magnetic memory and data writing method in the present embodiment advantageously relieves a conflict between the data stability and data write power.

Although the mechanism illustrated in FIGS. 20 to 24 uses a piezoelectric effect to bend the deformable base plate 33, various other mechanisms may be used to bend the deformable base plate 33. For example, the deformable base plate 33 may be bent by using a force exerted between a pair of capacitor electrodes. FIGS. 26A and 26B are cross-sectional views illustrating the configuration of each block 2 in this case.

In the configuration illustrated in FIGS. 26A and 26B, a capacitor electrode 41 is partially embedded in the fixture base 32. The capacitor electrode 41 includes a flat plate section 41a and a contact section 41b. The lower surface of the flat plate 41a faces a space 38A which is not filled with solid substance.

The deformable base plate 33 is coupled on the upper surface of the fixture base 32. The deformable base plate 33 is opposed to the flat plate 41a of the capacitor electrode 41 across a space 38B which is not filled with solid substance. In other words, the lower surface of the deformable base plate 33 faces the space 38B which is not filled with solid substance.

The deformable base plate 33 includes a dielectric layer 42, a capacitor electrode layer 43 and a main body 44. The dielectric layer 42 is coupled with the upper surface of the fixture base 32 and the capacitor electrode layer 43 is coupled with the upper surface of the dielectric layer 42. The main body 44 is coupled with the upper surface of the capacitor electrode layer 43. The capacitor electrode layer 43 is opposed to the flat plate section 41a of the capacitor electrode 41 across the dielectric layer 42 and the space 38B which is not filled with solid substance, and a capacitor is formed with the capacitor electrode 41 and the capacitor electrode layer 43.

The lower electrodes $24_{A1}$, $24_{B1}$, $24_{A2}$ and $24_{B2}$ are formed on the upper surface of the deformable base plate 33 (that is, the upper surface of the main body 44) and the spin device elements $11_{A1}$, $11_{B1}$, $11_{A2}$ and $11_{B2}$ are formed on the upper surfaces of the lower electrodes $24_{A1}$, $24_{B1}$, $24_{A2}$ and $24_{B2}$, respectively. The structure of each spin device element 11 is as described above with reference to FIG. 4B. The upper electrodes $25_{A1}$, $25_{B1}$, $25_{A2}$ and $25_{B2}$ are formed on the upper surfaces of the recording layers 23 of the spin device elements $11_{A1}$, $11_{B1}$, $11_{A2}$ and $11_{B2}$, respectively.

This structure allows bending the deformable base plate 33 by applying a voltage between the capacitor electrode 41 and the capacitor electrode layer 43. In detail, when a voltage is applied between the capacitor electrode 41 and the capacitor electrode layer 43, an electric field is generated between the capacitor electrode 41 and the capacitor electrode layer 43, and this electric field works on charges generated on the surface of the capacitor electrode layer 43 to generate an attracting force which pulls the capacitor electrode layer 41 towards the capacitor electrode 43, that is, an attracting force which pulls the deformable base plate 33 towards the capacitor electrode 41. Since the lower surface of the deformable base plate 33 is only partially coupled with the fixture base 32 and faces the space 38B which is not filled with solid substance, the deformable base plate 33 is bent by the force attracting the deformable base plate 33 towards the capacitor electrode 41.

It should be noted here that, in the structure illustrated in FIGS. 26A and 26B, a part of the lower surface of the deformable base plate 33 faces the space 38B which is not filled with solid substance. The structure in which the surface of the deformable base plate 33 opposed to the surface on which the spin device elements 11 is formed faces the space 38B which is not filled with solid substance effectively enlarges the displacement of the deformable base plate 33.

It should be noted that substantially no current is generated (other than a leakage current and a temporary charging current) to bend the deformable base plate 33 also in the structure illustrated in FIGS. 26A and 26B. The structure illustrated in FIGS. 26A and 26B eliminates the need for feeding a current to bend the deformable base plate 33, since the deformable base plate 33 is bent with a force exerted between capacitor electrodes. This effectively reduces the data write power (that is, the power consumed in a write operation).

Figure 27:
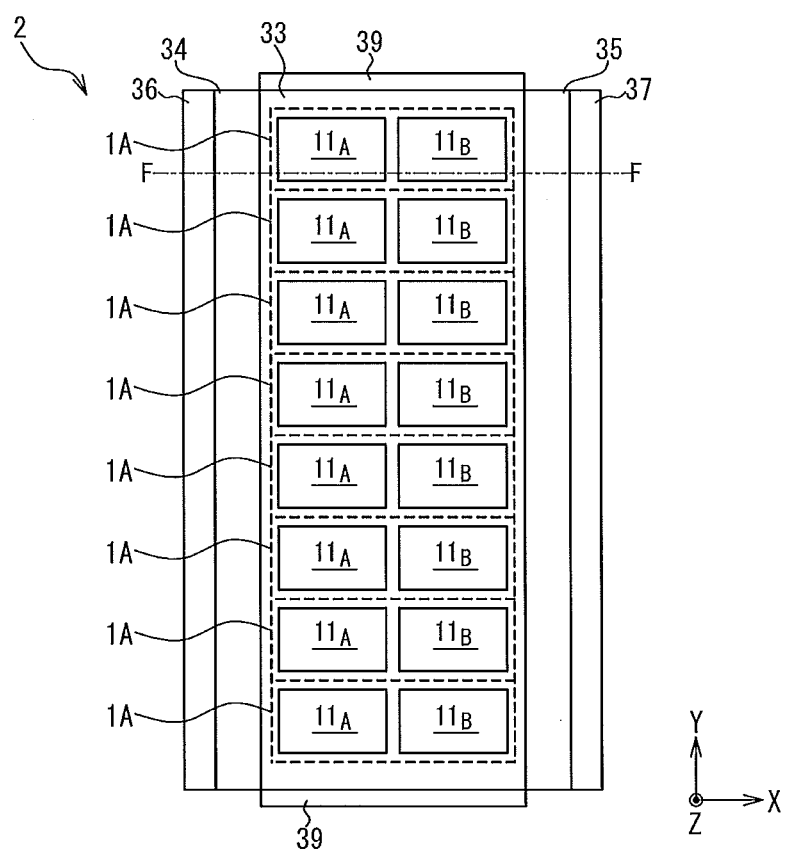
FIG. 27 is a plan view illustrating still another example of the configuration of the memory cell array of the magnetic memory in which spin device elements are integrated on a deformable base plate.

In an alternative embodiment, the memory cells 1B illustrated in FIGS. 11A and 11B, which each includes two spin device elements 11, may be integrated on the deformable base plate 33. FIG. 27 is a plan view illustrating the configuration of each block 2 in a magnetic memory thus structured and FIG. 28 is a cross-sectional view illustrating the structure of each block 2 on section F-F indicated in FIG. 27.

The lower electrodes $24_A$ and $24_B$ are formed on the upper surface of the deformable base plate 33 and the spin device elements $11_A$ and $11_B$ are formed on the upper surfaces of the lower electrodes $24_A$ and $24_B$. The upper electrode 25 is coupled with the upper surfaces of the spin device elements $11_A$ and $11_B$. The upper electrode 25 functions as a connection node which provides an electrical connection between the spin device elements $11_A$ and $11_B$.

Figure 28:
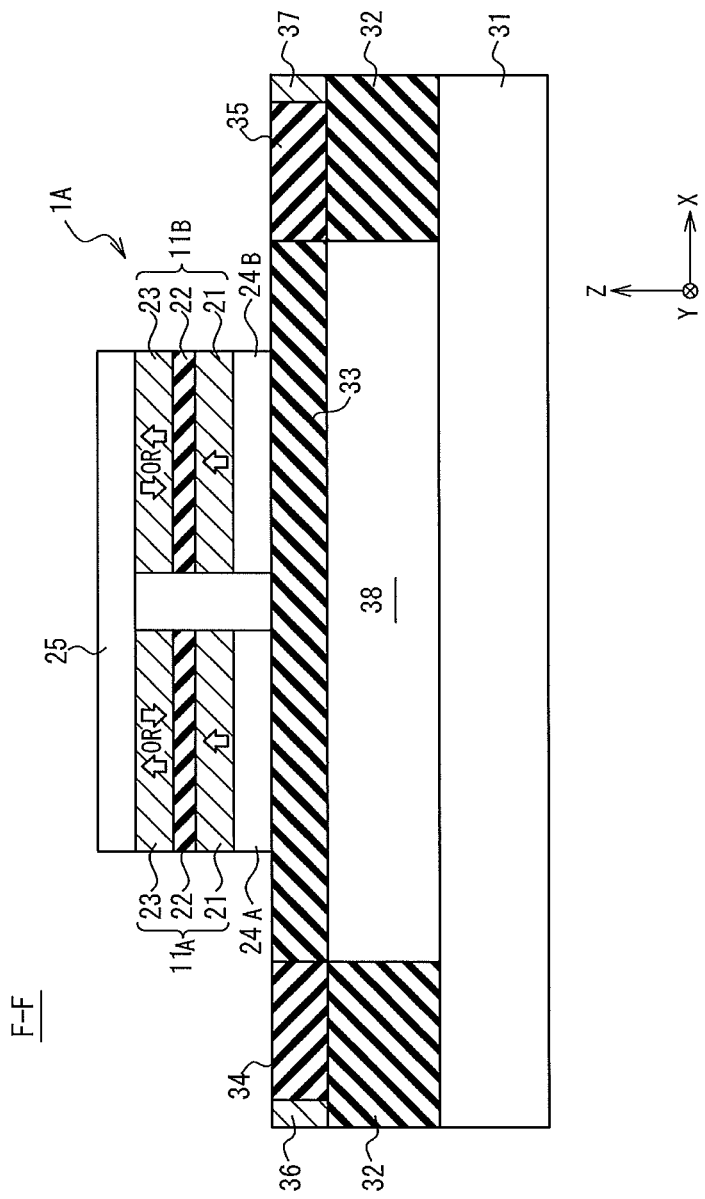
FIG. 28 is a cross-sectional view illustrating the structure of the memory cell array on section F-F indicated in FIG. 27.

Also in the structure illustrated in FIGS. 27 and 28, data writing is achieved by feeding a write current through each of the spin device elements $11_A$ and $11_B$ of a selected memory cell 1A in the state in which the deformable base plate 33 is bent. More specifically, the deformable base plate 33 is bent when a desired data is written into the selected memory cell 1A. As described above, the deformable base plate 33 can be bent by applying electric fields to the piezoelectric layers 34 and 35 with the electrode layers coupled with the piezoelectric layers 34 and 35 (that is, the electrode layers 36, 37 and the additional electrode layers (not illustrated)). When the deformable base plate 33 is bent, a strain is generated in each of the spin device electrode 11 and the magnetization direction of the recording layer 23 of each spin device element 11 is tilted from the original magnetization direction of the recording layer 23, which is determined by the magnetic anisotropy thereof, due to a magnetostrictive effect. By tilting the magnetization direction of the recording layer 23 from the original magnetization direction, the recoding layer 23 is placed into a state in which the magnetization of the recoding layer 23 is easily reversible.

A write current is fed to the selected memory cell 1A in the state in which the deformable base plate 33 is bent. The direction of the write current is determined on the basis of the value of the data to be written into the selected memory cell 1A. This operation effectively allows writing the desired data into the selected memory cell 1A. This is followed by stopping bending the deformable base plate 33 to complete the data writing.

Also in the structure illustrated in FIGS. 27 and 28, the above-described operation effectively achieves data writing with a reduced data write power, since the data writing is assisted by the magnetostrictive effect caused by the strain generated in each spin device element 11. It should be noted that the mechanism which uses a force exerted between a pair of capacitor electrodes as illustrated in FIGS. 26A and 26B may be used as the bending mechanism to bend the deformable base plate 33.

Figure 29:
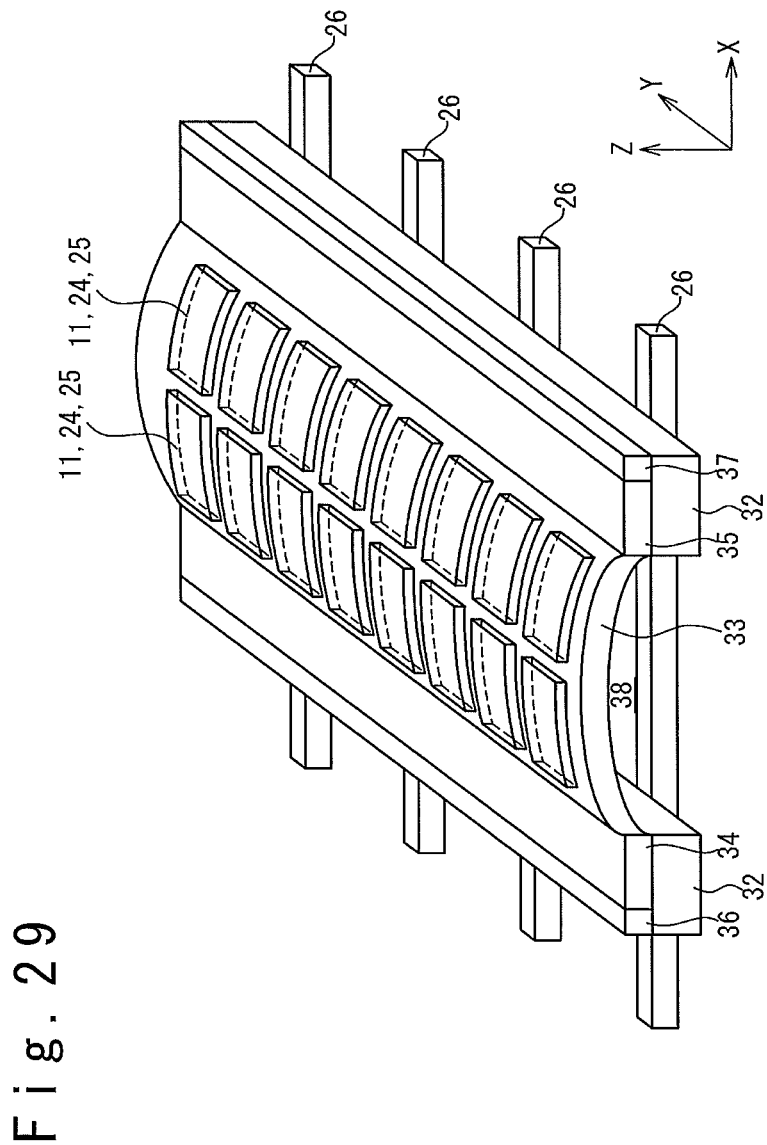
FIG. 29 is a perspective view illustrating an exemplary configuration of each block of the memory cell array in the case when spin device elements are provided on a deformable base plate and data writing into a memory cell is achieved with a current-induced magnetic field.

Also in the structure in which the spin device elements 11 of the memory cells are formed on the deformable base plate 33, data writing into a selected memory may be achieved with a current-induced current. FIG. 29 is a perspective view illustrating the configuration of each block of the memory cell array in the case when data writing into a selected memory 1C is achieved with a current-induced magnetic field, and FIG. 30 is a plan view illustrating the structure of each block.

Figure 30:
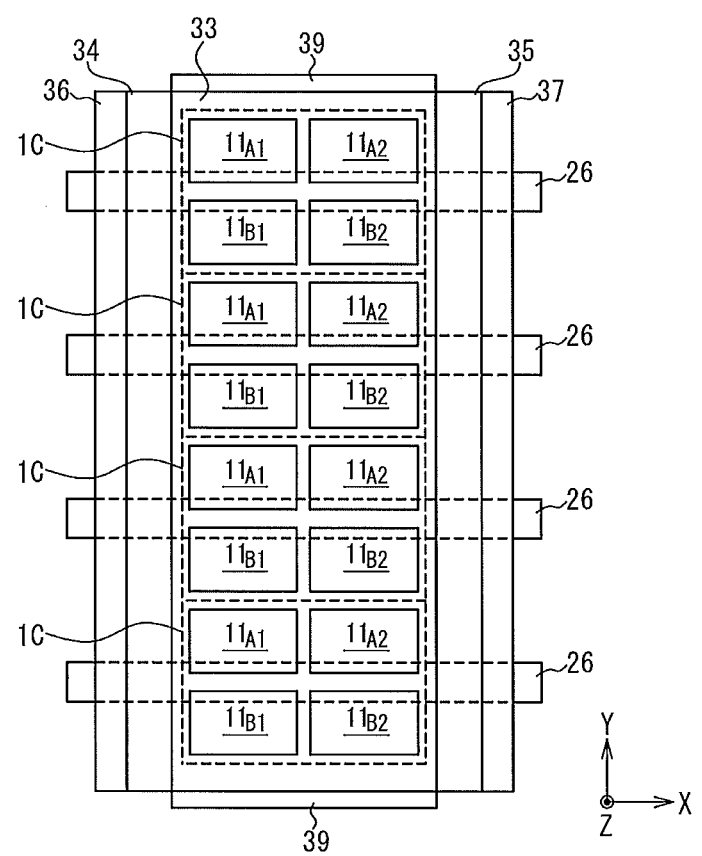
FIG. 30 is a plan view illustrating the structure of the block illustrated in FIG. 29.

In the structure illustrated in FIGS. 29 and 30, a write current line 26 is provided close to each memory cell 10. FIGS. 29 and 30 illustrate a structure in which the write current lines 26 are provided under the deformable base plate 33. The write current lines 26 are formed to extend in the X-axis direction. The spin device elements $11_{A1}$ and $11_{A2}$ of each memory cell 10 are positioned opposed to the spin device elements $11_{B1}$ and $11_{B2}$ across the write current line 26. More specifically, as illustrated in FIG. 30, the spin device elements $11_{A1}$ and $11_{A2}$ of each memory cell 10 are positioned shifted from the write current line 26 corresponding to each memory cell 10 in the +Y direction (a first direction), and the spin device elements $11_{B1}$ and $11_{B2}$ of each memory cell 10 are positioned shifted from the write current line 26 corresponding to each memory cell 10 in the −Y direction (a second direction opposite to the first direction). This arrangement preferably allows generating such a magnetic field that the magnetizations of the recoding layers 23 of the spin device elements $11_{A1}$ and $11_{A2}$ and those of the recoding layers 23 of the spin device elements $11_{B1}$ and $11_{B2}$ are directed in opposite directions with only one write current line 26. Note that the spin device element $11_{A2}$ is positioned shifted from the spin device element $11_{A1}$ in the +X direction, and the spin device element $11_{B1}$ is positioned shifted from the spin device element $11_{B2}$ in the +X direction.

Although electrical connections among the spin device elements $11_{A1}$, $11_{A2}$, $11_{B1}$ and $11_{B2}$ in each memory cell 10 are not illustrated in FIGS. 29 and 30, a person skilled in the art would appreciate that the spin device elements $11_{A1}$, $11_{A2}$, $11_{B1}$ and $11_{B2}$ may be electrically connected in a similar way to the configuration illustrated in FIG. 19.

Also in the configuration illustrated in FIGS. 29 and 30, data writing into a selected memory cell 10 can be achieved by applying a current-induced magnetic field to the recording layer 23 of each spin device element 11 of the selected memory cell 10 in the state in which the deformable base plate 33 is bent. In detail, the deformable base plate 33 is bent in data writing into the selected memory cell 10. As described above, the deformable base plate 33 can be bent by applying electric fields to the piezoelectric layers 34 and 35 with the electrode layers coupled with the piezoelectric layers 34 and 35 (that is, the electrode layers 36, 37 and the additional electrode layers (not illustrated)). When the deformable base plate 33 is bent, a strain is generated in each of the spin device electrode 11 and the magnetization direction of the recording layer 23 of each spin device element 11 is tilted from the original magnetization direction of the recording layer 23, which is determined by the magnetic anisotropy thereof, due to a magnetostrictive effect. By tilting the magnetization direction of the recording layer 23 from the original magnetization direction, the recoding layer 23 is placed into a state in which the magnetization of the recoding layer 23 is easily reversible.

Furthermore, a write current Iw flowing through the write current line 26 corresponding to the selected memory cell 1C is generated in the state in which the deformable base plate 33 is bent. The direction of the write current Iw is determined depending on data to be written into the memory cell 1C. By the write current Iw flowing through the corresponding write current line 26, a current-induced magnetic field is applied to the recording layer 23 of each spin device element 11 of the selected memory cell 1C, and a desired data is thereby written into the selected memory cell 1C. This is followed by stopping bending the deformable base plate 33 to complete the data writing.

Also in the case when data writing is achieved by using a current-induced magnetic field, the above-described operation effectively achieves data writing with a reduced data write power, since the data writing is assisted by the magnetostrictive effect caused by the strain generated in each spin device element 11. It should be noted that the mechanism which uses a force exerted between a pair of capacitor electrodes as illustrated in FIGS. 26A and 26B may be used as the bending mechanism to bend the deformable base plate 33.

Although various specific embodiments of the present invention have been described in the above, the present invention must not be construed as being limited to the above-described embodiments. It would be apparent to a person skilled in the art that the present invention may be implemented with various modifications without departing from the scope of the invention.

What is claimed is:

1. A magnetic memory, comprising:
   a plurality of memory cells; and
   a data identification circuit,
   wherein each of the memory cells includes:
      a first bias node to which a first voltage is applied in a data reading, the first voltage being a positive voltage;
      a second bias node to which a second voltage is applied in the data reading, the second voltage being a negative voltage having substantially a same absolute value as the first voltage;
      a connection node;
      a first spin device element connected between the first bias node and the connection node; and
      a second spin device element connected between the connection node and the second bias node,
      wherein each of the first and second spin device elements is configured to have a first magnetization which is reversible and to take a selected one of first and second states depending on a direction of the first magnetization, wherein the first and second spin device elements are placed in different states selected from the first and second states, and wherein the data identification circuit identifies a data stored in each of the memory cells based on a polarity of a voltage generated on the connection node.

2. The magnetic memory according to claim 1, wherein each of the first and second spin device elements includes:
a recording layer having the first magnetization;
a reference layer having a second magnetization which is fixed; and
a spacer layer provided between the recording layer and the reference layer,
wherein the first and second spin device elements in each of the memory cells are connected with the recording layers thereof connected to each other, or with the reference layers thereof connected to each other.

3. The magnetic memory according to claim 1, further comprising:
a deformable base plate; and
a bending mechanism configured to bend the deformable base plate,
wherein the first and second spin device elements are coupled with the deformable base plate, and
wherein at least one of upper and lower surfaces of the deformable base plate faces a space which is not filled with a solid substance.

4. The magnetic memory according to claim 3, wherein the bending mechanism is configured to bend the deformable base plate with a piezoelectric effect.

5. The magnetic memory according to claim 3, wherein the first and second spin device elements are positioned opposed to the space which is not filled with a solid substance, across the deformable base plate.

6. The magnetic memory according to claim 5, wherein the first and second spin device elements are coupled with an upper surface of the deformable base plate, and
wherein the lower surface of the deformable base plate faces the space which is not filled with a solid substance.

7. The magnetic memory according to claim 3, wherein the bending mechanism includes a piezoelectric layer coupled with a side surface of the deformable base plate.

8. A magnetic memory, comprising:
a memory cell; and
a data identification circuit,
wherein the memory cell includes:
a first bias node to which a first voltage is applied in a data reading from the memory cell;
a second bias node to which a second voltage lower than the first voltage is applied in the data reading;
a first connection node;
a second connection node;
a first spin device element connected between the first bias node and the first connection node;
a second spin device element connected between the first connection node and the second bias node;
a third spin device element connected between the first bias node and the second connection node; and
a fourth spin device element connected between the second connection node and the second bias node,
wherein each of the first to fourth spin device elements is configured to have a first magnetization which is reversible and to take a selected one of first and second states depending on a direction of the first magnetization, wherein the first and fourth spin device elements have a same state selected from the first and second states,
wherein the second and third spin device elements have a same state selected from the first and second states,
wherein the first and fourth spin device elements are placed in a different state from the second and third spin device elements, and
wherein the data identification circuit identifies a data stored in the memory cell based on a voltage generated between the first connection node and the second connection node.

9. The magnetic memory according to claim 8, wherein the data identification circuit identifies a data stored in the memory cell based on which of a third voltage and a fourth voltage is higher, the third voltage being a voltage generated on the first connection node and the fourth voltage being a voltage generated on the second connection node.

10. The magnetic memory according to claim 8, wherein the first spin device element is connected between a third connection node and the first connection node,
wherein the second spin device element is connected between the first connection node and a fifth connection node,
wherein the third spin device element is connected between a fourth connection node and the second connection node,
wherein the fourth spin device element is connected between the second connection node and the fifth connection node,
wherein the third connection node is connected to the first bias node,
wherein the memory cell further includes:
a first switching element configured to connect the fourth connection node to selected one of the first bias node and a third bias node having a predetermined voltage; and
a second switching element connected between the fifth connection node and the second bias node.

11. The magnetic memory according to claim 10, wherein, in the data reading, the first switching element connects the fourth connection node to the first bias node and the second switching element connects the fifth connection node to the second bias node.

12. The magnetic memory according to claim 10, wherein, in a data writing into the memory cell, the first switching element connects the fourth connection node to the third bias node and the second switching element disconnects the fifth connection node from the second bias node, and
wherein, in the data writing, a selected one of a voltage higher than the predetermined voltage on the third bias node and a voltage lower than the predetermined voltage is applied to the first bias node, in response to a data to be written into the memory cell.

13. The magnetic memory according to claim 8, wherein the first spin device element is connected between a third connection node and the first connection node,
wherein the second spin device element is connected between the first connection node and a fifth connection node,
wherein the third spin device element is connected between a fourth connection node and the second connection node,
wherein the fourth spin device element is connected between the second connection node and the fifth connection node, wherein the fourth connection node is connected to the first bias node, wherein the memory cell further includes:

a first switching element configured to connect the third connection node to selected one of the first bias node and a third bias node having a predetermined voltage; and a second switching element connected between the fifth connection node and the second bias node.

14. The magnetic memory according to claim 13, wherein, in the data reading, the first switching element connects the third connection node to the first bias node and the second switching element connects the fifth connection node to the second bias node.

15. The magnetic memory according to claim 13, wherein, in a data writing into the memory cell, the first switching element connects the third connection node to the third bias node and the second switching element disconnects the fifth connection node from the second bias node, and wherein, in the data writing, a selected one of a voltage higher than the predetermined voltage on the third bias node and a voltage lower than the predetermined voltage is applied to the first bias node, in response to a data to be written into the memory cell.

16. The magnetic memory according to claim 10, wherein each of the first to fourth spin device elements includes:

a recording layer having the first magnetization;

a reference layer having a second magnetization which is fixed; and a spacer layer provided between the recording layer and the reference layer, wherein, in a route along which the third and fourth connection nodes are connected via the first to fourth spin device elements, adjacent two spin device elements of the first to fourth spin device elements are connected, with the recording layers thereof connected to each other, or with the reference layers thereof connected to each other.

17. The magnetic memory according to claim 13, wherein each of the first to fourth spin device elements includes:

a recording layer having the first magnetization;

a reference layer having a second magnetization which is fixed; and a spacer layer provided between the recording layer and the reference layer, wherein, in a route along which the third and fourth connection nodes are connected via the first to fourth spin device elements, adjacent two spin device elements of the first to fourth spin device elements are connected, with the recording layers thereof connected to each other, or with the reference layers thereof connected to each other.

18. The magnetic memory according to claim 8, further comprising:

a write current line provided close to the memory cell to extend in a first direction, wherein the first and third spin device elements are positioned shifted from the write current line in a second direction perpendicular to the first direction, wherein the second and fourth spin device elements are positioned shifted from the write current line in a third direction opposite to the second direction, and wherein, in data writing into the memory cell, a write current is generated through the write current line in a direction depending on a data to be written into the memory cell.

19. The magnetic memory according to claim 8, further including:

a deformable base plate; and a bending mechanism configured to bend the deformable base plate, wherein the first to fourth spin device elements are coupled with the deformable base plate, and wherein at least one of upper and lower surfaces of the deformable base plate faces a space which is not filled with a solid substance.

20. The magnetic memory according to claim 19, wherein the bending mechanism is configured to bend the deformable base plate with a piezoelectric effect.

21. The magnetic memory according to claim 19, wherein the first to fourth spin device elements are positioned opposed to the space which is not filled with a solid substance, across the deformable base plate.

22. The magnetic memory according to claim 21, wherein the first to fourth spin device elements are coupled with an upper surface of the deformable base plate, and wherein the lower surface of the deformable base plate faces the space which is not filled with a solid substance.

23. The magnetic memory according to claim 19, wherein the bending mechanism includes a piezoelectric layer coupled with a side surface of the deformable base plate.

24. A magnetic memory, comprising:

a memory cell; and a data identification circuit, wherein the memory cell includes:

a first bias node to which a first voltage is applied in a data reading from the memory cell;

a second bias node to which a second voltage lower than the first voltage is applied in the data reading;

a first connection node;

a second connection node;

a first spin device element connected between the first bias node and the first connection node;

a first resistor element connected between the first connection node and the second bias node;

a second resistor element connected between the first bias node and the second connection node; and a second spin device element connected between the second connection node and the second bias node, wherein each of the first and second spin device elements is configured to have a first magnetization which is reversible and to take a selected one of first and second states depending on a direction of the first magnetization, wherein the first and second spin device elements have a same state selected from the first and second states, wherein the data identification circuit identifies a data stored in each of the memory cells based on a voltage generated between the first connection node and the second connection node.

25. The magnetic memory according to claim 24, wherein the data identification circuit identifies a data stored in the memory cell based on which of a third voltage and a fourth voltage is higher, the third voltage being a voltage generated on the first connection node and the fourth voltage being a voltage generated on the second connection node.

26. A method of operating a magnetic memory including a plurality of memory cells each comprising first and second bias nodes, a connection node, a first spin device element connected between the first bias node and the connection node, and a second spin device element connected between the connection node and the second bias node, wherein each of the first and second spin device elements is configured to have a first magnetization which is reversible and to take selected one of first and second states depending on a direction of the first magnetization, wherein the first and second spin device elements are placed in different states selected from the first and second states, the method comprising:

applying a first voltage to the first bias node, the first voltage being a positive voltage;

applying a second voltage to the second bias node, the second voltage being a negative voltage having substantially a same absolute value as the first voltage; and identifying a data stored in each of the memory cells based on a polarity of a voltage generated on the connection node.

27. A method of operating a magnetic memory which includes a memory cell comprising:

first and second bias nodes;

first and second connection nodes;

a first spin device element connected between the first bias node and the first connection node;

a second spin device element connected between the first connection node and the second bias node;

a third spin device element connected between the first bias node and the second connection node; and a fourth spin device element connected between the second connection node and the second bias node, wherein each of the first to fourth spin device elements is configured to have a first magnetization which is reversible and to take selected one of first and second states depending on a direction of the first magnetization, wherein the first and fourth spin device elements have a same state selected from the first and second states, wherein the second and third spin device elements have a same state selected from the first and second states, and wherein the first and fourth spin device elements are placed in a different state from the second and third spin device elements, the method comprising:

applying a first voltage to the first bias node;

applying a second voltage lower than the first voltage to the second bias node; and identifying a data stored in the memory cell based on a third voltage generated on the first connection node and a fourth voltage generated on the second connection node.

* * * * *